(12) United States Patent
No et al.

(10) Patent No.: US 12,557,388 B2
(45) Date of Patent: Feb. 17, 2026

(54) DISPLAY DEVICE HAVING A DISPLAY AREA INCLUDING A FIRST AREA, A SECOND AREA, AND A THIRD AREA

(71) Applicant: Samsung Display Co., LTD., Yongin-si (KR)

(72) Inventors: Sang Yong No, Yongin-si (KR); Sun Kwun Son, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 462 days.

(21) Appl. No.: 18/152,054

(22) Filed: Jan. 9, 2023

(65) Prior Publication Data

US 2023/0275099 A1    Aug. 31, 2023

(30) Foreign Application Priority Data

Jan. 28, 2022    (KR) .................. 10-2022-0013691

(51) Int. Cl.
  *H10D 86/60*    (2025.01)
  *G09G 3/3233*    (2016.01)
  (Continued)

(52) U.S. Cl.
  CPC ........... *H10D 86/60* (2025.01); *G09G 3/3233* (2013.01); *H01L 24/05* (2013.01); *H01L 25/167* (2013.01);
  (Continued)

(58) Field of Classification Search
  CPC ...... H10D 86/60; H10D 86/441; H10D 86/40; G09G 3/3233; G09G 2300/0426;
  (Continued)

(56) References Cited

U.S. PATENT DOCUMENTS 8,797,491 B2    8/2014    Kim et al.
10,880,999 B2   12/2020   Chung et al.
(Continued)

FOREIGN PATENT DOCUMENTS

KR    10-1627245 B1    6/2016
KR    10-2019-0131156 A    11/2019
(Continued)

OTHER PUBLICATIONS

International Search Report dated Apr. 28, 2023 for corresponding PCT Application No. PCT/KR2023/001121 (3 pages).

*Primary Examiner* — Duy T Nguyen
(74) *Attorney, Agent, or Firm* — Womble Bond Dickinson (US) LLP

(57) ABSTRACT

A display device may include: a substrate including a display area having first to third areas, and a non-display area; first pixels in the first area, second pixels in the second area, and third pixels in the third area; a pad part located in the non-display area, and electrically connected to the first to third pixels; a line part including a first line between the pad part and the first area, a second line between the pad part and the second area, and a third line between the pad part and the second area; a bridge line extending in a first direction, and located in the second and third areas; and an extension line extending in a second direction, and located in the second area and electrically connected with the bridge line. The extension line may be electrically connected with the third line.

20 Claims, 24 Drawing Sheets

(51) Int. Cl.
*H01L 23/00* (2006.01)
*H01L 25/16* (2023.01)
*H10D 86/40* (2025.01)

(52) U.S. Cl.
CPC ... *H10D 86/441* (2025.01); *G09G 2300/0426* (2013.01); *G09G 2300/0842* (2013.01); *H01L 24/06* (2013.01); *H01L 2224/05026* (2013.01); *H01L 2224/05084* (2013.01); *H01L 2224/05147* (2013.01); *H01L 2224/05166* (2013.01); *H01L 2224/05562* (2013.01); *H01L 2224/05572* (2013.01); *H01L 2224/05573* (2013.01); *H01L 2224/06155* (2013.01)

(58) Field of Classification Search
CPC ... G09G 2300/0842; G09G 2300/0819; G09G 2320/029; G09G 2320/043; H01L 24/05; H01L 25/167; H01L 24/06; H01L 2224/05026; H01L 2224/05084; H01L 2224/05147; H01L 2224/05166; H01L 2224/05562; H01L 2224/05572; H01L 2224/05573; H01L 2224/06155; H01L 25/0753; H10H 20/857; H10H 20/83
USPC .......................................................... 257/72
See application file for complete search history.

(56) References Cited

U.S. PATENT DOCUMENTS

| | | |
|---|---|---|
| 11,114,520 B2 | 9/2021 | Kang et al. |
| 11,205,390 B2 | 12/2021 | Kim |
| 11,574,972 B2 | 2/2023 | Kang et al. |
| 2003/0063248 A1* | 4/2003 | Komeno ............... G09G 3/20 349/149 |
| 2009/0213090 A1* | 8/2009 | Mamba ............. G06F 3/0446 345/174 |
| 2012/0143412 A1* | 6/2012 | Bissontz ............. B60W 20/10 903/903 |
| 2014/0028939 A1* | 1/2014 | Nakano ............. G06F 3/0412 349/42 |
| 2014/0176844 A1* | 6/2014 | Yanagisawa .......... G02F 1/1309 349/43 |
| 2015/0366049 A1* | 12/2015 | Lee ................... H05K 1/111 361/767 |
| 2016/0104692 A1* | 4/2016 | Lee ................... G02F 1/13452 257/773 |
| 2017/0249039 A1* | 8/2017 | Kim .................. G06F 3/0443 |
| 2019/0139481 A1* | 5/2019 | Zhang .................. H05K 1/111 |
| 2021/0273035 A1 | 9/2021 | Cho et al. |
| 2022/0013509 A1* | 1/2022 | Lee ................... H10D 86/441 |
| 2022/0037447 A1 | 2/2022 | Cho et al. |

FOREIGN PATENT DOCUMENTS

| | | | |
|---|---|---|---|
| KR | 20190131156 A | * | 11/2019 |
| KR | 10-2020-0010697 A | | 1/2020 |
| KR | 10-2020-0031194 A | | 3/2020 |
| KR | 10-2020-0055231 A | | 5/2020 |
| KR | 10-2021-0013449 A | | 2/2021 |
| KR | 10-2021-0029339 A | | 3/2021 |
| KR | 10-2021-0032615 A | | 3/2021 |
| KR | 10-2021-0105478 A | | 8/2021 |
| KR | 202101015478 A | * | 8/2021 |

* cited by examiner

DISPLAY DEVICE HAVING A DISPLAY AREA INCLUDING A FIRST AREA, A SECOND AREA, AND A THIRD AREA

CROSS-REFERENCE TO RELATED APPLICATION

This application claims priority to and the benefit of Korean patent application number 10-2022-0013691 filed on Jan. 28, 2022, the entire disclosure of which is incorporated by reference herein.

BACKGROUND

1. Field

Various embodiments of the present disclosure relates to a display device.

2. Description of Related Art

Recently, as interest in information display increases, research and development on display devices have been continuously conducted.

SUMMARY

Various embodiments of the present disclosure are directed to a display device in which a non-display area is reduced.

A display device in accordance with one or more embodiments may include: a substrate including a display area including a first area, a second area, and a third area, and a non-display area adjacent at least one side of the display area; first pixels in the first area, second pixels in the second area, and third pixels in the third area; a pad part located in the non-display area, and electrically connected to each of the first to the third pixels; a line part including a first line in the non-display area between the pad part and the first area, a second line in the non-display area between the pad part and the second area, and a third line in the non-display area between the pad part and the second area and spaced from the second line; a bridge line extending in a first direction, and located in common in the second and the third areas; and an extension line extending in a second direction different from (or intersecting) the first direction, and located in the second area and electrically connected with the bridge line. The extension line may be electrically connected with the third line.

In one or more embodiments, the pad part may be located in the non-display area, and include a first pad electrically connected to the first pixels, a second pad electrically connected to the second pixels, and a third pad electrically connected to the third pixels. The first line may electrically connect the corresponding first pixel from among the first pixels to the first pad, the second line may electrically connect the corresponding second pixel from among the second pixels to the second pad, and the third line may electrically connect the corresponding third pixel from among the third pixels to the third pad.

In one or more embodiments, the first pad may include a plurality of first pads electrically connected to the respective first pixels. The second pad may include a plurality of second pads electrically connected to the respective second pixels. The third pad may include a plurality of third pads electrically connected to the respective third pixels. The number of first pads is equal to a sum of the number of the plurality of second pads and the number of the plurality of third pads.

In one or more embodiments, the first area may include a first pixel area in which each of the first pixels is located, and a first dummy area located between the first pixel areas adjacent to each other in the first direction. The second area may include a second pixel area in which each of the second pixels is disposed, and a second dummy area located between the second pixel areas adjacent to each other in the first direction. The third area may include a third pixel area in which each of the third pixels is located, and a third dummy area located between the third pixel areas adjacent to each other in the first direction.

In one or more embodiments, the first pixel area, the second pixel area, and the third pixel area may have a same size. The first dummy area, the second dummy area, and the third dummy area may have a same size.

In one or more embodiments, a first signal line may be located in each of the first pixel area and the first dummy area and electrically connected with the first line. A second signal line may be located in the second pixel area and electrically connected with the second line. The extension line may be located in the second dummy area and electrically connected with the third line. A third signal line may be located in the third pixel area and electrically connected with the extension line by the bridge line. A dummy line may be located in the third dummy area and spaced from the third signal line.

In one or more embodiments, the first signal line, the second signal line, the third signal line, the extension line, and the dummy line may be at a same layer and include a same material.

In one or more embodiments, each of the first to third pixels may include: a pixel circuit layer on the substrate and include at least one transistor; and a display element layer on the pixel circuit layer and includes a light emitting element electrically connected to the transistor. The pixel circuit layer may include at least one insulating layer and at least one conductive layer.

In one or more embodiments, the at least one insulating layer may include: a buffer layer on the substrate; a gate insulating layer on the buffer layer; an interlayer insulating layer on the gate insulating layer; and a passivation layer on the interlayer insulating layer. The at least one conductive layer may include: a first conductive layer between the substrate and the buffer layer; a second conductive layer on the gate insulating layer; and a third conductive layer on the interlayer insulating layer.

In one or more embodiments, the first conductive layer may include the first signal line, the second signal line, the third signal line, the extension line, and the dummy line. The third conductive layer may include the bridge line.

In one or more embodiments, the extension line and the third signal line may be electrically connected to each other by the bridge line.

In one or more embodiments, in the second area, the extension line may be electrically connected with one area of the bridge line through a first contactor that successively passes through the buffer layer, the gate insulating layer, and the interlayer insulating layer. In the third area, the third signal line may be electrically connected with another area of the bridge line through a second contactor that successively passes through the buffer layer, the gate insulating layer, and the interlayer insulating layer.

In one or more embodiments, in a plan view, the first contactor and the second contactor may be collinear in the first direction.

In one or more embodiments, the display device may further include an auxiliary line on a column identical with the extension line in the second area and electrically separated from the extension line.

In one or more embodiments, the auxiliary line and the extension line may be at a same layer and include a same material.

In one or more embodiments, the display device may further include: a first antistatic part in the non-display area between the pad part and the first area; a second antistatic part in the non-display area between the pad part and the second area; and a common line extending in the first direction and located in common in the non-display area. The first antistatic part may be electrically connected with the common line and the first line. The second antistatic part may be electrically connected with the common line and the second line.

In one or more embodiments, the first and the second antistatic parts each may include at least one discharge transistor.

In one or more embodiments, the display element layer of each of the first to third pixels may include: a first alignment electrode and a second alignment electrode on the pixel circuit layer and spaced from each other; the light emitting element between the first alignment electrode and the second alignment electrode; a first pixel electrode electrically connected to a first end of the light emitting element and the first alignment electrode; and a second pixel electrode electrically connected to a second end of the light emitting element and the second alignment electrode.

In one or more embodiments, each of the first to the third pads may include: a first pad electrode on the interlayer insulating layer; a second pad electrode on the first pad electrode and electrically connected the first pad electrode; a third pad electrode on the second pad electrode with a first insulating layer interposed therebetween, and electrically connected to the second pad electrode; and a fourth pad electrode on the third pad electrode with a second insulating layer interposed therebetween, and electrically connected to the third pad electrode.

A display device in accordance with one or more embodiments may include: a substrate including a display area including a first area, a second area, and a third area, and a non-display area adjacent at least one side of the display area; first pixels in the first area, second pixels in the second area, and third pixels in the third area; a pad part in the non-display area, and including a first pad electrically connected to the first pixels, a second pad electrically connected to the second pixels, and a third pad electrically connected to the third pixels; a bridge line extending in a first direction, and located in common in the second and the third areas; an extension line extending in a second direction different from the first direction, and located in the second area and electrically connected with the bridge line; a first line in the non-display area between the pad part and the first area, and electrically connected to the first pixels; a second line in the non-display area between the pad part and the second area, and electrically connected to the second pixels; and a third line in the non-display area between the pad part and the second area, and spaced from the second line. The third line may be electrically connected to the third pixels by the extension line and the bridge line. The first pad may include a plurality of first pads electrically connected to the respective first pixels, the second pad may include a plurality of second pads electrically connected to the respective second pixels, and the third pad may include a plurality of third pads electrically connected to the respective third pixels. The number of first pads may be equal to a sum of the number of second pads and the number of third pads.

BRIEF DESCRIPTION OF THE DRAWINGS

The above and other aspects and features of embodiments of the present disclosure will become more apparent by describing in detail embodiments thereof with reference to the attached drawings, in which.

DETAILED DESCRIPTION

Figure 1:
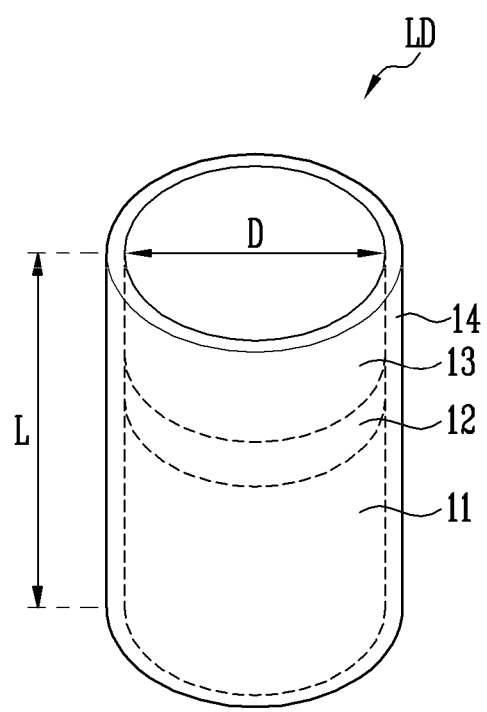
FIG. 1 is a perspective view schematically illustrating a light emitting element in accordance with one or more embodiments.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, in case that it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

It will be understood that when an element (e.g., a first element) is referred to as being (operatively or communicatively) "coupled with/to," or "connected with/to" another element (e.g., a second element), the first element can be coupled or connected with/to the second element directly or via another element (e.g., a third element). In contrast, it will be understood that when an element (e.g., a first element) is referred to as being "directly coupled with/to" or "directly connected with/to" another element (e.g., a second element), no other element (e.g., a third element) intervenes between the element and the other element.

Embodiments and required details of the present disclosure are described with reference to the accompanying drawings in order to describe the present disclosure in detail so that those having ordinary knowledge in the technical field to which the present disclosure pertains can easily practice the present disclosure. Furthermore, a singular form may include a plural form as long as it is not specifically mentioned in a sentence.

Figure 2:
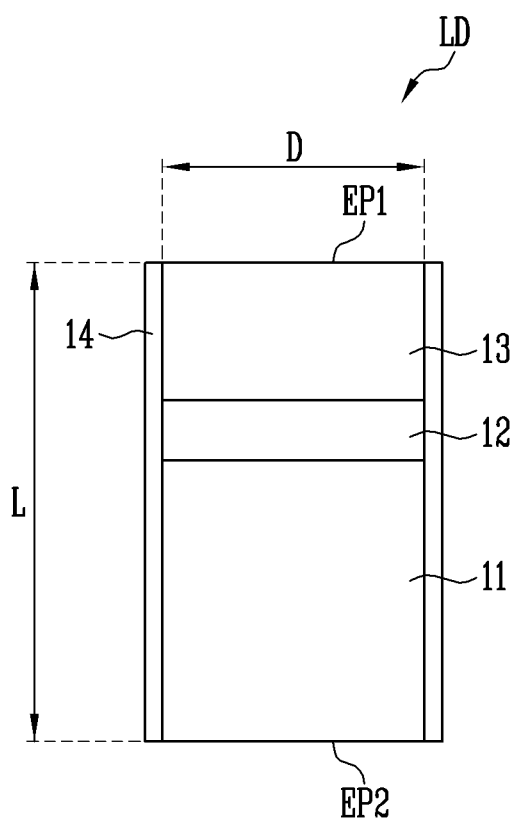
FIG. 2 is a schematic sectional view illustrating the light emitting element of FIG. 1.

FIG. 1 is a perspective view schematically illustrating a light emitting element LD in accordance with one or more embodiments. FIG. 2 is a schematic sectional view illustrating the light emitting element LD of FIG. 1.

Referring to FIGS. 1 and 2, in one or more embodiments, the type and/or shape of the light emitting element LD is not limited to the embodiment illustrated in FIGS. 1 and 2.

Referring to FIGS. 1 and 2, the light emitting element LD may include a first semiconductor layer 11, a second semiconductor layer 13, and an active layer 12 interposed between the first and second semiconductor layers 11 and 13. For example, the light emitting element LD may be implemented as an emission stack (or referred to as "stack pattern") formed by successively stacking the first semiconductor layer 11, the active layer 12, and the second semiconductor layer 13.

The light emitting element LD may be formed in a shape extending in one direction. If the direction in which the light emitting element LD extends is defined as a longitudinal direction, the light emitting element LD may have a first end EP1 and a second end EP2 that are opposite to each other with respect to the longitudinal direction. One semiconductor layer of the first semiconductor layer 11 and the second semiconductor layer 13 may be disposed on the first end EP1 of the light emitting element LD, and the other semiconductor layer of the first semiconductor layer 11 and the second semiconductor layer 13 may be disposed on the second end EP2 of the light emitting element LD. For example, the second semiconductor layer 13 may be disposed on the first end EP1 of the light emitting element LD, and the first semiconductor layer 11 may be disposed on the second end EP2 of the light emitting element LD.

The light emitting element LD may have various shapes. For example, as illustrated in FIG. 1, the light emitting element LD may have a rod-like shape, a bar-like shape, or a pillar-like shape which is long with respect to the longitudinal direction (i.e., to have an aspect ratio greater than 1). Alternatively, the light emitting element LD may have a rod-like shape, a bar-like shape, or a pillar-like shape which is short with respect to the longitudinal direction (or has an aspect ratio less than 1). As a further alternative, the light emitting element LD may have a rod-like shape, a bar-like shape, or a pillar-like shape having an aspect ratio of 1.

The light emitting element LD may include a light emitting diode (LED) fabricated to have a subminiature size, e.g., with a diameter D and/or a length L corresponding to a range from the nano scale (or the nanometer scale) to the micro scale (or the micrometer scale).

In case that the light emitting element LD is long (i.e., to have an aspect ratio greater than 1) with respect to the longitudinal direction, the diameter D of the light emitting element LD may approximately range from 0.5 µm to 6 µm, and the length L thereof may approximately range from 1 µm to 10 µm. However, the diameter D and the length L of the light emitting element LD are not limited thereto. The size of the light emitting element LD may be changed to meet requirements (or design conditions) of a lighting device or a self-emissive display device to which the light emitting element LD is applied.

The first semiconductor layer 11 may include, for example, at least one n-type semiconductor layer. For instance, the first semiconductor layer 11 may include an n-type semiconductor layer that includes any one semiconductor material of InAlGaN, GaN, AlGaN, InGaN, AlN, and InN and is doped with a first conductive dopant (or an n-type dopant) such as Si, Ge, or Sn. However, the constituent material of the first semiconductor layer 11 is not limited to thereto, and various other materials may be used to form the first conductive semiconductor layer 11. The first semiconductor layer 11 may include, with respect to the longitudinal direction of the light emitting element LD, an upper surface that contacts the active layer 12, and a lower surface exposed to the outside. Here, the first semiconductor layer 11 may be disposed on the second end EP2 of the light emitting element LD.

The active layer 12 may be disposed on the first semiconductor layer 11 and have a single or multiple quantum well structure. For example, in case that the active layer 12 has a multiple quantum well structure, the active layer 12 may be formed by periodically repeatedly stacking a barrier layer, a stain reinforcing layer, and a well layer that are provided as one unit. The stain reinforcing layer may have a lattice constant less than that of the barrier layer so that strain, e.g., compressive strain, to be applied to the well layer can be further reinforced. However, the structure of the active layer 12 is not limited to that of the foregoing embodiment.

The active layer 12 may emit light having a wavelength ranging from 400 nm to 900 nm, and have a double hetero structure. In one or more embodiments, a clad layer doped with a conductive dopant may be formed over and/or under the active layer 12 with respect to the longitudinal direction of the light emitting element LD. For example, the clad layer may be formed of an AlGaN layer or an InAlGaN layer. In one or more embodiments, material such as AlGaN or InAlGaN may be used to form the active layer 12, and various other materials may be used to form the active layer 12. The active layer 12 may include a first surface that contacts the first semiconductor layer 11, and a second surface that contacts the second semiconductor layer 13.

If an electric field having a certain voltage or more is applied between the opposite ends of the light emitting element LD, the light emitting element LD may emit light by coupling of electron-hole pairs in the active layer 12. Because light emission of the light emitting element LD can be controlled based on the foregoing principle, the light emitting element LD may be used as a light source (e.g., a light emitting source) of various light emitting devices as well as a pixel of a display device.

The second semiconductor layer 13 may be disposed on the second surface of the active layer 12 and include a semiconductor layer of a type different from that of the first semiconductor layer 11. For example, the second semiconductor layer 13 may include at least one p-type semiconductor layer. For instance, the second semiconductor layer 13 may include a p-type semiconductor layer that includes any one semiconductor material of InAlGaN, GaN, AlGaN, InGaN, AlN, and InN, and is doped with a second conductive dopant (or a p-type dopant) such as Mg, Zn, Ca, Sr, or Ba. However, the material for forming the second semiconductor layer 13 is not limited thereto, and various other materials may be used to form the second semiconductor layer 13. The second semiconductor layer 13 may include, with regard to the longitudinal direction of the light emitting element LD, a lower surface that contacts the second surface of the active layer 12, and an upper surface exposed to the outside. Here, the second semiconductor layer 13 may be disposed on the first end EP1 of the light emitting element LD.

In one or more embodiments, the first semiconductor layer 11 and the second semiconductor layer 13 may have different thicknesses with respect to the longitudinal direction of the light emitting element LD. For example, the first semiconductor layer 11 may have a thickness greater than that of the second semiconductor layer 13 with respect to the longitudinal direction of the light emitting element LD. Hence, the active layer 12 of the light emitting element LD may be disposed at a position closer to the upper surface of the second semiconductor layer 13 than to the lower surface of the first semiconductor layer 11.

Although the first semiconductor layer 11 and the second semiconductor layer 13 each are formed of a single layer, the present disclosure is not limited thereto. In one or more embodiments, depending on the material of the active layer 12, the first semiconductor layer 11 and the second semiconductor layer 13 each may further include one or more layers, for example, a clad layer and/or a tensile strain barrier reducing (TSBR) layer. The TSBR layer may be a strain relief layer of which a lattice structure is disposed between other semiconductor layers so that the strain relief layer can function as a buffer layer to reduce a difference in lattice constant. Although the TSBR layer may be formed of a p-type semiconductor layer such as p-GaInP, p-AlInP, or p-AlGaInP, the present disclosure is not limited thereto.

In one or more embodiments, the light emitting element LD may further include a contact electrode (hereinafter referred to as 'first contact electrode') disposed over the second semiconductor layer 13, as well as including the first semiconductor layer 11, the active layer 12, and the second semiconductor layer 13. Furthermore, in one or more embodiments, the light emitting element LD may further include another contact electrode (hereinafter referred to as 'second contact electrode') disposed on one end of the first semiconductor layer 11.

Each of the first and second contact electrodes may be an ohmic contact electrode, but the present disclosure is not limited thereto. In one or more embodiments, each of the first and second contact electrodes may be a Schottky contact electrode. The first and second contact electrodes may include conductive material. For example, the first and second contact electrodes may include opaque metal such as chrome (Cr), titanium (Ti), aluminum (Al), gold (Au), nickel (Ni), and oxides or alloys thereof, which are used alone or in combination, but the present disclosure is not limited thereto. In one or more embodiments, the first and second contact electrodes may also include transparent conductive oxides such as indium tin oxide (ITO), indium zinc oxide (IZO), zinc oxide ($ZnO_x$), indium gallium zinc oxide (IGZO), and indium tin zinc oxide (ITZO). Here, the zinc oxide ($ZnO_x$) may be zinc oxide (ZnO) and/or zinc peroxide ($ZnO_2$).

Materials included in the first and second contact electrodes may be equal to or different from each other. The first and second contact electrodes may be substantially transparent or translucent. Therefore, light generated from the light emitting element LD may pass through each of the first and second contact electrodes and then may be emitted outside the light emitting element LD. In one or more embodiments, in case that light generated from the light emitting element LD is emitted outside the light emitting element LD through an area other than the opposite ends of the light emitting element LD rather than passing through the first and second contact electrodes, the first and second contact electrodes may include opaque metal.

In one or more embodiments, the light emitting element LD may further include an insulating layer 14 (or referred to as "insulating film"). However, in one or more embodiments, the insulating layer 14 may be omitted, or may be provided to cover only some of the first semiconductor layer 11, the active layer 12, and the second semiconductor layer 13.

The insulating layer 14 may prevent the active layer 12 from short-circuiting due to making contact with conductive material except the first and second semiconductor layers 11 and 13. Furthermore, the insulating layer 14 may reduce or minimize a surface defect of the light emitting element LD, thus enhancing the lifetime and emission efficiency of the light emitting element LD. In case that a plurality of light emitting elements LD are disposed in close contact with each other, the insulating layer 14 may prevent an undesired short-circuit from occurring between the light emitting elements LD. The presence or non-presence of the insulating layer 14 is not limited, so long as the active layer 12 can be prevented from short-circuiting with external conductive material.

The insulating layer 14 may be provided to enclose an overall outer surface (e.g., an outer peripheral or circumferential surface) of the emission stack including the first semiconductor layer 11, the active layer 12, and the second semiconductor layer 13.

Although in the foregoing embodiment the insulating layer 14 has been described as enclosing the entirety of the respective outer surfaces (e.g., outer peripheral or circumferential surfaces) of the first semiconductor layer 11, the active layer 12, and the second semiconductor layer 13, the present disclosure is not limited thereto. In one or more embodiments, in case that the light emitting element LD includes the first contact electrode, the insulating layer 14 may enclose the entirety of the respective outer surfaces (e.g., outer peripheral or circumferential surfaces) of the first semiconductor layer 11, the active layer 12, the second semiconductor layer 13, and the first contact electrode. In one or more embodiments, the insulating layer 14 may not enclose the entirety of the outer surface (e.g., the outer peripheral or circumferential surface) of the first semiconductor layer 11, or may enclose only a portion of the outer surface (e.g., the outer peripheral or circumferential surface) of the first semiconductor layer 11 without enclosing the other portion of the outer surface (e.g., the outer peripheral or circumferential surface) of the first semiconductor layer 11. Furthermore, in one or more embodiments, in case that the first contact electrode is disposed on one end (or an upper end) of the light emitting element LD and the second contact electrode is disposed on a remaining end (or a lower end) of the light emitting element LD, the insulating layer 14 may allow at least one area of each of the first and second contact electrodes to be exposed.

The insulating layer 14 may include transparent insulating material. For example, the insulating layer 14 may include one or more insulating materials selected from the group constituting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanstrontium oxide ($SrTiO_x$), cobalt oxide ($Co_xO_y$), magnesium oxide (MgO), zinc oxide ($ZnO_x$), ruthenium Oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, InxOy:H, niobium oxide ($Nb_xO_y$), magnesium fluoride ($MgF_x$), aluminum fluoride ($AlF_x$), an alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN). However, the present disclosure is not limited thereto, and various materials having insulation may be used as the material of the insulating layer 14.

The insulating layer 14 may be provided in the form of a single layer or in the form of multiple layers including double layers. For example, in case that the insulating layer 14 is formed of a double layer structure including a first insulating layer and a second insulating layer that are successively stacked, the first insulating layer and the second insulating layer may be made of different materials (or substances) and may be formed through different processes. In one or more embodiments, the first insulating layer and the second insulating layer may include the same material and may be formed through a successive process.

In one or more embodiments, the light emitting element LD may be implemented as a light emitting pattern having a core-shell structure. In this case, the first semiconductor layer 11 may be disposed in a core of the light emitting element LD, i.e., a central portion of the light emitting element LD. The active layer 12 may be provided and/or formed to enclose the outer surface (e.g., the outer peripheral or circumferential surface) of the first semiconductor layer 11. The second semiconductor layer 13 may be provided and/or formed to enclose the active layer 12. Furthermore, the light emitting element LD may further include a contact electrode formed to enclose at least one side of the second semiconductor layer 13. In one or more embodiments, the light emitting element LD may further include an insulating layer 14 that is provided on the outer surface (e.g., the outer peripheral or circumferential surface) of the light emitting pattern having a core-shell structure and has transparent insulating material. The light emitting element LD implemented as the light emitting pattern having the core-shell structure may be manufactured in a growth manner.

The light emitting element LD may be employed as a light emitting source (or a light source) for various display devices. The light emitting element LD may be fabricated through a surface treatment process. For example, the light emitting element LD may be surface-treated so that, when a plurality of light emitting elements LD are mixed with a fluidic solution (or solvent) and then supplied to each pixel area (e.g., an emission area of each pixel or an emission area of each sub-pixel), the light emitting elements LD can be evenly distributed rather than unevenly aggregating in the solution.

A light emitting unit (or a light emitting device) including the light emitting element LD described above may be used not only in a display device but also in various types of electronic devices each of which requires a light source. For instance, in case that a plurality of light emitting elements LD are disposed in the pixel area of each pixel of a display panel, the light emitting elements LD may be used as a light source of the pixel. However, the application field of the light emitting element LD is not limited to the above-mentioned examples. For example, the light emitting element LD may also be used in other types of electronic devices such as a lighting device, which requires a light source.

Figure 3:
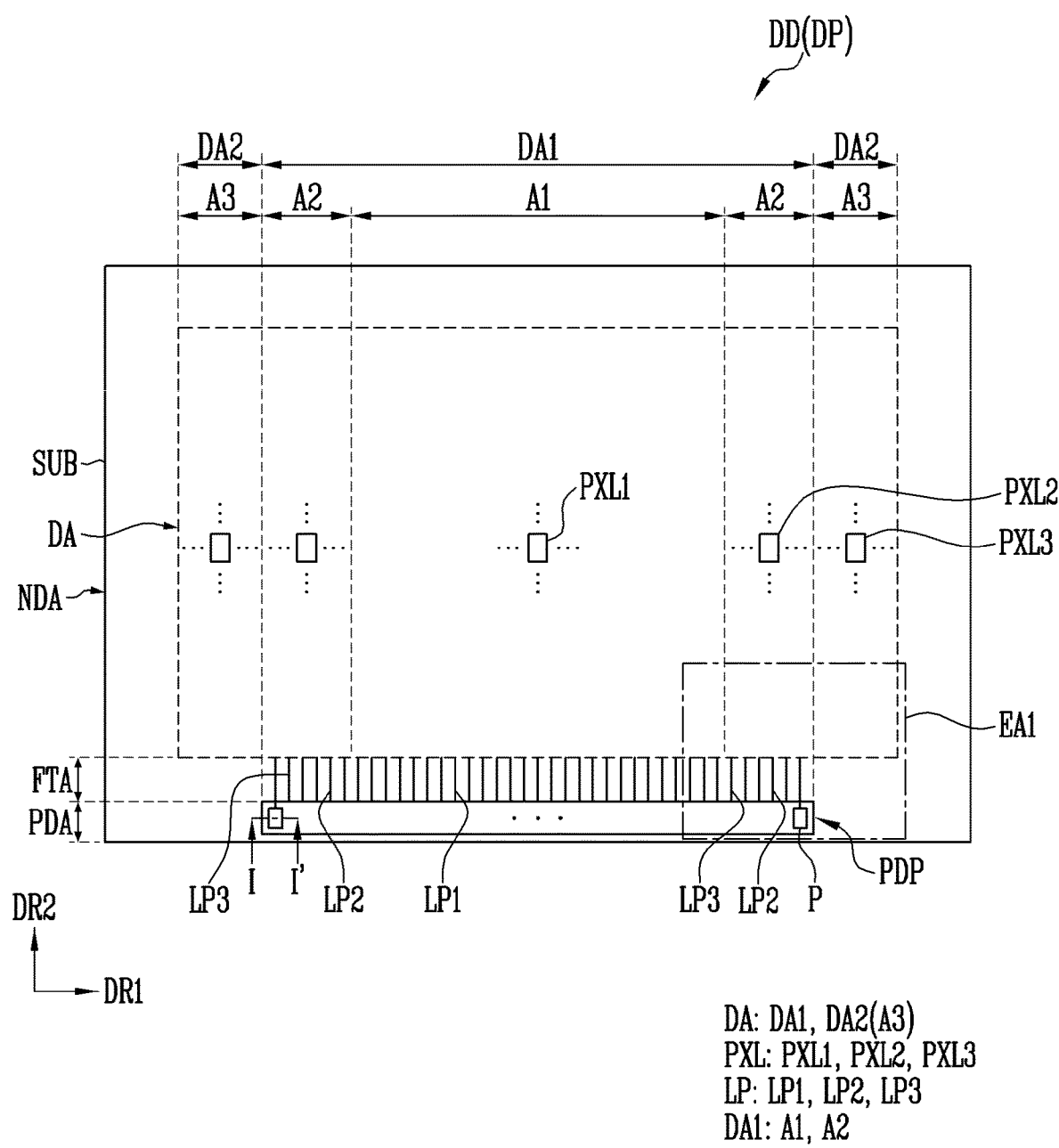
FIGS. 3 and 4 are plan views schematically illustrating a display device in accordance with one or more embodiments.
Figure 4:
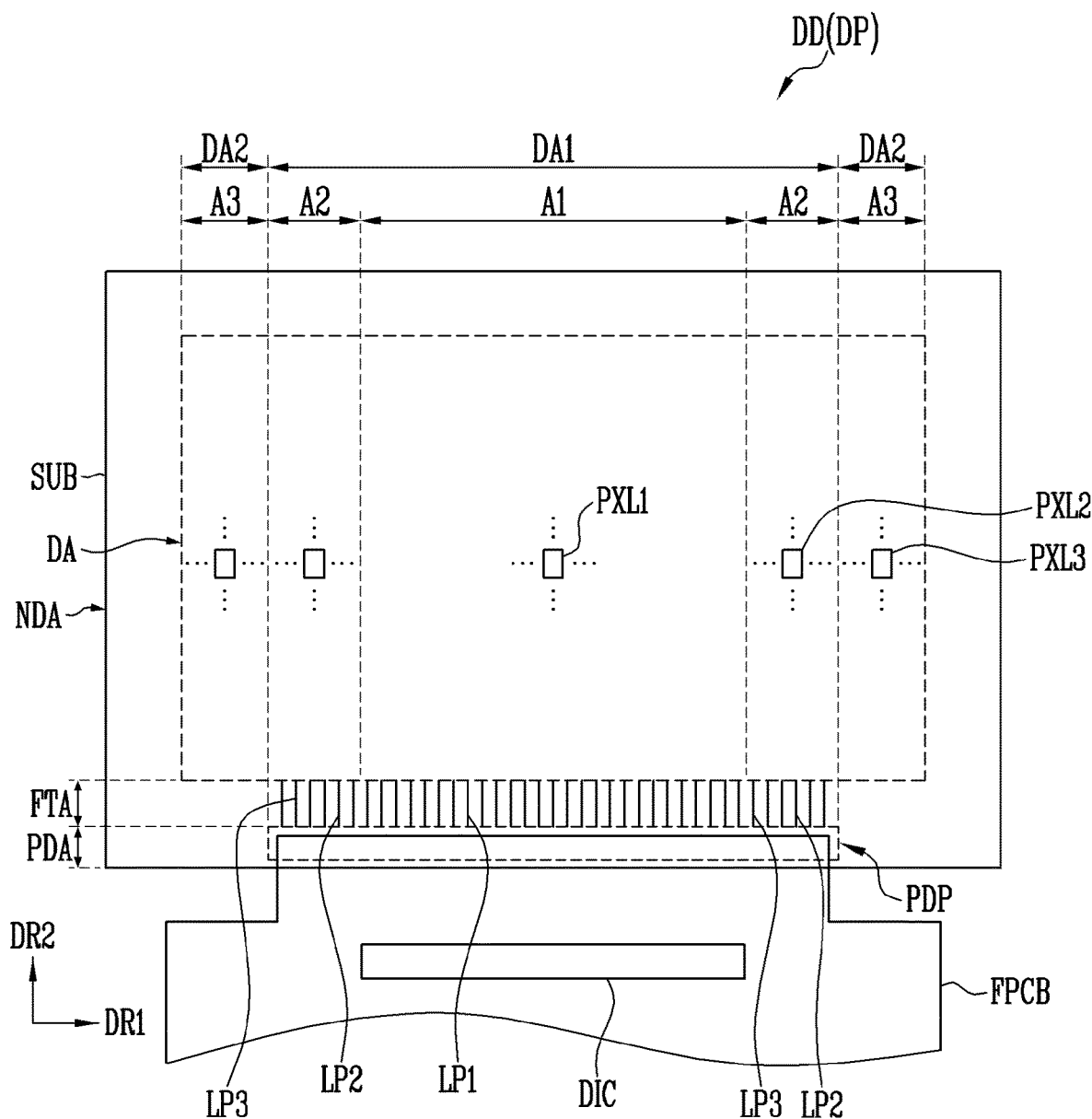

FIGS. 3 and 4 are plan views schematically illustrating a display device DD in accordance with one or more embodiments.

In FIGS. 3 and 4, for the convenience sake, there is schematically illustrated the display device DD, particularly, the structure of a display panel DP provided in the display device DD, centered on a display area DA in which an image is displayed.

In one or more embodiments, the term "connection" between two components may embrace electrical connection and physical connection, but the present disclosure is not limited thereto.

If the display device DD is an electronic device having a display surface on at least one surface thereof, e.g., a smartphone, a television, a tablet PC, a mobile phone, a video phone, an electronic reader, a desktop PC, a laptop PC, a netbook computer, a workstation, a server, a PDA, a portable multimedia player (PMP), an MP3 player, a medical appliance, a camera, or a wearable device, the present disclosure may be applied to the display device DD.

Referring to FIGS. 1 to 4, the display device DD in accordance with one or more embodiments may include a substrate SUB, pixels PXL, and a line part LP.

The display device DD may be classified into a passive matrix type display device and an active matrix type display device according to a method of driving the light emitting element LD. For example, in case that the display device DD is implemented as an active matrix type display device, each of the pixels PXL may include a driving transistor configured to control the amount of current to be supplied to the light emitting element LD, and a switching transistor configured to transmit data signals to the driving transistor.

The display device DD may be provided in various forms, for example, in the form of a rectangular plate having two pairs of parallel sides, but the present disclosure is not limited thereto. In case that the display device DD is provided in the form of a rectangular plate, any one pair of sides of the two pairs of sides may be longer than the other pair of sides. For the convenience sake, FIGS. 3 and 4 illustrate the case where the display device DD has a rectangular form with a pair of long sides and a pair of short sides. An extension direction (or a horizontal direction) of the long sides refers to a first direction DR1. An extension direction of the short sides refers to a second direction DR2. In the display device DD provided in a rectangular planar shape, each corner on which one long side and one short side contact (or meet) each other may have a round shape.

The substrate SUB may include transparent insulating material to allow light transmission. The substrate SUB may be a rigid substrate or a flexible substrate.

One area on the substrate SUB may be provided as the display area DA in which the pixels PXL are disposed, and the other area thereof may be provided as the non-display area NDA. For example, the substrate SUB may include a display area DA including a pixel area in which each of the pixels PXL is disposed, and a non-display area NDA disposed around the perimeter of the display area DA (or adjacent to the display area DA).

The display area DA may include a first display area DA1 and a second display area DA2. For example, the display area DA may be divided into the first display area DA1 and the second display area DA2 depending on whether it corresponds to a pad part PDP. The first display area DA1 may be one area of the display area DA that corresponds to the pad part PDP. The second display area DA2 may be one area of the display area DA that does not correspond to the pad part PDP.

Furthermore, the display area DA may include a first area A1, a second area A2, and a third area A3 (or may be divided into the first area A1, the second area A2, and the third area A3). The first, second, and third areas A1, A2, and A3 may be different areas of the display area DA. For example, the first area A1 and the second area A2 may be different areas of the first display area DA1. The third area A3 may be the second display area DA2. In the following embodiment, the second display area DA2 may be referred to as the third area A3.

The first area A1 may be one area of the first display area DA1 in which pixels PXL each of which directly receives a signal from the pad part PDP are disposed. For example, the first area A1 may be one area of the first display area DA1 that corresponds to pads PD of the pad part PDP.

The third area A3 may be one area of the display area DA that are provided with pixels PXL each of which receives a signal from the pad part PDP through an extension line disposed in an adjacent display area DA, e.g., the first display area DA1, rather than directly receiving the certain signal from the pad part PDP.

The second area A2 may be disposed between the first area A1 and the third area A3, and may be one area of the first display area DA1 in which pixels PXL each of which directly receives a signal from the pad part PDP are disposed. Furthermore, in a plan view, the second area A2 may be one area of the first display area DA1 that corresponds to the pad part PDP. In one or more embodiments, the extension line may be disposed in the second area A2. The pixels PXL disposed in the third area A3 each may receive a signal from the pad part PDP through the extension line disposed in the second area A2.

The pixels PXL may be disposed in the display area DA on the substrate SUB. For example, each of the pixels PXL may be provided in the pixel area that is one area of the display area DA. In one or more embodiments, each of the pixels PXL along with adjacent pixels PXL may be arranged in the display area DA in a stripe arrangement manner or a PENTILE®arrangement structure, or the like, but the present disclosure is not limited thereto and various embodiments known in the art may be applied. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

Each of the pixels PXL may include at least one or more light emitting elements LD configured to be driven in response to a corresponding scan signal and a corresponding data signal. The light emitting element LD may have a small size ranging from the nano scale (or the nanometer scale) to the micro scale (e.g., the micrometer scale) and may be connected in parallel to light emitting elements LD disposed adjacent thereto, but the present disclosure is not limited thereto. The light emitting element LD may form a valid light source of each of the pixels PXL.

In one or more embodiments, the pixels PXL may include a first pixel PXL1, a second pixel PXL2, and a third pixel PXL3.

The first pixel PXL1 may be disposed in the first area A1 of the first display area DA1. The first pixel PXL1 may be directly electrically connected to a corresponding pad P of the pad part PDP and supplied with a signal from the corresponding pad P. Detailed description of the first pixel PXL1 that is disposed in the first area A1 of the first display area DA1 will be made with reference to FIGS. 14, 17, and 18.

The second pixel PXL2 may be disposed in the second area A2 of the first display area DA1. The second pixel PXL2 may be directly electrically connected to a corresponding pad P of the pad part PDP and supplied with a signal from the corresponding pad P.

The third pixel PXL3 may be disposed in the third area A3 (or the second display area DA2). The third pixel PXL3 may receive a signal from the pad part PDP through the extension line that is disposed in the second area A2.

Detailed description of the second pixel PXL2 disposed in the second area A2 of the first display area DA1 and the third pixel PXL3 disposed in the third area A3 (or the second display area DA2) will be made with reference to FIGS. 19 to 24.

The non-display area NDA may be an area in which certain lines (e.g., fan-out lines), pads P, and/or an internal circuit that are electrically connected with the pixels PXL to drive the pixels PXL are provided. For example, the line part LP and the pad part PDP may be disposed in the non-display area NDA.

The non-display area NDA may include a fan-out area FTA and a pad area PDA.

The pad area PDA may be one area of the non-display area NDA in which the pad part PDP is located, and may be disposed most adjacent to a perimeter (or an edge) of the non-display area NDA.

The fan-out area FTA may be one area of the non-display area NDA in which the line part LP is located, and may be disposed adjacent to the display area DA in the non-display area NDA. For example, the fan-out area FTA may be one area of the non-display area NDA that is disposed between the pad area PDA and the display area DA. In one or more embodiments, the non-display area NDA may include an antistatic circuit area in which there is disposed an antistatic circuit that is electrically connected to signal lines disposed in the display area DA and configured to prevent static electricity from occurring. For example, the antistatic circuit area may be the fan-out area FTA.

The line part LP may be disposed in the fan-out area FTA. The pad part PDP may be disposed in the pad area PDA.

The line part LP may be electrically connected to the signal lines connected to the pixels PXL and transmit signals supplied from a driver DIC to the signal lines. The line part LP may include fan-out lines that are disposed in the fan-out area FTA and electrically connect the driver DIC and the pixels PXL.

The line part LP may include a first line LP1, a second line LP2, and a third line LP3.

The first line LP1 may be disposed in one area of the non-display area NDA (or the fan-out area FTA) disposed between the first area A1 and the pad part PDP (or the pad area PDA). The first line LP1 may comprise a plurality of first lines LP1, and include fan-out lines electrically connected to the first pixels PXL1. For example, the first line LP1 may include fan-out lines each of which is formed of a linear part having a minimized length in an extension direction thereof (e.g., the second direction DR2). The first line LP1 may be electrically connected with the signal lines that are connected to the first pixels PXL1 disposed in the first area A1, and transmit signals applied from the driver DIC to the first pixels PXL1 through the signal lines.

The second line LP2 may be disposed in one area of the non-display area NDA (or the fan-out area FTA) disposed between the second area A2 and the pad part PDP (or the pad area PDA). The second line LP2 may comprise a plurality of second lines LP2, and include fan-out lines electrically connected to the second pixels PXL2. For example, the second line LP2 may include fan-out lines each of which is formed of a linear part having a reduced or minimized length in an extension direction thereof (e.g., the second direction DR2). The second line LP2 may be electrically connected with the signal lines that are connected to the second pixels PXL2 disposed in the second area A2, and transmit signals applied from the driver DIC to the second pixels PXL2 through the signal lines.

The third line LP3 may be disposed in one area of the non-display area NDA (or the fan-out area FTA) disposed between the second area A2 and the pad part PDP (or the pad area PDA). The third line LP3 may comprise a plurality of third lines LP3, and include fan-out lines electrically connected to the extension lines. For example, the third line LP3 may include fan-out lines each of which is formed of a linear part having a reduced or minimized length in an extension direction thereof (e.g., the second direction DR2). The third line LP3 may be electrically connected with the extension lines disposed in the second area A2, and transmit signals applied from the driver DIC to the third pixels PXL3 through the extension lines.

The third line LP3 may be disposed at a position spaced apart from the second line LP2 in the fan-out area FTA that corresponds to the second area A2. For example, in the fan-out area FTA that corresponds to the second area A2, the second line LP2 and the third line LP3 may be alternately arranged along the first direction DR1.

In one or more embodiments, the line part LP may not be disposed between the third area A3 (or the second display area DA2) and the non-display area NDA.

The pad part PDP may be disposed in the pad area PDA, and supply (or transmit) driving power voltages and signals for driving the pixels PXL and/or the internal circuit disposed in the display area DA. The pad part PDP may include pads P that are electrically connected to the line part LP.

The pads P may be electrically connected to the line part LP and transmit signals to the pixels PXL. For example, some of the pads P each may be electrically connected to the first line LP1 and transmit a signal to the first pixel PXL1. Some of the pads P each may be electrically connected to the second line LP2 and transmit a signal to the second pixel PXL2. The other pads P each may be electrically connected to the third line LP3 and transmit a signal to the third pixel PXL3.

The display device DD may further include a circuit board FPCB connected to the display panel DP through the pad part PDP, as illustrated in FIG. 4. The circuit board FPCB may be a flexible printed circuit board, but the present disclosure is not limited thereto.

The circuit board FPCB may process various signals input from a printed circuit board and output the processed signals to the display panel DP. To this end, one end of the circuit board FPCB may be attached to the display panel DP, and the other end thereof opposite to the one end may be attached to the printed circuit board. The circuit board FPCB may be connected to each of the display panel DP and the printed circuit board by a conductive adhesive part. The conductive adhesive part may include, e.g., an anisotropic conductive film.

The driver DIC may be mounted on the circuit board FPCB. For example, the driver DIC may be an integrated circuit (IC). The driver DIC may receive driving signals output from the printed circuit board, and output signals, driving power voltages, etc. to be supplied to the pixels PXL based on the received driving signals. The signals and the driving power voltages may be supplied to corresponding pads P of the pad part PDP through some of input/output pads.

Figure 5:
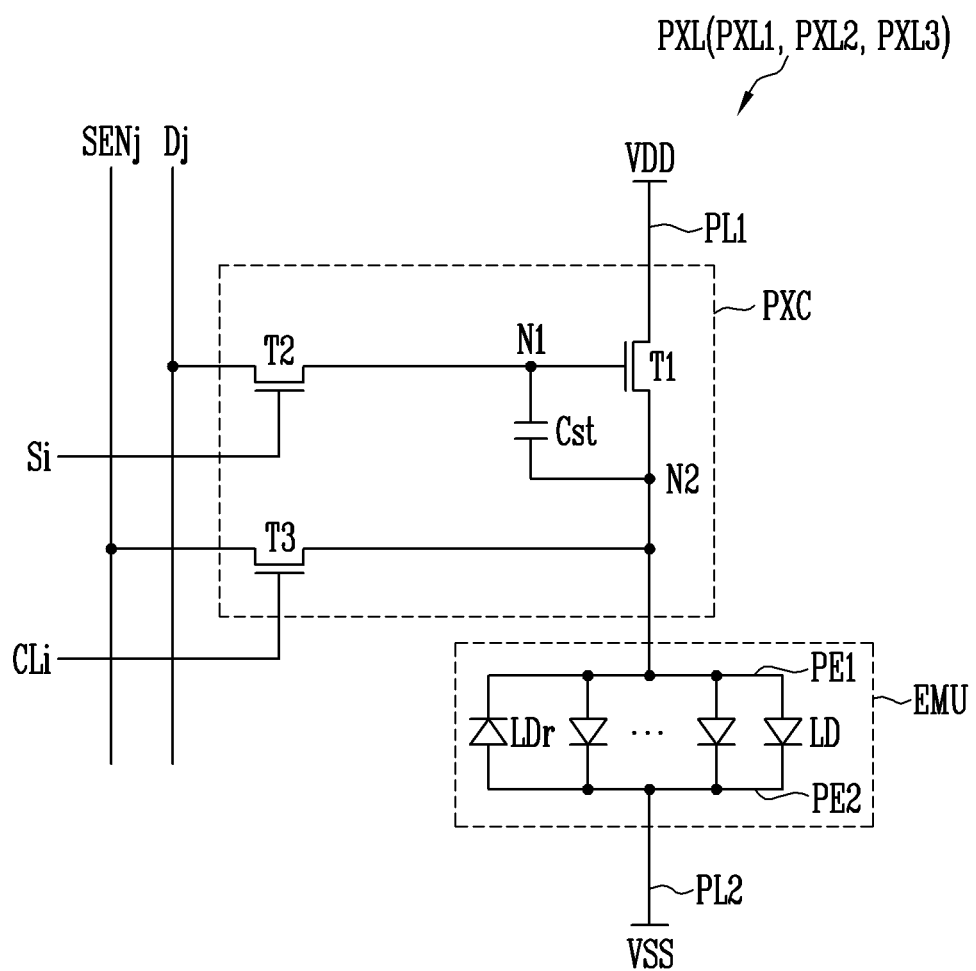
FIGS. 5 and 6 are circuit diagrams illustrating various embodiments of an electrical connection relationship of components included in each of first, second, and third pixels illustrated in FIG. 3.
Figure 6:
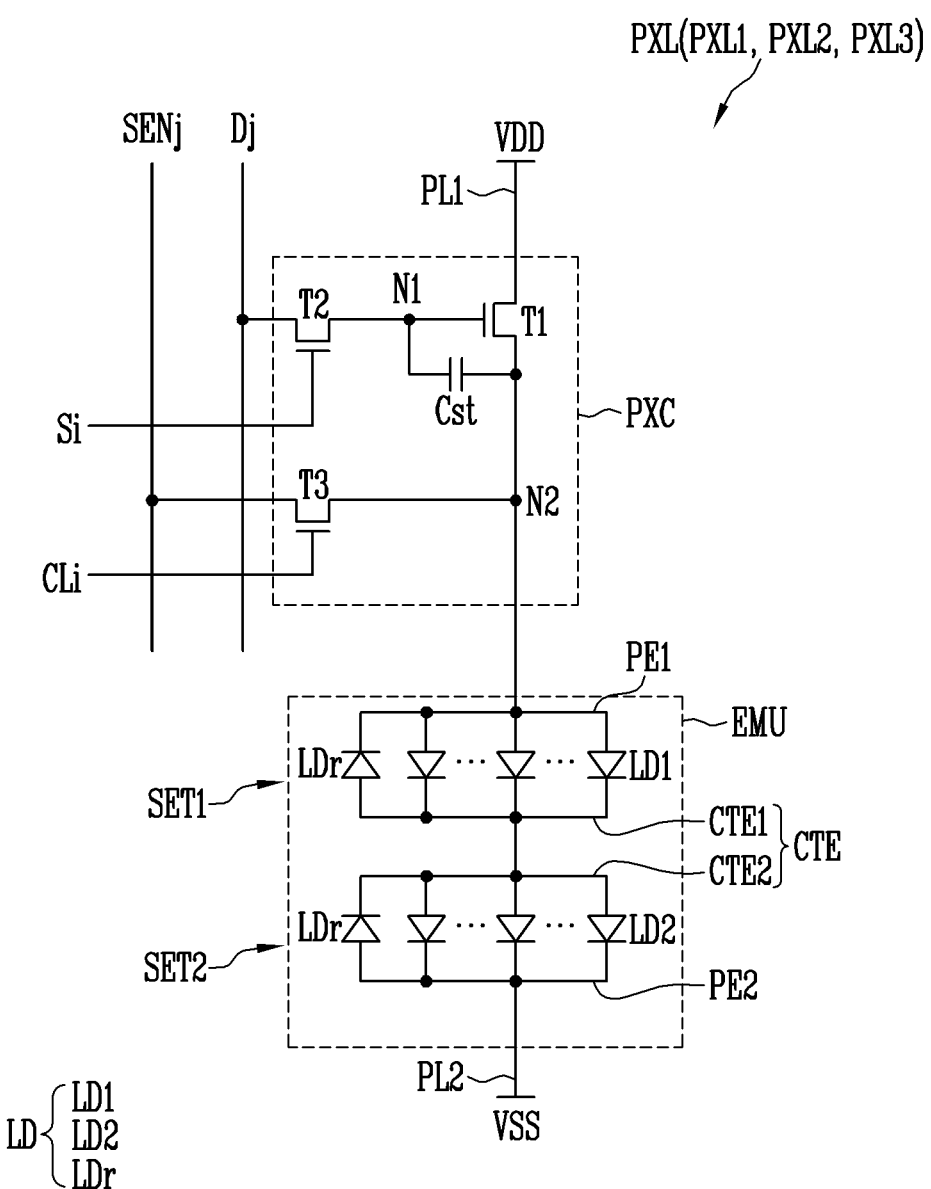

FIGS. 5 and 6 are circuit diagrams illustrating various embodiments of an electrical connection relationship of components included in each of first, second, and third pixels PXL1, PXL2, and PXL3 illustrated in FIG. 3.

For example, FIGS. 5 and 6 illustrate various embodiments of the electrical connection relationship of components included in the pixel PXL (or each of the first to third pixels PXL1, PXL2, and PXL3) that may be employed in an active matrix type display device. However, the types of the components included in the pixel PXL that can be applied to an embodiment may be applied are not limited thereto.

Referring to FIGS. 1 to 6, in one or more embodiments, an emission part (an emission unit) EMU may include a plurality of light emitting elements LD connected in parallel between a first power line PL1 that is connected to a first driving power supply VDD and to which a voltage of the first driving power supply VDD is applied, and a second power line PL2 which is connected to a second driving power supply VSS and to which a voltage of the second driving power supply VSS is applied. For example, the emission part EMU may include a first pixel electrode PE1 (or a first electrode) connected to the first driving power supply VDD via the pixel circuit PXC and the first power line PL1, a second pixel electrode PE2 (or a second electrode) connected to the second driving power supply VSS by the second power line PL2, and a plurality of light emitting elements LD connected in parallel to each other in the same direction between the first and second pixel electrodes PE1 and PE2. In an embodiment, the first pixel electrode PE1 may be an anode, and the second pixel electrode PE2 may be a cathode.

Each of the light emitting elements LD included in the emission part EMU may include one end connected to the first driving power supply VDD by the first pixel electrode PE1, and a remaining end connected to the second driving power supply VSS by the second pixel electrode PE2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during an emission period of the pixel PXL.

As described above, the light emitting elements LD that are connected in parallel to each other in the same direction (e.g., in a forward direction) between the first pixel electrode PE1 and the second pixel electrode PE2 to which the voltages of the different power supplies are supplied may form respective valid light sources.

The light emitting elements LD of the emission part EMU may emit light having a luminance corresponding to driving current supplied thereto through the pixel circuit PXC. For example, during each frame period, driving current that corresponds to a gray scale value of a corresponding frame data of the pixel circuit PXC may be supplied to the emission part EMU. The driving current supplied to the emission part EMU may be divided into parts that flow into the respective light emitting elements LD. Hence, each of the light emitting elements LD may emit light having a luminance corresponding to current applied thereto, so that the light emitter EMU may emit light having a luminance corresponding to the driving current.

Although there has been described the embodiment in which the opposite ends of the light emitting elements LD are connected in the same direction between the first and second driving power supplies VDD and VSS, the present disclosure is not limited thereto. In one or more embodiments, the emission part EMU may further include at least one invalid light source, e.g., a reverse light emitting element LDr, as well as including the light emitting elements LD that form the respective valid light sources. The reverse light emitting element LDr, along with the light emitting elements LD that form the valid light sources, may be connected in parallel to each other between the first and second pixel electrodes PE1 and PE1. Here, the reverse light emitting element LDr may be connected between the first and second pixel electrodes PE1 and PE2 in a direction opposite to that of the light emitting elements LD. Even if a certain driving voltage (e.g., a forward driving voltage) is applied between the first and second pixel electrodes PE1 and PE2, the reverse light emitting element LDr remains disabled. Hence, current substantially does not flow through the reverse light emitting element LDr.

The pixel circuit PXC may be connected to a scan line Si and a data line Dj of the pixel PXL. The pixel circuit PXC may be connected to a control line CLi and a sensing line SENj of the pixel PXL. For example, in case that the pixel PXL is disposed on an i-th row and a j-th column of the display area DA, the pixel circuit PXC of the pixel PXL may be connected to an i-th scan line Si, a j-th data line Dj, an i-th control line CLi, and a j-th sensing line SENj of the display area DA.

The pixel circuit PXC may include first to third transistors T1 to T3, and a storage capacitor Cst.

The first transistor T1 may be a driving transistor configured to control driving current to be applied to the emission part EMU and may be connected between the first driving power supply VDD and the emission part EMU. In detail, a first terminal of the first transistor T1 may be connected (or coupled) to the first driving power supply VDD through the first power line PL1. A second terminal of the first transistor T1 may be connected to a second node N2. A gate electrode of the first transistor T1 may be connected to a first node N1. The first transistor T1 may control, in response to a voltage applied to the first node N1, the amount of driving current to be applied from the first driving power supply VDD to the emission part EMU through the second node N2. In one or more embodiments, the first terminal of the first transistor T1 may be a drain electrode, and the second terminal of the first transistor T1 may be a source electrode, and the present disclosure is not limited thereto. Depending on the type (or the kind) of first transistor T1, the first terminal may be a source electrode, and the second terminal may be a drain electrode.

The second transistor T2 may be a switching transistor that selects a pixel PXL in response to a scan signal and activates the pixel PXL, and may be connected between the data line Dj and the first node N1. A first terminal of the second transistor T2 may be connected to the data line Dj. A second terminal of the second transistor T2 may be connected to the first node N1. A gate electrode of the second transistor T2 may be connected to the scan line Si. The first terminal and the second terminal of the second transistor T2 are different terminals, and, for example, if the first terminal is a drain electrode, and the second terminal may be a source electrode.

When a scan signal having a gate-on voltage (e.g., a high level voltage) is supplied from the scan line Si, the second transistor T2 may be turned on to electrically connect the data line Dj with the first node N1. The first node N1 may be a point at which the second terminal of the second transistor T2 and the gate electrode of the first transistor T1 are connected to each other. The second transistor T2 may transmit a data signal to the gate electrode of the first transistor T1.

The third transistor T3 may obtain a sensing signal through the sensing line SENj by connecting the first transistor T1 to the sensing line SENj, and detect, using the sensing signal, characteristics of the pixel PXL such as a threshold voltage of the first transistor T1. Information about the characteristics of the pixel PXL may be used to convert image data such that a deviation in characteristic between pixels PXL can be compensated for. A second terminal of the third transistor T3 may be connected to the second terminal of the first transistor T1. A first terminal of the third transistor T3 may be connected to the sensing line SENj. A gate electrode of the third transistor T3 may be connected to the control line CLi. Furthermore, the first terminal of the third transistor T3 may be connected to an initialization power supply. The third transistor T3 may be an initialization transistor configured to initialize the second node N2, and may be turned on when a sensing control signal is supplied thereto from the control line CLi, so that the voltage of the initialization power supply can be transmitted to the second node N2. Hence, a second storage electrode of the storage capacitor Cst connected to the second node N2 may be initialized.

A first storage electrode of the storage capacitor Cst may be connected to the first node N1. A second storage electrode of the storage capacitor Cst may be connected to the second node N2. The storage capacitor Cst may be charged with a data voltage corresponding to a data signal to be supplied to the first node N1 during one frame period. Hence, the storage capacitor Cst may store a voltage corresponding to a difference between a voltage of the gate electrode of the first transistor T1 and a voltage of the second node N2.

Although FIG. 5 illustrates an embodiment in which all of the light emitting elements LD that form the emission part EMU are connected in parallel to each other, the present disclosure is not limited thereto. In one or more embodiments, the emission part EMU may include at least one serial set (or stage) including a plurality of light emitting elements LD connected in parallel to each other. In one or more embodiments, as illustrated in FIG. 6, the emission part EMU may have a serial/parallel combination structure.

Referring to FIG. 6, the emission part EMU may include first and second serial sets SET1 and SET2 that are successively connected between the first and second driving power supplies VDD and VSS. Each of the first and second serial sets SET1 and SET2 may include two electrodes PE1 and CTE1, CTE2 and PE2 that form an electrode pair of the corresponding serial set, and a plurality of light emitting elements LD connected in parallel to each other in the same direction between the two electrodes PE1 and CTE1, CTE2 and PE2.

The first serial set (or the first stage) SET1 may include a first pixel electrode PE1, a first intermediate electrode CTE1, and at least one first light emitting element LD1 connected between the first pixel electrode PE1 and the first intermediate electrode CTE1. Furthermore, the first serial set SET1 may include a reverse light emitting element LDr connected between the first pixel electrode PE1 and the first intermediate electrode CTE1 in a direction opposite to that of the first light emitting element LD1.

The second serial set (or the second stage) SET2 may include a second intermediate electrode CTE2, a second pixel electrode PE2, and at least one second light emitting element LD2 connected between the second intermediate electrode CTE2 and the second pixel electrode PE2. Furthermore, the second serial set SET2 may include a reverse light emitting element LDr connected between the second intermediate electrode CTE2 and the second pixel electrode PE2 in a direction opposite to that of the second light emitting element LD2.

The first intermediate electrode CTE1 and the second intermediate electrode CTE2 may be electrically and/or physically connected with each other. The first intermediate electrode CTE1 and the second intermediate electrode CTE2 may form an intermediate electrode CTE that electrically connect the first serial set SET1 and the second serial set SET2 that are successively provided.

In the foregoing embodiment, the first pixel electrode PE1 of the first serial set SET1 may be an anode of each pixel PXL, and the second pixel electrode PE2 of the second serial set SET2 may be a cathode of the corresponding pixel PXL.

As described above, the emission part EMU of the pixel PXL including the serial sets SET1 and SET2 (or the light emitting elements LD) connected to each other in the serial/parallel combination structure may easily adjust driving current/voltage conditions in response to specifications of a product to which the emission part EMU is to be applied.

Particularly, the emission part EMU of the pixel PXL including the serial sets SET1 and SET2 (or the light emitting elements LD) connected to each other in the serial/parallel combination structure may reduce driving current, compared to that of a emission part having a structure such that the light emitting elements LD are connected only in parallel to each other. Furthermore, the emission part EMU of the pixel PXL including the serial sets SET1 and SET2 connected to each other in the serial/parallel combination structure may reduce driving current to be applied to the opposite ends of the emission part EMU, compared to that of an emission part having a structure such that all of the light emitting elements LD, the number of which is the same as that of the emission part EMU, are connected in series to each other. In addition, the emission part EMU of the pixel PXL including the serial sets SET1 and SET2 (or the light emitting elements LD) connected to each other in the serial/parallel combination structure may increase the number of light emitting elements LD included between the electrodes PE1, CTE1, CTE2, and PE2, compared to that of an emission part having a structure such that all of the serial sets (or stages) are connected in series to each other. In this case, the light output efficiency of the light emitting elements LD may be enhanced. Even if a defect is caused in a specific serial set (or stage), the ratio of light emitting elements LD that cannot emit light due to the defect may be reduced, so that a reduction in the light output efficiency of the light emitting elements LD can be mitigated.

Although FIGS. 5 and 6 illustrate an embodiment where all of the first, second, third transistors T1, T2, and T3 included in the pixel circuit PXC are formed of N-type transistors, the present disclosure is not limited thereto. For example, at least one of the first, second, and third transistors T1, T2, and T3 may be changed to a P-type transistor. Furthermore, although FIGS. 5 and 6 illustrate an embodiment where the emission part EMU is connected between the pixel circuit PXC and the second driving power supply VSS, the emission part EMU may be connected between the first driving power supply VDD and the pixel circuit PXC.

The structure of the pixel circuit PXC may be changed in various ways. For example, the pixel circuit PXC may further include at least one transistor element such as a transistor element configured to initialize the first node N1, and/or a transistor element configured to control an emission time of the light emitting elements LD, or other circuit elements such as a boosting capacitor for boosting the voltage of the first node N1.

The structure of the pixel PXL that can be applied to an embodiment may be applied is not limited to the embodiments illustrated in FIGS. 5 and 6, and the pixel PXL may have various structures. For example, the pixel PXL may be configured inside a passive light emitting display device, or the like. In this case, the pixel circuit PXC may be omitted, and the opposite ends of the light emitting elements LD included in the emission part EMU may be directly connected to the scan line Si, the data line Dj, the first power line PL1 to which a voltage of the first driving power supply VDD is to be applied, the second power line PL2 to which a voltage of the second driving power supply VSS is to be applied, a control line, and/or the like.

In the following embodiment, for the convenience of description, a horizontal direction in a plan view will be represented as a first direction DR1, a vertical direction in a vertical direction in a plan view will be represented as a second direction DR2, and a vertical direction in a sectional view will be represented as a third direction (refer to "DR3" of FIG. 8).

Figure 7:
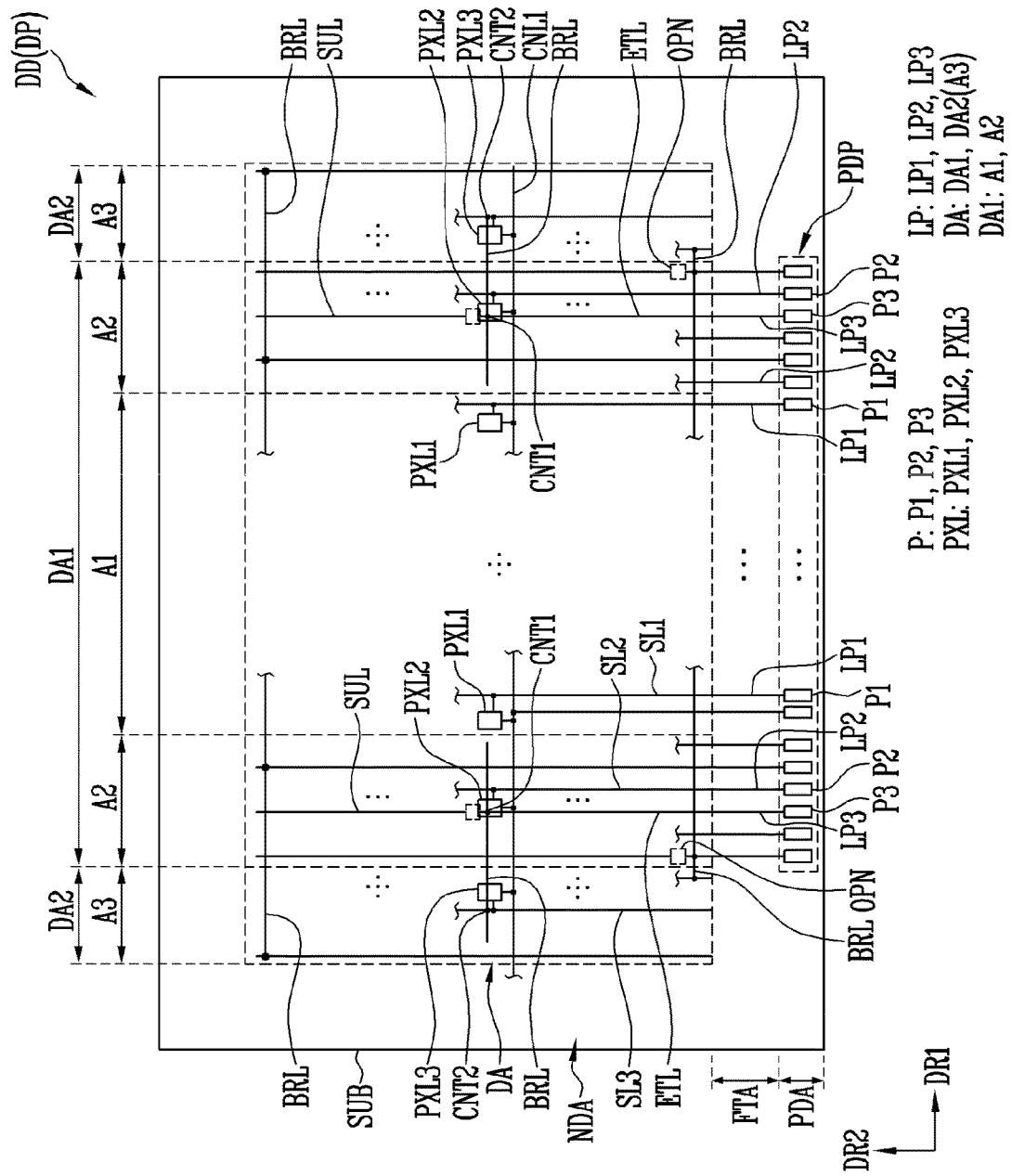
FIG. 7 is a plan view schematically illustrating a display device in accordance with one or more embodiments.

FIG. 7 is a plan view schematically illustrating the display device DD in accordance with one or more embodiments.

With regard to the display device DD of FIG. 7, the following description will be focused on differences from that of the foregoing embodiment, to avoid redundant explanation.

Referring to FIGS. 1 to 7, the display device DD in accordance with one or more embodiments of the present disclosure may include a substrate SUB, pixels PXL, a line part (or a line) LP, and a pad part PDP.

The pad part PDP may be disposed in the pad area PDA of the non-display area NDA, and include a plurality of pads P that are electrically connected to the line part LP. In one or more embodiments, the pads P may include a first pad P1, a second pad P2, and a third pad P3.

The first pad P1 may be electrically connected with the first line LP1, and comprise a plurality of first pads P1. The first pad P1 may include pads P that are disposed in the pad part PDP corresponding to the first area A1.

The second pad P2 may be electrically connected with the second line LP2, and comprise a plurality of second pads P2. The second pad P2 may include pads P that are spaced from the third pad P3 among the pads P that are disposed in the pad part PDP corresponding to the second area A2 of the first display area DA1.

The third pad P3 may be electrically connected with the third line LP3, and comprise a plurality of third pads P3. The third pad P3 may include pads P that are spaced from the second pad P2 among the pads P that are disposed in the pad part PDP corresponding to the second area A2 of the first display area DA1.

In one or more embodiments, the second pad P2 and the third pad P3 may be disposed in the pad part PDP corresponding to the second area A2 of the first display area DA1, and spaced from each other, and electrically connected to different lines (or fan-out lines).

The line part LP may be disposed in the fan-out area FTA of the non-display area NDA, and electrically connect the pad part PDP with the pixels PXL. The line part LP may include a first line LP1, a second line LP2, and a third line LP3.

The first line LP1 may electrically connect the first pad P1 of the pad part PDP to the first pixel PXL1 disposed in the first area A1. The first line LP1 may be electrically connected with a first signal line SL1 that is electrically connected to the first pixel PXL1. In one or more embodiments, the first line LP1 may electrically connect the first signal line SL1 to the first pad P1. The first line LP1 may be disposed in one area of the non-display area NDA (or the fan-out area FTA) disposed between the first area A1 and the pad part PDP.

The second line LP2 may electrically connect the second pad P2 of the pad part PDP to the second pixel PXL2 disposed in the second area A2. The second line LP2 may be electrically connected with a second signal line SL2 that is electrically connected to the second pixel PXL2. In one or more embodiments, the second line LP2 may electrically connect the second signal line SL2 to the second pad P2. The second line LP2 may be disposed in one area of the non-display area NDA (or the fan-out area FTA) disposed between the second area A2 and the pad part PDP. The second line LP2 may be disposed in one area of the non-display area NDA at a position spaced from the third line LP3.

The third line LP3 may electrically connect the third pad P3 of the pad part PDP with an extension line ETL disposed in the second area A2. The third line LP3 may be disposed in one area of the non-display area NDA (or the fan-out area FTA) disposed between the second area A2 and the pad part PDP. The third line LP3 may be disposed in one area of the non-display area NDA at a position spaced from the second line LP2.

In one or more embodiments, the second line LP2 and the third line LP3 may be disposed in the non-display area NDA between the second area A2 and the pad part PDP (or the pad area PDA), and alternately arranged along the first direction DR1.

Each of the first line LP1, the second line LP2, and the third line LP3 may extend in the second direction DR2 in the fan-out area FTA. For example, each of the first line LP1, the second line LP2, and the third line LP3 may include a bar-shaped linear part that extends in the second direction DR2 and has a reduced or minimized length, but the present disclosure is not limited thereto.

The substrate SUB may include a display area DA and a non-display area NDA. The display area DA may include a first display area DA1 that corresponds to the pad part PDP, and a second display area DA2 that does not correspond to the pad part PDP. Furthermore, the display area DA may include a first area A1 in which the first pixel PXL1 is disposed, a second area A2 in which the second pixel PXL2 is disposed, and a third area A3 in which the third pixel PXL3 is disposed. The third area A3 may correspond to the second display area DA2. The first area A1 and the second area A2 may be different areas of the first display area DA1.

A first connection line CNL1 may be disposed over the first, second, and third areas A1, A2, and A3. The first connection line CNL1 may transmit a certain signal (e.g., a scan signal and/or a control signal) to each of the first, second, and third pixels PXL1, PXL2, and PXL3. In one or more embodiments, the first connection line CNL1 may be electrically connected with a corresponding first signal line SL1 (e.g., a scan line) that is disposed in the first area A1, and supply the certain signal to each of the first, second, and third pixels PXL1, PXL2, and PXL3 through the first line LP1 connected with the first signal line SL1.

The first signal line SL1 that is electrically connected to the first pixel PXL1 may be disposed in the first area A1. The first signal line SL1 that is electrically connected to one first pixel PXL1 may include, for example, a data line, a scan line, an initialization power line, a first power line, a second power line, and the like, but the present disclosure is not limited thereto.

The second signal line SL2 that is electrically connected to the second pixel PXL2 may be disposed in the second area A2. The second signal line SL2 that is electrically connected to one second pixel PXL2 may include, for example, a data line, an initialization power line, a first power line, a second power line, and the like, but the present disclosure is not limited thereto.

An extension line ETL that is electrically connected, through a bridge line BRL, to the third pixel PXL3 disposed in the third area A3 may be disposed in the second area A2. The extension line ETL may be disposed in the second area A2 at a position spaced from the second signal line SL2 and electrically separated from the second signal line SL2. In one or more embodiments, the extension line ETL may be electrically separated (or electrically disconnected) from the second pixel PXL2.

The extension line ETL may be electrically connected with the bridge line BRL through a first contactor CNT1. The first contactor CNT1 may be formed by removing a portion of at least one insulating layer disposed between the extension line ETL and the bridge line BRL. For example, the first contactor CNT1 may be a through hole (or a contact hole) that passes through at least one insulating layer disposed between the extension line ETL and the bridge line BRL.

The bridge line BRL may extend in the first direction DR1 and may be disposed over the second area A2 and the third area A3, and may not be disposed in the first area A1. However, the present disclosure is not limited thereto. In one or more embodiments, the bridge line BRL may be disposed over the first area A1, the second area A2, and the third area A3 in the first direction DR1.

An auxiliary line SUL that is disposed on the same column as that of the extension line ETL may be disposed in the second area A2. For example, the auxiliary line SUL that is collinear with the extension line ETL in the second direction DR2 may be disposed in the second area A2.

The auxiliary line SUL may be spaced from the extension line ETL with an opening OPN formed therebetween, and be electrically separated (or disconnected) from the extension line ETL. The opening OPN may be formed by removing a portion of a conductive line that corresponds to a base configuration for the extension line ETL and the auxiliary line SUL. For example, the opening OPN may be formed by removing a portion of the conductive line that extends in the second area A2 in the second direction DR2, so that the extension line ETL and the auxiliary line SUL may be formed on the same line at positions spaced apart from each other by the opening OPN. In the second area A2, the extension line ETL may be disposed on a lower side based on the opening OPN, and the auxiliary line SUL may be disposed on an upper side based on the opening OPN.

In one or more embodiments, the extension line ETL may be disposed in the second area A2 without being electrically connected to the second pixel PXL2, and may be electrically connected to the third pixel PXL3 disposed in the third area A3. In one or more embodiments, the auxiliary line SUL may be disposed in the second area A2 and electrically connected to the second pixel PXL2.

A third signal line SL3 that is electrically connected to the third pixel PXL3 may be disposed in the third area A3. The third signal line SL3 that is electrically connected to one third pixel PXL3 may include, for example, a data line, an initialization power line, a first power line, a second power line, and the like, but the present disclosure is not limited thereto.

The third signal line SL3 may be electrically connected with the bridge line BRL through a second contactor CNT2. The second contactor CNT2 may be formed by removing a portion of at least one insulating layer disposed between the third signal line SL3 and the bridge line BRL. For example, the second contactor CNT2 may be a through hole (or a contact hole) that passes through at least one insulating layer disposed between the third signal line SL3 and the bridge line BRL.

In one or more embodiments, the third pad P3 from among the pads P disposed in the pad part PDP that corresponds to the second area A2 may be electrically connected with the third line LP3. The third line LP3 may be electrically connected with the extension line ETL that is disposed in the second area A2. The extension line ETL may be electrically connected, through the first contactor CNT1, with the bridge line BRL that is provided in common to the second area A2 and the third area A3. The bridge line BRL may be electrically connected with the third signal line SL3 through the second contactor CNT2. A signal from the third pad P3 may be transmitted, by the third signal line SL3, to the third pixel PXL3 that is disposed in the third area A3.

In accordance with the foregoing embodiment, each of the first pixels PXL1 that are disposed in the first area A1 may be electrically connected with the corresponding first line LP1 and supplied with a signal (e.g., driving voltages and/or signals for driving each of the first pixels PXL1) from the first pad P1. Each of the second pixels PXL2 that are disposed in the second area A2 may be electrically connected with the corresponding second line LP2 and supplied with a signal (e.g., driving voltages and/or signals for driving each of the second pixels PXL2) from the second pad P2. Each of the third pixels PXL3 disposed in the third area A3 may be electrically connected with the corresponding third line LP3 both through the extension line ETL that is disposed in the second area A2 and through the bridge line BRL provided over the second area A2 and the third area A3, and be supplied with a signal (e.g., driving voltages and/or signals for driving each of the third pixels PXL3) from the third pad P3.

In accordance with the foregoing embodiment, the first, second, and third lines LP1, LP2, and LP3 each of which is formed of a linear part having a comparatively short line length may be disposed in only the fan-out area FTA that corresponds to the first display area DA1 (or is disposed between the first display area DA1 and the pad area PDA), and may not be disposed in the fan-out area FTA that corresponds to the second display area DA2 (or is disposed between the second display area DA2 and the pad area PDA). Thus, the surface area (or the size) of the fan-out area FTA in which the lines LP are disposed may be reduced. Consequently, dead space in the non-display area NDA may be reduced.

In the conventional display device, there is a difference in line length between some lines (or fan-out lines) that are disposed in a peripheral portion of the fan-out area and some lines (or fan-out lines) disposed in a central portion of the fan-out area, whereby a deviation in resistance between the lines may be caused. Due to such a deviation in resistance between the lines, signals transmitted (or supplied) to the pixels may be distorted. Thus, adjacent pixels may differ in light output uniformity from each other. As a result, the display quality may be reduced.

In the foregoing embodiment, the lines LP may not be disposed in one area corresponding to the peripheral portion of the fan-out area FTA (e.g., in a portion of the fan-out area FTA that corresponds to the second display area DA2), and the first, second, and third lines LP1, LP2, and LP3 may be disposed in only a central portion of the fan-out area FTA, so that a deviation in line resistance between the adjacent lines (or the fan-out lines) can be reduced.

Furthermore, in the display device DD in accordance with the foregoing embodiment, the sum of the number of second pads P2 that are electrically connected to each of the second pixels PXL2 and the number of third pads P3 that are electrically connected to each of the third pixels PXL3 may be the same as the number of first pads P1 that are electrically connected to each of the first pixels PXL1. For example, the number of first pads P1 that are electrically connected to one first pixel PXL1 may be the same as the sum of the number of second pads P2 that are electrically connected to one second pixel PXL2 and the number of third pad P3 that are electrically connected to one third pixel PXL3.

Hereinafter, a stacked structure of each of the first, second, and third pixels PXL1, PXL2, and PXL3 in accordance with the foregoing embodiment will be mainly described with reference to FIGS. 8 to 11.

FIGS. 8 to 11 are schematic sectional views illustrating the respective stacked structures of the first, second, and third pixels PXL1, PXL2, and PXL3 illustrated in FIG. 7.

In the description of embodiments, "components are provided and/or formed on (or at) the same layer" may mean that the components are formed through the same process, and "components are provided and/or formed on different layers may mean that the components are formed through different processes.

Figure 8:
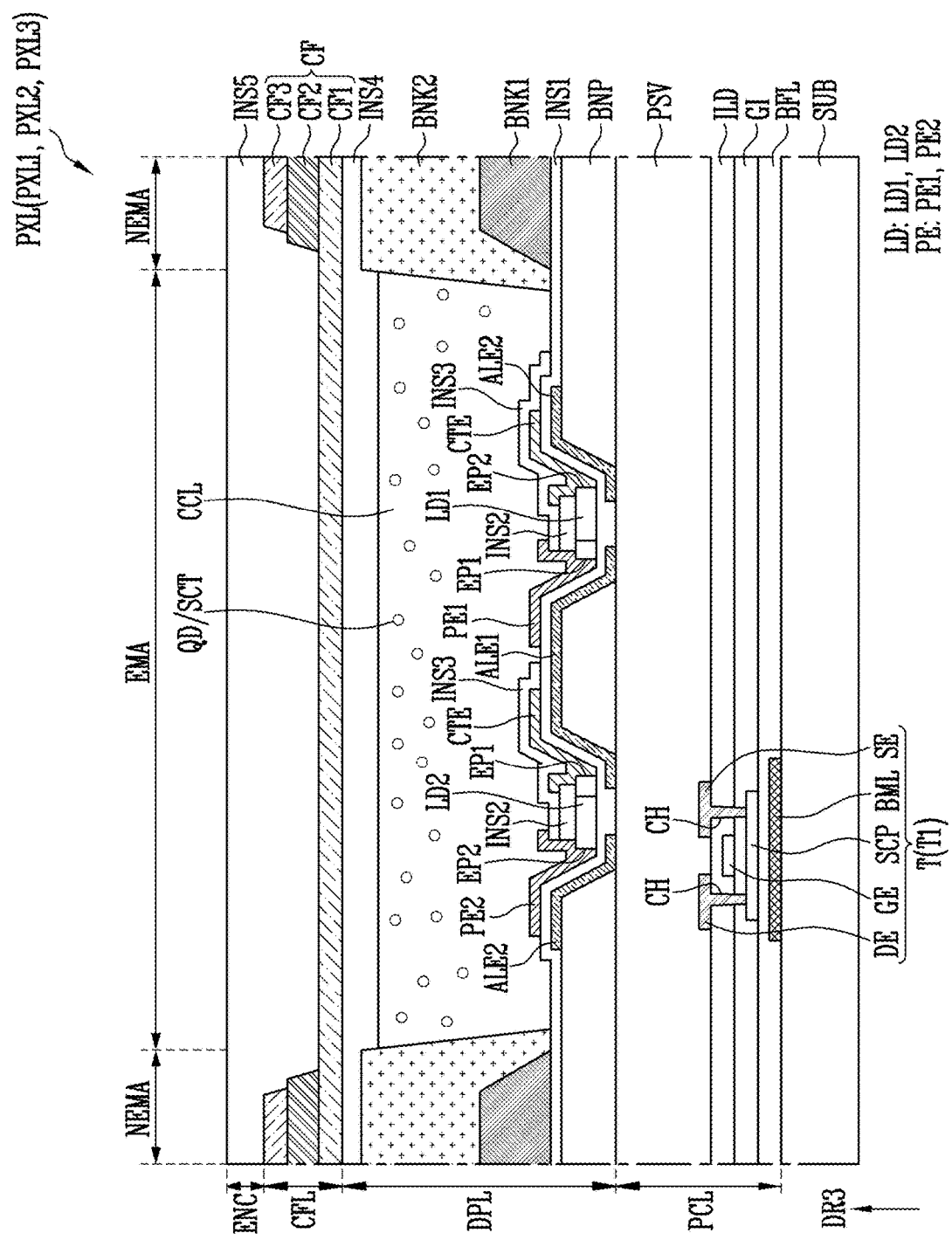
FIGS. 8 to 11 are schematic sectional views each illustrating a stacked structure of each of the first, second, and third pixels illustrated in FIG. 7.
Figure 9:
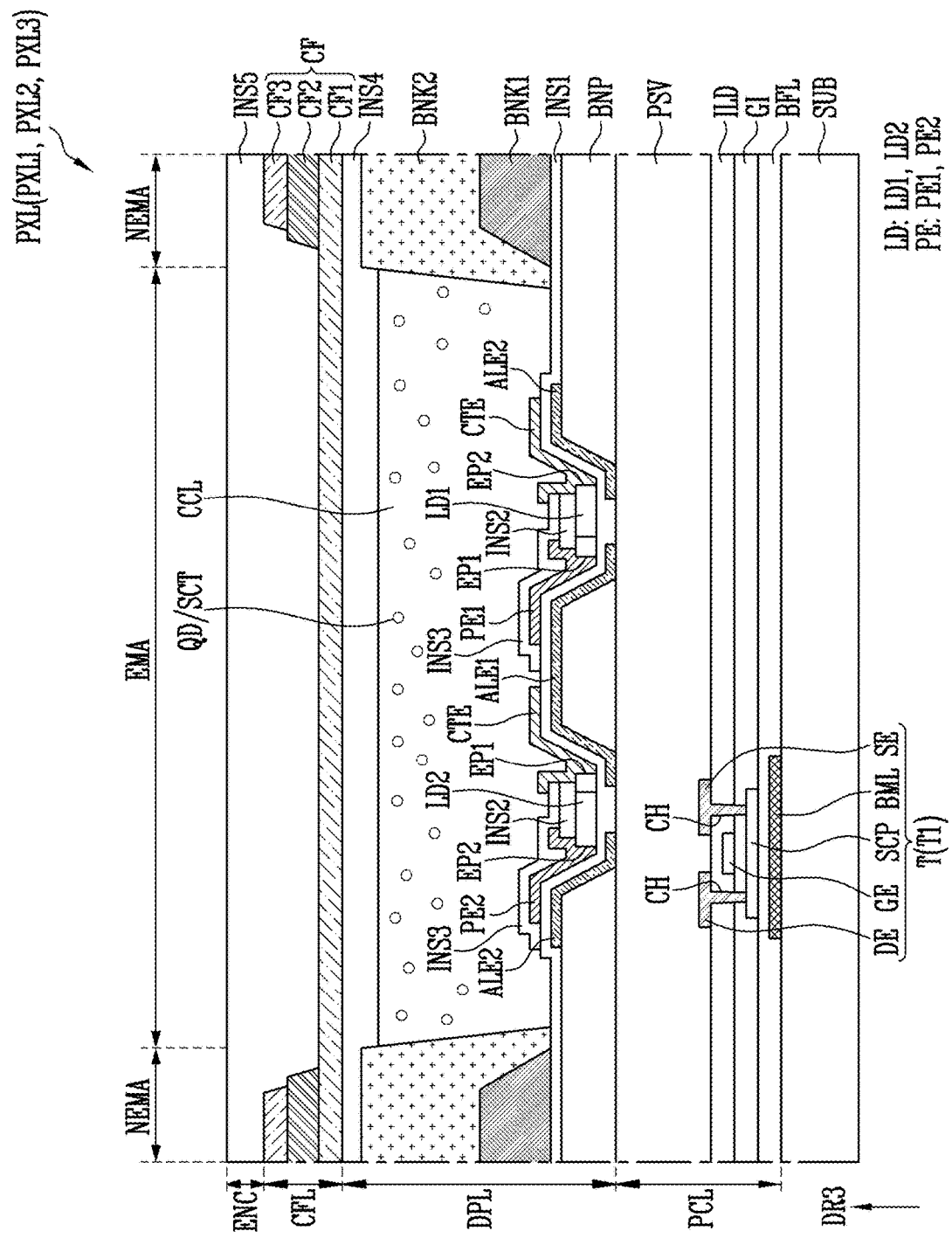
Figure 10:
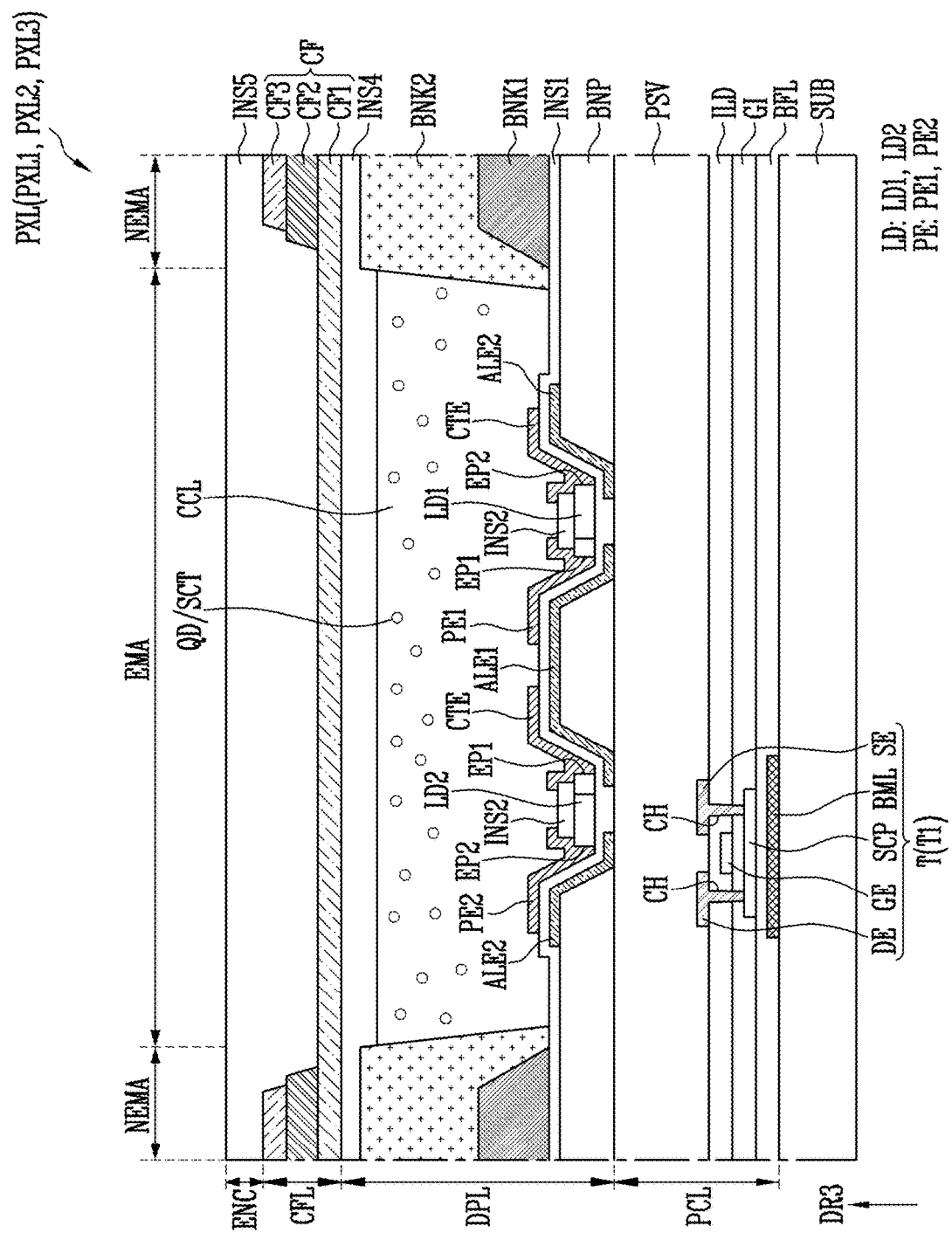

FIGS. 9 and 10 illustrates a modification of the embodiment of FIG. 8 with regard to a pixel electrode PE, and the like.

Figure 11:
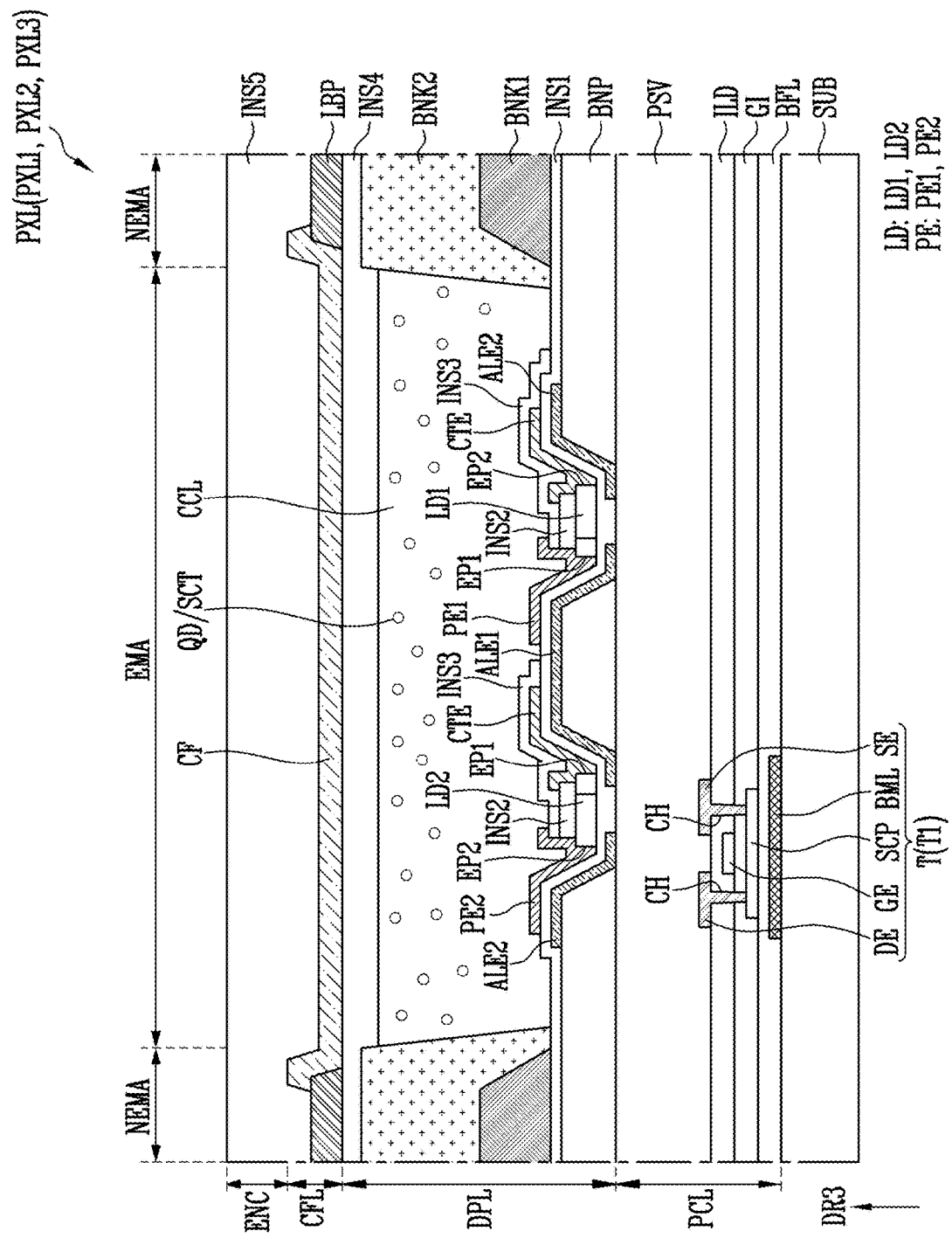

FIG. 11 illustrates a modification of the embodiment of FIG. 8 with regard to a light block pattern LBP, and the like.

Although FIGS. 8 to 11 simply illustrate each pixel PXL, e.g., illustrating that each electrode is formed of a single electrode and each insulating layer is formed of a single insulating layer, the present disclosure is not limited thereto.

FIGS. 8 to 11 each illustratively show a cross-section of one transistor T (e.g., a first transistor T1 including a bottom metal line BML) provided in the pixel circuit PXC, as an example of circuit elements that can be disposed in the pixel circuit layer PCL of each of the first, second, and third pixels PXL1, PXL2, and PXL3. Furthermore, FIGS. 8 to 11 each illustratively show a cross-section of the emission part EMU including the first light emitting element LD1 and the second light emitting element LD2, as illustrated in FIG. 6, as an example of the emission part EMU that can be disposed in the display element layer DPL of each of the first, second, and third pixels PXL1, PXL2, and PXL3.

Although the first pixel PXL1, the second pixel PXL2, and the third pixel PXL3 that are disposed in the display area DA substantially have cross-sectional structures similar to each other, the sizes, positions, shapes, and/or the like of circuit elements that form each of the first pixel PXL1, the second pixel PXL2, and the third pixel PXL3, and electrodes included in the circuit elements may be changed by the corresponding pixel PXL.

In the following description, the term "pixel PXL" or "pixels PXL" will be used to collectively designate the first pixel PXL1, the second pixel PXL2, and the third pixel PXL3.

Referring to FIGS. 1 to 11, each of the first, second, and third pixels PXL1, PXL2, and PXL3 may include an emission area EMA, and a non-emission area NEMA adjacent to the emission area EMA.

Each of the first, second, and third pixels PXL1, PXL2, and PXL3 (or the display panel DP) may include a substrate SUB, a pixel circuit layer PCL, a display element layer DPL, a color filter layer CFL, and an encapsulation layer ENC (or a cover layer).

The pixel circuit layer PCL and the display element layer DPL may be disposed on one surface of the substrate SUB and overlap each other. For example, the display area DA of the substrate SUB may include the pixel circuit layer PCL disposed on the one surface of the substrate SUB, and the display element layer DPL disposed on the pixel circuit layer PCL. However, relative positions of the pixel circuit layer PCL and the display element layer DPL on the substrate SUB may be changed depending on embodiments. In case that the pixel circuit layer PCL and the display element layer DPL are separated from each other as separate layers and overlap each other, layout space sufficient to form each of the pixel circuit PXC and the emission part EMU on a plane may be secured. In one or more embodiments, the pixel circuit layer PCL and the display element layer DPL may be disposed on (or at) the same plane without overlapping each other. In case that the pixel circuit layer PCL and the display element layer DPL are disposed on (or at) the same plane, the thickness of the display panel DP may be further reduced.

The substrate SUB may include transparent insulating material to allow light transmission. The substrate SUB may be a rigid substrate or a flexible substrate.

For example, the rigid substrate SUB may be one of a glass substrate, a quartz substrate, a glass ceramic substrate, and a crystalline glass substrate.

The flexible substrate SUB may be either a film substrate or a plastic substrate which includes polymer organic material. For example, the flexible substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The pixel circuit layer PCL may include circuit elements (e.g., transistors T) for forming the pixel circuit PXC of the corresponding pixel PXL, and signal lines electrically connected to the circuit elements.

The display element layer DPL may include alignment electrodes ALE1 and ALE2, light emitting elements LD, and/or pixel electrodes PE1 and PE2 that form the emission part EMU of the corresponding pixel PXL.

The pixel circuit layer PCL may include at least one or more insulating layers as well as including the circuit elements and the signal lines. For example, the pixel circuit layer PCL may include a buffer layer BFL, a gate insulating layer GI, an interlayer insulating layer ILD, and a passivation layer PSV that are successively stacked on the substrate SUB in the third direction DR3.

The buffer layer BFL may be provided and/or formed on the overall surface of the substrate SUB. The buffer layer BFL may prevent impurities from diffusing into a transistor T included in the pixel circuit PXC. The buffer layer BFL may be an inorganic insulating layer including inorganic material. The buffer layer BFL may include at least one of silicon nitride ($SiN_x$), silicon oxide ($SiO_x$), and silicon oxynitride ($SiO_xN_y$), or include at least one of metal oxides such as aluminum oxide ($AlO_x$). The buffer layer BFL may be provided in the form of a single layer structure, or provided in the form of a multilayer structure having at least two or more layers. In case that the buffer layer BFL is provided in the form of a multilayer structure, the respective layers may be formed of the same material or different materials. The buffer layer BFL may be omitted depending on the material of the substrate SUB or processing conditions.

The gate insulating layer GI may be provided and/or formed on the overall surface of the buffer layer BFL. The gate insulating layer GI may be an inorganic insulating layer including inorganic material. For example, the gate insulating layer GI may include the same material as that of the buffer layer BFL, or include one or more suitable materials from among the materials exemplified as the constituent materials of the buffer layer BFL. In one or more embodiments, the gate insulating layer GI may be formed of an organic insulating layer including organic material. The gate insulating layer GI may be provided in the form of a single layer structure, or provided in the form of a multilayer structure having at least two or more layers.

The interlayer insulating layer ILD may be provided and/or formed on the overall surface of the gate insulating layer GI. The interlayer insulating layer ILD may include the same material as that of the gate insulating layer GI, or may include one or more suitable (or selected) materials from among materials exemplified as the constituent material of the gate insulating layer GI.

The passivation layer PSV may be provided and/or formed on the overall surface of the interlayer insulating layer ILD. The passivation layer PSV may be formed of an inorganic layer (or an inorganic insulating layer) including inorganic material, or an organic layer (or an organic insulating layer) including organic material. The inorganic layer may include, for example, at least one of silicon oxide ($SiO_x$), silicon nitride ($SiN_x$), and silicon oxynitride ($SiO_xN_y$), or include at least one of metal oxides such as aluminum oxide ($AlO_x$). The organic layer may include, for example, at least one of polyacrylates resin, epoxy resin, phenolic resin, polyamides resin, polyimides rein, unsaturated polyesters resin, poly-phenylen ethers resin, polyphenylene sulfides resin, and benzocyclobutene resin.

The pixel circuit PXC may include at least one or more transistors T. The transistor T may be a driving transistor configured to control driving current of the light emitting element LD, and have the same configuration as that of the first transistor T1 described with reference to FIGS. 5 and 6.

The transistor T may include a gate electrode GE, a semiconductor pattern SCP that partially overlaps the gate electrode GE in a thickness direction of the flexible substrate SUB (e.g., a third direction DR3), and source and drain electrodes SE and DE that are connected to the semiconductor pattern SCP.

The gate electrode GE may be provided and/or formed on the gate insulating layer GI. The gate electrode GE may be disposed between the gate insulating layer GI and the interlayer insulating layer ILD. The gate electrode GE may overlap a portion of the semiconductor pattern SCP in the third direction DR3. For example, the gate electrode GE may overlap an active pattern of the semiconductor pattern SCP. The gate electrode GE may have a single layer structure formed of one or combination selected from the group consisting of molybdenum (Mo), tungsten (W), aluminum neodymium (AlNd), titanium (Ti), aluminum (Al), silver (Ag), and an alloy thereof, or may have a double layer or multilayer structure formed of molybdenum (Mo), titanium (Ti), copper (Cu), aluminum (Al), or silver (Ag) which is low resistance material to reduce line resistance.

The semiconductor pattern SCP may be provided and/or formed on the buffer layer BFL. For example, the semiconductor pattern SCP may be disposed between the buffer layer BFL and the gate insulating layer GI. The semiconductor pattern SCP may be a semiconductor layer formed of poly silicon, amorphous silicon, an oxide semiconductor, and the like. The semiconductor pattern SCP may include an active pattern, a first contact area, and a second contact area. The active pattern, the first contact area, and the second contact area each may be formed of a semiconductor layer that is doped with no impurity or doped with an impurity. For example, the first contact area and the second contact area each may be formed of a semiconductor layer that is doped with an impurity, and the active pattern may be formed of an undoped semiconductor layer. For example, an n-type impurity may be used as the impurity, but the present disclosure is not limited thereto.

The active pattern of the semiconductor pattern SCP may be an area that overlaps the gate electrode GE of the transistor T in the third direction DR3, and may be a channel area. The first contact area of the semiconductor pattern SCP may contact one end of the active pattern. Furthermore, the first contact area may be connected to the source electrode SE. The second contact area of the semiconductor pattern SCP may contact a remaining end of the active pattern. Furthermore, the second contact area may be connected to the drain electrode DE.

The source electrode SE may be provided and/or formed on the interlayer insulating layer ILD. The source electrode SE may contact the first contact area of the semiconductor pattern SCP through a contact hole CH of each of the gate insulating layer GI and the interlayer insulating layer ILD.

The drain electrode DE may be provided and/or formed on the interlayer insulating layer ILD, and spaced from the source electrode SE. The drain electrode DE may contact the second contact area of the semiconductor pattern SCP through a contact hole CH of each of the gate insulating layer GI and the interlayer insulating layer ILD.

The bottom metal pattern BML may be disposed under the transistor T.

The bottom metal pattern BML may be a first conductive layer from among conductive layers included in the pixel circuit layer PCL. For example, the bottom metal pattern BML may be a conductive layer disposed between the substrate SUB and the buffer layer BFL. The bottom metal pattern BML may be electrically connected to the transistor T. In this case, a driving range of a certain voltage to be applied to the gate electrode GE of the transistor T may be increased. In one or more embodiments, the bottom metal pattern BML may be electrically connected to the semiconductor pattern SCP of the transistor T and stabilize the channel area of the transistor T. Furthermore, because the bottom metal pattern BML is electrically connected to the transistor T, the bottom metal pattern BML may be prevented from floating.

Although in the foregoing embodiment there has been illustrated the case where the transistor T is a thin-film transistor having a top gate structure, the present disclosure is not limited thereto. The structure of the transistor T may be changed in various ways.

The passivation layer PSV may be provided and/or formed on the pixel circuit PXC including the transistor T.

In one or more embodiments, the pixel circuit layer PCL may include a certain power line. For example, the pixel circuit layer PCL may include the first power line PL1 and the second power line PL2 that have been described with reference to FIGS. 5 and 6. The first and second power lines PL1 and PL2 may be provided and/or formed on one insulating layer from among insulating layers provided in the pixel circuit layer PCL.

The display element layer DPL may be provided and/or formed on the passivation layer PSV.

The display element layer DPL of each of the first, second, and third pixels PXL1, PXL2, and PXL3 may include an emission part EMU. For example, the display element layer DPL may include the first and second alignment electrodes ALE1 and ALE2, at least one light emitting element LD, and the first and second pixel electrodes PE1 and PE2 that are disposed in the emission area EMA of the pixel PXL. In one or more embodiments, the emission part EMU may include a plurality of light emitting elements LD.

Furthermore, the display element layer DPL may further include insulating patterns and/or insulating layers that are successively disposed on one surface of the pixel circuit layer PCL. For example, the display element layer DPL may further include bank patterns BNP, a first insulating layer INS1, a first bank BNK1, a second insulating layer INS2, a third insulating layer INS3, a second bank BNK2, and a fourth insulating layer INS4.

The bank patterns BNP may be provided and/or formed on the passivation layer PSV of the pixel circuit layer PCL.

The bank patterns BNP (referred also to as "support components" or "wall patterns") may be provided and/or formed on the passivation layer PSV. In one or more embodiments, the bank patterns BNP may be formed of separate patterns that are individually disposed under the first and second alignment electrodes ALE1 and ALE2 such that the separate patterns overlap respective portions of the first and second alignment electrodes ALE1 and ALE2. Alternatively, the bank patterns BNP may be formed of an integrated pattern that has openings or recesses corresponding to areas between the first and second alignment electrodes ALE1 and ALE2 in the emission area EMA of each of the first, second, and third pixels PXL1, PXL2, and PXL3 and is generally integrally formed in the display area DA.

The bank patterns BNP may protrude in the third direction DR3 on the one surface of the passivation layer PSV. Hence, one area of each of the first and second alignment electrodes ALE1 and ALE2 disposed on the bank patterns BNP may protrude in the third direction DR3 (or the thickness direction of the substrate SUB).

The bank patterns BNP each may be an inorganic insulating layer including inorganic material or an organic insulating layer including organic material. In one or more embodiments, the bank patterns BNP each may include an organic layer having a single layer structure and/or an inorganic layer having a single layer structure, but the present disclosure is not limited thereto. In one or more embodiments, the bank patterns BNP may be provided in the form of a multilayer structure formed by stacking at least one organic insulating layer and at least one inorganic insulating layer. However, the material of the bank patterns BNP is not limited to the foregoing embodiment. In one or more embodiments, the bank patterns BNP may include conductive material (or conductive substance). The shape of the bank patterns BNP may be changed in various ways within a range in which efficiency of light emitted from the light emitting element LD can be enhanced.

The bank patterns BNP each may be used as a reflector. For example, the bank patterns BNP, along with the first and second alignment electrodes ALE1 and ALE2 disposed thereover, may be used as reflectors that guide light emitted from the light emitting element LD in a desired direction so that light output efficiency of each of the first, second, and third pixels PXL1, PXL2, and PXL3 can be enhanced.

The first and second alignment electrodes ALE1 and ALE2 may be provided and/or formed on the bank patterns BNP.

The first and second alignment electrodes ALE1 and ALE2 may be provided and/or formed on the passivation layer PSV and the bank patterns BNP.

The first alignment electrode ALE1 and the second alignment electrode ALE2 may be arranged along one direction, e.g., a horizontal direction, intersecting the third direction DR3. The first alignment electrode ALE1 and the second alignment electrode ALE2 may be spaced from each other. The first alignment electrode ALE1 and the second alignment electrode ALE2 may be disposed on (or at) the same plane, and have the same thickness with respect to the third direction DR3. The first alignment electrode ALE1 and the second alignment electrode ALE2 may be concurrently (e.g., simultaneously) formed through the same process, or be sequentially formed.

The first alignment electrode ALE1 and the second alignment electrode ALE2 each may have a shape corresponding to a profile of the bank pattern BNP disposed thereunder.

The first alignment electrode ALE1 and the second alignment electrode ALE2 each may be formed of material having a certain (or uniform) reflectivity to allow light emitted from the light emitting elements LD to travel in an image display direction of the display device DD. For example, the first alignment electrode ALE1 and the second alignment electrode ALE2 each may be formed of conductive material (or substance). The conductive material may include opaque metal that is suitable for reflecting, in the image display direction (or an upward direction of the display element layer DPL) of the display device, light emitted from the light emitting elements LD. For example, the opaque metal may include metal such as silver (Ag), magnesium (Mg), aluminum (Al), platinum (Pt), palladium (Pd), gold (Au), nickel (Ni), neodymium (Nd), iridium (Ir), chrome (Cr), titanium (Ti), and an alloy thereof. However, the material of the first alignment electrode ALE1 and the second alignment electrode ALE2 is not limited to the foregoing embodiment. In one or more embodiments, the first alignment electrode ALE1 and the second alignment electrode ALE2 each may include transparent conductive material (or substance). The transparent conductive material (or substance) may include transparent conductive oxides such as indium tin oxide (ITO), indium zinc oxide (IZO), zinc oxide ($ZnO_x$), indium gallium zinc oxide (IGZO), and indium tin zinc oxide (ITZO), and a conductive polymer such as PEDOT (poly(3,4-ethylenedioxythiophene)). In case that the first alignment electrode ALE1 and the second alignment electrode ALE2 each include transparent conductive material (or substance), a separate conductive layer formed of opaque metal for reflecting light emitted from the light emitting elements LD in the image display direction of the display device DD may be added. However, the material of the first alignment electrode ALE1 and the second alignment electrode ALE2 is not limited to the foregoing embodiment.

Although the first alignment electrode ALE1 and the second alignment electrode ALE2 each may be provided and/or formed in the form of a single layer structure, the present disclosure is not limited thereto. In one or more embodiments, the first alignment electrode ALE1 and the second alignment electrode ALE2 each may be provided and/or formed to have a multilayer structure formed by stacking at least two materials from among metals, alloys, conductive oxide, and conductive polymers. The first alignment electrode ALE1 and the second alignment electrode ALE2 each may be provided in the form of a multilayer structure including at least double layers to reduce or minimize a distortion due to a signal delay when signals are transmitted to the opposite ends EP1 and EP2 of the light emitting elements LD. For example, the first alignment electrode ALE1 and the second alignment electrode ALE2 each may have a multilayer structure that selectively further includes at least one from among at least one reflective electrode layer, at least one transparent electrode layer disposed over and/or under the reflective electrode layer, and at least one conductive capping layer configured to cover an upper portion of the reflective electrode layer and/or the transparent electrode layer.

In case that the first alignment electrode ALE1 and the second alignment electrode ALE2 each are formed of conductive material having a reflectivity, light emitted from the opposite ends EP1 and EP2 of each of the light emitting elements LD may more reliably travel in the image display direction of the display device DD. For example, if the first alignment electrode ALE1 and the second alignment electrode ALE2 have inclined surfaces or curved surfaces that corresponds to the shape of the bank pattern BNP and are disposed to face (e.g., oppose) the opposite ends EP1 and EP2 of each of the light emitting elements LD, light emitted from the opposite ends EP1 and EP2 of each of the light emitting elements LD may be reflected by the first alignment electrode ALE1 and the second alignment ALE2 and more reliably travel in the image display direction of the display device DD. Consequently, the efficiency of light emitted from the light emitting elements LD may be enhanced.

In one or more embodiments, at least one first alignment electrode ALE1 and at least one second alignment electrode ALE2 may be disposed in the emission area EMA of each of the first, second, and third pixels PXL1, PXL2, and PXL3. For example, one first alignment electrode ALE1 may be disposed in a central portion of the emission area EMA, and two second alignment electrodes ALE2 may be disposed on opposite sides of the first alignment electrode ALE1. The second alignment electrodes ALE2 may be integrally or non-integrally connected to each other and supplied with the same signal or power. The number, shape, size, position, and/or the like of each of the first and second alignment electrodes ALE1 and ALE2 disposed in the emission area EMA may be changed in various ways depending on embodiments.

The first insulating layer INS1 may be disposed on the first and second alignment electrodes ALE1 and ALE2.

The first insulating layer INS1 may be provided and/or formed on overall surfaces of the first and second alignment electrodes ALE1 and ALE2 and the bank pattern BNP. The first insulating layer INS1 may be partially open so that, in the non-emission area NEMA of each of the first, second, and third pixels PXL1, PXL2, and PXL3, components disposed thereunder may be exposed from the first insulating layer INS1. For example, the first insulating layer INS1 may be partially open in the non-emission area NEMA to include at least one or more contact holes for respectively connecting the first and second alignment electrodes ALE1 and ALE2 to the first and second pixel electrodes PE1 and PE2. In one or more embodiments, the first insulating layer INS1 may be formed on the overall surface of the display area DA in which the first and second alignment electrodes ALE1 and ALE2 are formed, and may include openings that expose respective portions of the first and second alignment electrodes ALE1 and ALE2. The first and second alignment electrodes ALE1 and ALE2 may be respectively electrically connected to the first and second pixel electrodes PE1 and PE2 through the openings. Furthermore, in one or more embodiments, the first insulating layer INS1 may be sectionally disposed under only an area where the light emitting elements LD are arranged.

The first insulating layer INS1 may be formed of an inorganic insulating layer made of inorganic material. For example, the first insulating layer INS1 may be formed of an inorganic insulating layer suitable for protecting the light emitting elements LD from the pixel circuit layer PCL. For instance, the first insulating layer INS1 may include at least one of silicon nitride ($SiN_x$), silicon oxide ($SiO_x$), silicon oxynitride ($SiO_xN_y$), or at least one of metal oxides such as aluminum oxide ($AlO_x$).

In one or more embodiments, the first insulating layer INS1 may be provided in the form of a single layer or multilayer structure. In case that the first insulating layer INS1 is provided in the form of a multilayer structure, the first insulating layer INS1 may have a distributed bragg reflector (DBR) structure formed by alternately stacking first layers and second layers that are formed of inorganic layers and have different refractive indexes.

The first bank BNK1 may be disposed on the first insulating layer INS1.

The first bank BNK1 may be provided and/or formed on the first insulating layer INS1 in the non-emission area NEMA of each of the first, second, and third pixels PXL1, PXL2, and PXL3. The first bank BNK1 may form a pixel defining layer that encloses the respective emission areas EMA of the first, second, and third pixels PXL1, PXL2, and PXL3, is formed between adjacent pixels PXL, and partitions the respective emission areas EMA of the first, second, and third pixels PXL1, PXL2, and PXL3. The first bank BNK1 may form a dam structure configured to prevent a solution (or ink) mixed with the light emitting elements LD from being drawn into the emission areas EMA of the adjacent pixels PXL or control the amount of solution such that an appropriate amount of solution is supplied to each emission area EMA, at the step of supplying (or inputting) the light emitting elements LD to the emission area EMA of each of the first, second, and third pixels PXL1, PXL2, and PXL3.

The first bank BNK1 may include at least one light block material and/or reflective material (or scattering material), thus preventing a light leakage defect in which light (or rays) leaks between the pixel PXL and the pixels PXL adjacent thereto. In one or more embodiments, the first bank BNK1 may include transparent material (or substance). The transparent material may include, for example, polyamides resin, polyimides resin, and the like, but the present disclosure is not limited thereto. In one or more embodiments, in order to further enhance the efficiency of light emitted from the pixel PXL, a separate reflective material layer may be provided and/or formed on the first bank BNK1.

In one or more embodiments, the first bank BNK1 may be surface-treated so that at least one surface thereof has hydrophobicity. For example, the first bank BNK1 may be surface-treated to have hydrophobicity by plasma before the light emitting elements LD are aligned, but the present disclosure is not limited thereto.

The light emitting elements LD may be supplied to the emission area EMA of each of the first, second, and third pixels PXL1, PXL2, and PXL3 that is enclosed (or defined) by the first bank BNK1. For example, the light emitting elements LD may be supplied (or input) to the emission area EMA by an inkjet printing scheme or the like. The light emitting elements LD may be aligned on a surface of the first insulating layer INS1 between the first alignment electrode ALE1 and the second alignment electrode ALE2 by an electric field formed by signals (or alignment signals) applied to the first alignment electrode ALE1 (or a first alignment line that is before being separated into the first alignment electrode ALE1) and the second alignment electrode ALE2 (or a second alignment line that is before being separated into the second alignment electrode ALE2). For instance, the light emitting elements LD supplied to the emission area EMA may be arranged such that the first ends EP1 face (e.g., oppose) the first alignment electrode ALE1, and the second ends EP2 face (e.g., oppose) the second alignment electrodes ALE2.

The light emitting elements LD may include a first light emitting element LD1 and a second light emitting element LD2.

The first light emitting element LD1 may be disposed between a first side of the first alignment electrode ALE1 and one second alignment electrode ALE2 adjacent to the first side of the first alignment electrode ALE1. The first light emitting element LD1 may include a first end EP1 that faces (e.g., opposes) the first side of the first alignment electrode ALE1, and a second end EP2 that faces (e.g., opposes) the one second alignment electrode ALE2.

The second light emitting element LD2 may be disposed between a second side of the first alignment electrode ALE1 and a second alignment electrode ALE2 adjacent to the second side of the first alignment electrode ALE1. The second light emitting element LD2 may include a first end EP1 that faces (e.g., opposes) the second side of the first alignment electrode ALE1, and a second end EP2 that faces (e.g., opposes) the second alignment electrode ALE2.

In the emission area EMA of each of the first, second, and third pixels PXL1, PXL2, and PXL3, the second insulating layer (or insulating pattern) INS2 may be provided and/or formed on the first and second light emitting elements LD1 and LD2. The second insulating layer INS2 may be disposed on each of the first and second light emitting elements LD1 and LD2, and partially cover an outer surface (e.g., an outer peripheral or circumferential surface (or a surface)) of each of the first and second light emitting elements LD1 and LD2 so that the first end EP1 and the second end EP2 of each of the first and second light emitting elements LD1 and LD2 may be exposed to the outside.

The second insulating layer INS2 may include an inorganic insulating layer including inorganic material, or an organic insulating layer. For example, the second insulating layer INS2 may include an inorganic insulating layer suitable for protecting the active layer 12 of each of the first and second light emitting elements LD1 and LD2 from external oxygen, water, or the like. However, the present disclosure is not limited thereto. The second insulating layer INS2 may be formed of an organic insulating layer including organic material, depending on design conditions, etc. of the display device to which the first and second light emitting elements LD1 and LD2 are applied. The second insulating layer INS2 may be formed of a single layer or multiple layers.

Because the second insulating layer INS2 is formed on the first and second light emitting elements LD1 and LD2 that are completely aligned in the emission area EMA of each of the first, second, and third pixels PXL1, PXL2, and PXL3, the first and second light emitting elements LD1 and LD2 may be prevented from being removed from aligned positions.

Different electrodes from among the first pixel electrode PE1 (or the first electrode), the second pixel electrode PE2 (or the second electrode), and the intermediate electrode CTE may be formed on the opposite ends of the first and second light emitting elements LD1 and LD2, e.g., the first and second ends EP1, and EP2, which are not covered with the second insulating layer INS2. For example, the first pixel electrode PE1 may be formed on the first end EP1 of the first light emitting element LD1. The intermediate electrode CTE may be formed on the second end EP2 of the first light emitting element LD1. The intermediate electrode CTE may be formed on the first end EP1 of the second light emitting element LD2. The second pixel electrode PE2 may be formed on the second end EP2 of the second light emitting element LD2.

Although FIGS. 8 to 11 illustrate that the intermediate electrode CTE disposed on the second end EP2 of the first light emitting element LD1 and the intermediate electrode CTE disposed on the first end EP1 of the second light emitting element LD2 are separated from each other, the intermediate electrodes CTE may be integrally or non-integrally connected to each other to form one intermediate electrode CTE. For example, the intermediate electrode CTE disposed on the second end EP2 of the first light emitting element LD1 and the intermediate electrode CTE disposed on the first end EP1 of the second light emitting element LD2 may be integrally connected to each other.

Furthermore, although FIGS. 8 to 11 illustrate that the first alignment electrode ALE1 and the first pixel electrode PE1 are electrically separated from each other (or disconnected from each other), the first alignment electrode ALE1 and the first pixel electrode PE1 may be electrically connected to each other through at least one contact hole in an area. Likewise, although FIGS. 8 to 11 illustrate that the second alignment electrode ALE2 and the second pixel electrode PE2 are electrically separated from each other (or disconnected from each other), the second alignment electrode ALE2 and the second pixel electrode PE2 may be electrically connected to each other through at least one contact hole in an area.

In addition, although FIGS. 8 to 11 illustrate that the first transistor T1 and the first alignment electrode ALE1 are electrically separated from each other, the first transistor T1 and the first alignment electrode ALE1 of each of the first, second, and third pixels PXL1, PXL2, and PXL3 may be electrically connected to each other through at least one contact hole in an area. The second alignment electrode ALE2 and the second pixel electrode PE2 of each of the first, second, and third pixels PXL1, PXL2, and PXL3 may be electrically connected to the second power line PL2 in an area. The intermediate electrode CTE may be electrically connected to the first pixel electrode PE1 through the first light emitting element LD1 and electrically connected to the second pixel electrode PE2 through the second light emitting element LD2.

The first pixel electrode PE1 (or the first electrode) may be disposed over the first alignment electrode ALE1 to overlap a portion of the first alignment electrode ALE1. The second pixel electrode PE2 (or the second electrode) may be disposed over the second alignment electrode ALE2 to overlap a portion of the second alignment electrode ALE2. The intermediate electrode CTE may be disposed over the first alignment electrode ALE1 and the second alignment electrode ALE2 to overlap respective different portions of the first alignment electrode ALE1 and the second alignment electrode ALE2.

The first pixel electrode PE1, the second pixel electrode PE2, and/or the intermediate electrode CTE may be formed on (or at) the same layer or different layers. For example, relative positions and/or a formation sequence of the first pixel electrode PE1, the second pixel electrode PE2, and the intermediate electrode CTE may be changed in various ways depending on embodiments.

In one or more embodiments of FIG. 8, the intermediate electrode CTE may be first formed on the second insulating layer INS2. The intermediate electrode CTE may directly contact the second end EP2 of the first light emitting element LD1 and the first end EP1 of the second light emitting element LD2 and thus may be connected between the first light emitting element LD1 and the second light emitting element LD2, but the present disclosure is not limited thereto. Thereafter, the third insulating layer INS3 may be formed in the emission area EMA of each of the first, second, and third pixels PXL1, PXL2, and PXL3 such that at least the intermediate electrode CTE is covered with the third insulating layer INS3. The first pixel electrode PE1 and the second pixel electrode PE2 may be formed in the emission area EMA. The first pixel electrode PE1 and the second pixel electrode PE2 may be concurrently (e.g., simultaneously) or sequentially formed. The first pixel electrode PE1 may directly contact the first end EP1 of the first light emitting element LD1 and thus may be connected to the first end EP1 of the first light emitting element LD1 and may partially overlap the second insulating layer INS2 and the third insulating layer INS3. The second pixel electrode PE2 may directly contact the second end EP2 of the second light emitting element LD2 and thus may be connected to the second end EP2 of the second light emitting element LD2 and may partially overlap the second insulating layer INS2 and the third insulating layer INS3. However, the present disclosure is not limited thereto.

The third insulating layer INS3 may be disposed on the intermediate electrode CTE and thus cover the intermediate electrode CTE (or prevent the intermediate electrode CTE from being exposed to the outside), thus preventing corrosion or the like of the intermediate electrode CTE. The third insulating layer INS3 may be formed of an inorganic insulating layer including inorganic material, or an organic insulating layer including organic material. For instance, the third insulating layer INS3 may include at least one of silicon nitride ($SiN_x$), silicon oxide ($SiO_x$), silicon oxynitride ($SiO_xN_y$), or at least one of metal oxides such as aluminum oxide ($AlO_x$). However, the material of the third insulating layer INS3 is not limited to the foregoing. The third insulating layer INS3 may be formed of a single layer or multiple layers.

In one or more embodiments of FIG. 9, the first pixel electrode PE1 and the second pixel electrode PE2 may be first formed on the second insulating layer INS2. The first pixel electrode PE1 and the second pixel electrode PE2 may be concurrently (e.g., simultaneously) or sequentially formed. Therefore, the third insulating layer INS3 may be formed to cover the first pixel electrode PE1 and the second pixel electrode PE2. The intermediate electrode CTE may be formed in the emission area EMA of each of the first, second, and third pixels PXL1, PXL2, and PXL3 in which the third insulating layer INS3 is formed. The intermediate electrode CTE may partially overlap the second insulating layer INS2 and the third insulating layer INS3.

As illustrated in the embodiments of FIGS. 8 and 9, in case that the electrodes disposed on the first end EP1 and the second end EP2 of each light emitting element LD are disposed on different layers, the electrodes may be reliably separated from each other, and a short-circuit defect may be prevented from occurring.

In an embodiment of FIG. 10, the first pixel electrode PE1, the second pixel electrode PE2, and the intermediate electrode CTE may be disposed on (or at) the same layer in the display element layer DPL, and concurrently (e.g., simultaneously) or sequentially formed. In this case, the third insulating layer INS3 may be omitted. In one or more embodiments of FIG. 10, in case that the electrodes disposed on the first end EP1 and the second end EP2 of each light emitting element LD are concurrently (e.g., simultaneously) formed, a process of fabricating each of the first, second, and third pixels PXL1, PXL2, and PXL3 may be facilitated, and process efficiency may be enhanced.

The first pixel electrode PE1, the second pixel electrode PE2, and the intermediate electrode CTE may be formed of various transparent conductive materials to allow light emitted from each of the light emitting elements LD to travel in the image display direction (e.g., in the third direction DR3) of the display device DD without optical loss. For example, the first pixel electrode PE1, the second pixel electrode PE2, and the intermediate electrode CTE may include at least one of various transparent conductive materials including indium tin oxide (ITO), indium zinc oxide (IZO), zinc oxide ($ZnO_x$), indium gallium zinc oxide (IGZO), and indium tin zinc oxide (ITZO), and may be substantially transparent or translucent to satisfy a certain transmittancy (or transmittance). The materials of the first pixel electrode PE1, the second pixel electrode PE2, and the intermediate electrode CTE are not limited to those of the foregoing embodiments. In one or more embodiments, the first pixel electrode PE1, the second pixel electrode PE2, and the intermediate electrode CTE may also be formed of various opaque conductive materials (substances). The first pixel electrode PE1, the second pixel electrode PE2, and the intermediate electrode CTE each may be formed of a single layer or multiple layers.

Each of the first, second, and third pixels PXL1, PXL2, and PXL3 (or the display panel DP) may further include a color conversion layer CCL disposed in the emission area EMA of the corresponding pixel PXL, and a second bank BNK2 disposed in the non-emission area NEMA of the corresponding pixel PXL.

The second bank BNK2 may be provided and/or formed on the first bank BNK1 in the non-emission area NEMA of each of the first, second, and third pixels PXL1, PXL2, and PXL3. The second bank BNK2 may be a structure that encloses the emission area EMA of each of the first, second, and third pixels PXL1, PXL2, and PXL3 and defines a position to which the color conversion layer CCL is to be supplied, thus eventually defining the emission area EMA of each of the first, second, and third pixels PXL1, PXL2, and PXL3. For example, the second bank BNK2 may be a structure that defines a supply (or input) position of the color conversion layer CCL in each of the first, second, and third pixels PXL1, PXL2, and PXL3 and eventually set the emission area EMA of the corresponding pixel PXL.

The second bank BNK2 may include light block material. For example, the second bank BNK2 may be a black matrix. In one or more embodiments, the second bank BNK2 may include at least one light block material and/or reflective material, and allow light emitted from the color conversion layer CCL to more reliably travel in the image display direction (or the third direction DR3) of the display device DD, thus enhancing the light output efficiency of color conversion layer CCL.

The color conversion layer CCL may be formed on the first pixel electrode PE1, the second pixel electrode PE2, and/or the intermediate electrode CTE in the emission area EMA of each of the first, second, and third pixels PXL1, PXL2, and PXL3 that are enclosed by the second bank BNK2.

The color conversion layer CCL may include color conversion particles QD corresponding to a specific color. For example, the color conversion layer CCL may include color conversion particles QD that convert a first color of light emitted from the light emitting elements LD to a second color (or a specific color) of light.

In case that the first pixel PXL1 from among the first, second, and third pixels PXL1, PXL2, and PXL3 is a red pixel (or a red sub-pixel), the color conversion layer CCL of the corresponding pixel PXL may include color conversion particles QD formed of red quantum dots that convert a first color of light emitted from the light emitting elements LD to a second color of light, e.g., red light.

In case that the second pixel PXL2 from among the first, second, and third pixels PXL1, PXL2, and PXL3 is a green pixel (or a green sub-pixel), the color conversion layer CCL of the corresponding pixel PXL may include color conversion particles QD formed of green quantum dots that convert a first color of light emitted from the light emitting elements LD to a second color of light, e.g., green light.

In case that the third pixel PXL3 from among the first, second, and third pixels PXL1, PXL2, and PXL3 is a blue pixel (or a blue sub-pixel), the color conversion layer CCL of the corresponding pixel PXL may include color conversion particles QD formed of blue quantum dots that convert a first color of light emitted from the light emitting elements LD to a second color of light, e.g., blue light. In one or more embodiments, in case that the third pixel PXL3 is a blue pixel (or a blue sub-pixel), there may be provided a light scattering layer including light scattering particles SCT, in place of the color conversion layer CCL including the color conversion particles QD. For example, in case that the light emitting elements LD emit blue-based light, the third pixel PXL3 may include a light scattering layer including light scattering particles SCT. The light scattering layer may be omitted depending on embodiments. In one or more embodiments, in case that the third pixel PXL3 is a blue pixel (or a blue sub-pixel), there may be provided a transparent polymer, in place of the color conversion layer CCL.

The fourth insulating layer INS4 may be disposed on the color conversion layer CCL and the second bank BNK2.

The fourth insulating layer INS4 may be provided, to cover the second bank BNK2 and the color conversion layer CCL, on the overall surface (or the entirety) of the display area DA (or the pixel area) in which each of the first, second, and third pixels PXL1, PXL2, and PXL3 is disposed. The fourth insulating layer INS4 may be directly disposed on the second bank BNK2 and the color conversion layer CCL. The fourth insulating layer INS4 may be formed of an inorganic layer (or an inorganic insulating layer) including inorganic material. The fourth insulating layer INS4 may include at least one of silicon nitride ($SiN_x$), silicon oxide ($SiO_x$), silicon oxynitride ($SiO_xN_y$), or at least one of metal oxides such as aluminum oxide ($AlO_x$). The fourth insulating layer INS4 may cover the entirety of the second bank BNK2 and the color conversion layer CCL and thus prevent external water or moisture from being drawn into the display element layer DPL.

The fourth insulating layer INS4 may mitigate a step difference formed by components disposed thereunder and have a planar surface. For example, the fourth insulating layer INS4 may include an organic layer including organic material. The fourth including layer INS4 may be a common layer provided in common in the display area DA, but the present disclosure is not limited thereto.

A color filter layer CFL may be provided and/or formed on the fourth insulating layer INS4.

In embodiments of FIGS. 8 to 10, the color filter layer CFL may include color filters CF that correspond to respective colors of the first, second, and third pixels PXL1, PXL2, and PXL3. For example, the color filter layer CFL may include a first color filter CF1 disposed on the color conversion layer CCL of the first pixel PXL1, a second color filter CF2 disposed on the color conversion layer CCL of the second pixel PXL2, and a third color filter CF3 disposed on the color conversion layer CCL of the third pixel PXL3. In one or more embodiments, the first, second, and third color filters CF1, CF2, and CF3 may be disposed in the non-emission area NEMA and overlap each other, thus preventing optical interference between adjacent pixels PXL from occurring. The first, second, and third color filters CF1, CF2, and CF3 each may include color filter material that allows a specific color of light converted by the color conversion layer CCL to selectively pass therethrough. For example, the first color filter CF1 may be a red color filter. The second color filter CF2 may be a green color filter. The third color filter CF3 may be a blue color filter. The color filters CF may be provided on one surface of the fourth insulating layer INS4 and correspond to the color conversion layer CCL.

In one or more embodiments of FIG. 11, the color filter layer CFL may include a color filter CF and a light block pattern LBP. The color filter CF may be disposed in the emission area EMA of each of the first, second, and third pixels PXL1, PXL2, and PXL3, and provided and/or formed on the fourth insulating layer INS4 of the color conversion layer CCL of the corresponding pixel PXL. The light block pattern LBP may be disposed in the non-emission area NEMA located around the emission area EMA, and provided and/or formed on the fourth insulating layer INS4 on the second bank BNK2 of the corresponding pixel PXL. The light block pattern LBP may be disposed on one surface of the fourth insulating layer INS4 at a position adjacent to the color filter CF. The light block pattern LBP may overlap the first and second banks BNK1 and BNK2. The light block pattern LBP may include light block material that prevent a light leakage defect in which light leaks between adjacent pixels PXL from occurring. For example, the light block pattern LBP may include a black matrix. The light block pattern LBP may prevent different colors of light emitted from respective adjacent pixels PXL from being mixed.

The encapsulation layer ENC may be provided and/or formed on the color filter layer CFL.

The encapsulation layer ENC may include a fifth insulating layer INS5. The fifth insulating layer INS5 may be an inorganic insulating layer including inorganic material or an organic insulating layer including organic material. The fifth insulating layer INS5 may cover the entirety of components disposed thereunder and prevent external water or moisture from being drawn into the color filter layer CFL and the display element layer DPL.

In the display device (or each of the first, second, and third pixels PXL1, PXL2, and PXL3) in accordance with the foregoing embodiment, the color conversion layer CCL and the color filter CF may be disposed on the light emitting element LD so that light having excellent color reproducibility can be emitted through the color conversion layer CCL and the color filter CF, whereby the light output efficiency may be enhanced.

In one or more embodiments, the fifth insulating layer INS5 may be formed of multiple layers. For example, the fifth insulating layer INS5 may be formed of at least two inorganic insulating layers, and at least one organic insulating layer interposed between the at least two inorganic insulating layers. Here, the constituent material and/or structure of the fifth insulating layer INS5 may be changed in various ways. In one or more embodiments, at least one overcoat layer, at least one filler layer, at least one upper substrate, and/or the like may be further disposed over the fifth insulating layer INS5.

Although in the foregoing embodiment the color conversion layer CCL has been described as being directly formed on the first pixel electrode PE1, the second pixel electrode PE2, and/or the intermediate electrode CTE, the present disclosure is not limited thereto. In one or more embodiments, the color conversion layer CCL may be formed on a separate substrate and coupled to the first pixel electrode PE1, the second pixel electrode PE2, and/or the intermediate electrode CTE by an adhesive layer or the like.

Figure 12:
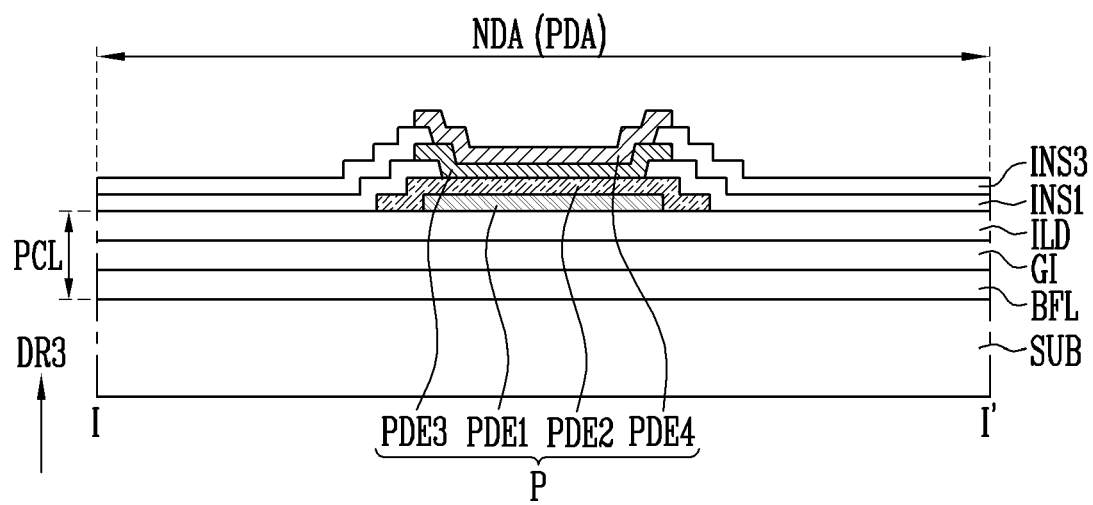
FIG. 12 is a schematic sectional view taken along the line I-I' of FIG. 3.

FIG. 12 is a schematic sectional view taken along the line I-I' of FIG. 3.

The following description with reference to FIG. 12 will be focused on differences from that of the foregoing embodiments to avoid redundant explanation. Components that are not separately explained in the following description of the embodiment of FIG. 12 comply with that of the foregoing embodiments. The same reference numeral will be used to designate the same component, and a similar reference numeral will be used to designate a similar component.

Referring to 3, 8, and 12, each of the pads P disposed in the pad area PDA of the non-display area NDA may include a first pad electrode PDE1, a second pad electrode PDE2, a third pad electrode PDE3, and a fourth pad electrode PDE4.

The first pad electrode PDE1 may be disposed on an interlayer insulating layer ILD. The interlayer insulating layer ILD may be the interlayer insulating layer ILD provided in the pixel circuit layer PCL described with reference to FIGS. 8 to 11. In one or more embodiments, the first pad electrode PDE1 may be formed through the same process as that of the source and drain electrodes SE and DE described with reference to FIGS. 8 to 11 and may be disposed on (or at) the same layer as that of the source and drain electrodes SE and DE, but the present disclosure is not limited thereto. The first pad electrode PDE1 may be formed of double layers stacked in a sequence of titanium (Ti)/copper (Cu), but the present disclosure is not limited thereto.

In the pad area PDA of at least the non-display area NDA, the passivation layer PSV provided in the pixel circuit layer PCL of the display area DA may be omitted.

The second pad electrode PDE2 may be directly disposed on the first pad electrode PDE1 and connected to the first pad electrode PDE1. In one or more embodiments, the second pad electrode PDE2 may be formed through the same process as that of the first and second alignment electrodes ALE1 and ALE2 of the display element layer DPL and provided on (or at) the same layer as that of the first and second alignment electrodes ALE1 and ALE2, but the present disclosure is not limited thereto.

A first insulating layer INS1 may be provided and/or formed on the second pad electrode PDE2 and the interlayer insulating layer ILD. The first insulating layer INS1 may be the first insulating layer INS1 described with reference to FIGS. 8 to 11. The first insulating layer INS1 may be partially open to expose a portion of the second pad electrode PDE2 in the pad area PDA.

The third pad electrode PDE3 may be provided and/or formed on the exposed second pad electrode PDE2. The third pad electrode PDE3 may be disposed on the second pad electrode PDE2 and connected to the second pad electrode PDE2. In accordance with one or more embodiments, the third pad electrode PDE2 may be formed through the same process as that of the intermediate electrode CTE of the display element layer DPL in the embodiment of FIG. 8 and provided on (or at) the same layer as that of the intermediate electrode CTE, but the present disclosure is not limited thereto.

A third insulating layer INS3 may be provided and/or formed on the third pad electrode PDE3. The third insulating layer INS3 may be the third insulating layer INS3 described with reference to FIG. 8. The third insulating layer INS3 may be partially open to expose a portion of the third pad electrode PDE3 in the pad area PDA.

The fourth pad electrode PDE4 may be provided and/or formed on the exposed third pad electrode PDE3. The fourth pad electrode PDE4 may be disposed on the third pad electrode PDE3 and connected to the third pad electrode PDE3. In accordance with one or more embodiments, the fourth pad electrode PDE4 may be formed through the same process as that of the first and second pixel electrodes PE1 and PE2 of the display element layer DPL in the embodiment of FIG. 8 and provided on (or at) the same layer as that of the first and second pixel electrodes PE1 and PE2, but the present disclosure is not limited thereto.

The fourth pad electrode PDE4 may be exposed to the outside and electrically connected to a driver (refer to "DIC" of FIG. 4) by a conductive adhesive or the like.

Although in the foregoing embodiment each pad P has been described as including the first pad electrode PDE1, the second pad electrode PDE2, the third pad electrode PDE3, and the fourth pad electrode PDE4 that are successively stacked, the present disclosure is not limited thereto. In one or more embodiments, each pad P may include at least one pad electrode from among the first, second, third, and fourth pad electrodes PDE1, PDE2, PDE3, and PDE4 and may be configured to be exposed to the outside.

Figure 13:
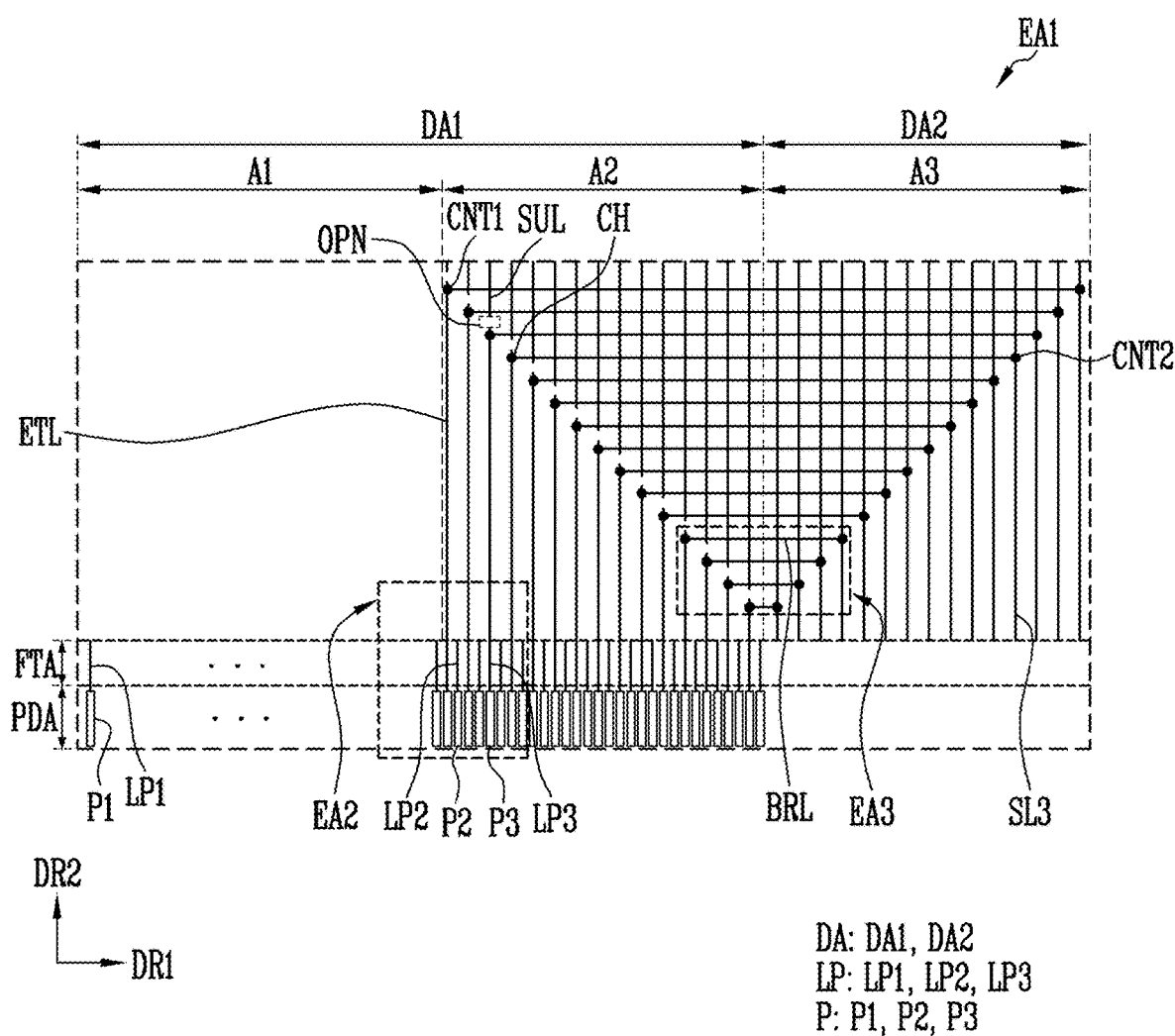
FIG. 13 is an enlarged schematic sectional view of an area EA1 of FIG. 3.

FIG. 13 is an enlarged schematic sectional view of an area EA1 of FIG. 3.

For the sake of description, in FIG. 13, illustration of the components disposed in the first area A1 is omitted, and area EA1 of FIG. 3 is schematically illustrated, based on an electrical connection relationship between the third pad P3 and the third signal line SL3 disposed in the third area A3.

For the convenience sake, in FIG. 13, only one contact hole is indicated by reference character CH, as a representative example of contact holes CH for connecting specific components in area EA1.

With regard to the embodiment of FIG. 13, the following description will be focused on differences from that of the foregoing embodiments, to avoid redundant explanation.

Referring to FIGS. 1 to 13, the display area DA of the display device DD may include a first area A1, a second area A2, and a third area A3. The non-display area NDA of the display device DD may include a pad area PDA and a fan-out area FTA.

The first area A1 and the second area A2 may be different areas of the first display area DA1 in which first and second signal lines (refer to "SL1" and SL2" of FIG. 7) that are directly supplied with signals from the pad part PDP are disposed. The first signal line SL1 may be electrically connected to the first pixel PXL1 and transmit a signal from the first pad P1 of the pad part PDP to the first pixel PXL1. The second signal line SL2 may be electrically connected to the second pixel PXL2 and transmit a signal from the second pad P2 of the pad part PDP to the second pixel PXL2.

The third area A3 may correspond to the second display area DA2 in which the third signal line SL3 configured to receive a signal from the pad part PDP through the extension line ETL disposed in the second area A2 and the bridge line BRL is disposed. The third signal line SL3 may be electrically connected to the third pad P3 of the pad part PDP through the bridge line BRL and the extension line ETL. The third signal line SL3 may be electrically connected to the third pixel PXL3 and transmit a signal from the third pad P3 to the third pixel PXL3.

In one or more embodiments, the extension line ETL may be disposed in the second area A2, extend in the second direction DR2, and may be electrically connected with the second line LP2 of the fan-out area FTA. The extension line ETL may be electrically connected with the bridge line BRL through the first contactor CNT1.

The bridge line BRL may be disposed over the second area A2 and the third area A3, extend in the first direction DR1, and may be electrically connected with the third signal line SL3 of the third area A3 through the second contactor CNT2.

A plurality of extension lines ETL and a plurality of bridge lines BRL may be provided.

One extension line ETL from among the plurality of extension lines ETL may be electrically connected with the corresponding bridge line BRL from among the plurality of bridge lines BRL through the first contactor CNT1. The corresponding bridge line BRL may be electrically connected with the third signal line SL3 through the second contactor CNT2. The first contactor CNT1 and the second contactor CNT2 may be disposed on the same row (or the same line) in the first direction DR1, in a plan view.

An auxiliary line SUL that is disposed on the same column as that of the extension line ETL may be disposed in the second area A2. The auxiliary line SUL may be spaced from the extension line ETL with an opening OPN formed therebetween, and may be electrically separated (or disconnected) from the extension line ETL.

In one or more embodiments, the third signal line SL3 may be electrically connected to the third pad P3 of the pad part PDP through the second contactor CNT2, the bridge line BRL, the first contactor CNT1, the extension line ETL, and the third line LP3. Hence, a signal may be transmitted, by the third signal line SL3, from the third pad P3 to the third pixel PXL3 that is disposed in the third area A3.

Figure 14:
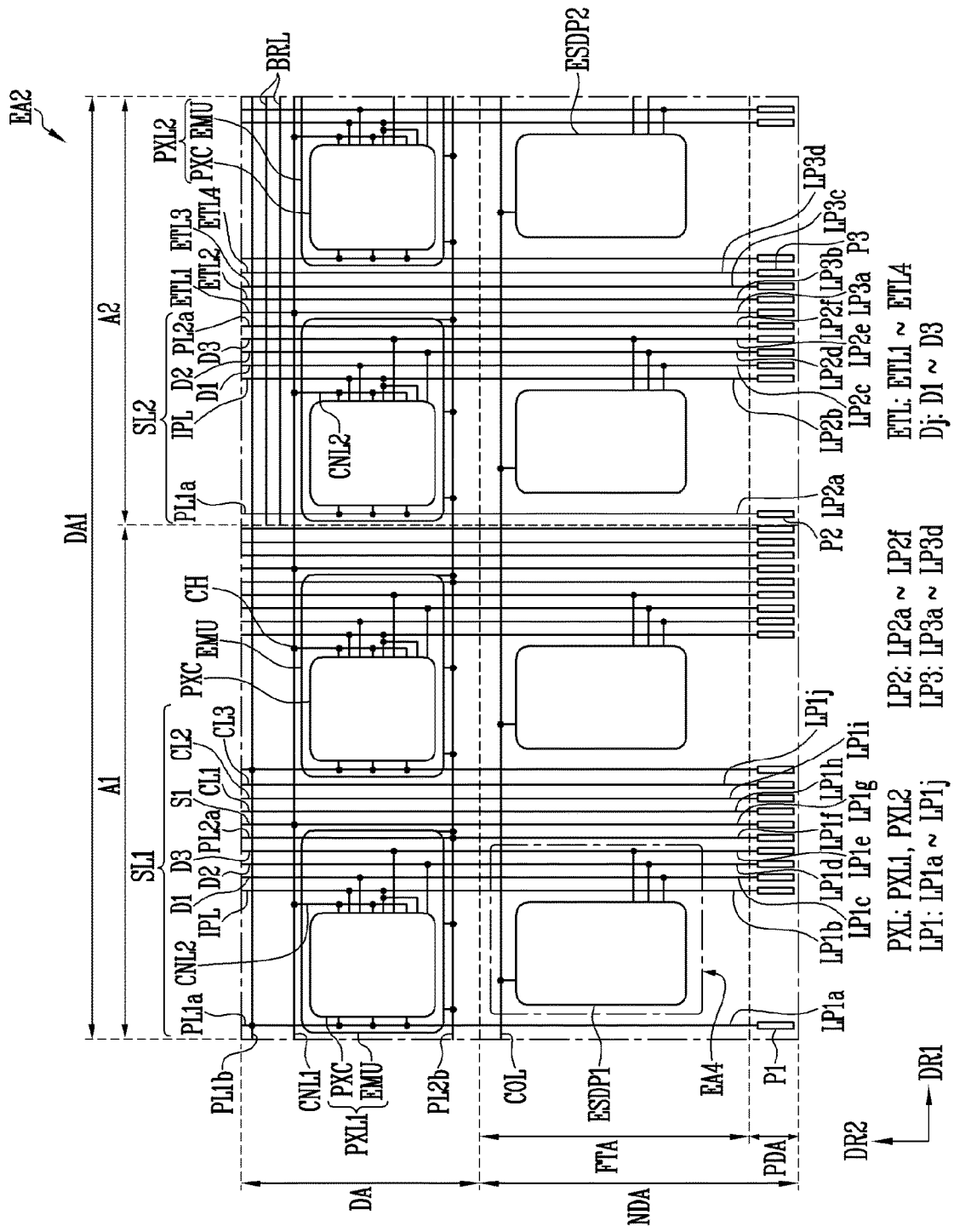
FIG. 14 is an enlarged schematic plan view of an area EA2 of FIG. 13.

FIG. 14 is an enlarged schematic plan view of an area EA2 of FIG. 13.

With regard to the embodiment of FIG. 14, the following description will be focused on differences from that of the foregoing embodiments, to avoid redundant explanation.

FIG. 14 schematically illustrates the structure of the display device DD, centered on the first area A1 and the second area A2 that are disposed adjacent to each other in the first display area DA1, and the non-display area NDA that corresponds to the first and second areas A1 and A2.

For the convenience sake, in FIG. 14, only one contact hole is indicated by reference character CH, as a representative example of contact holes CH for connecting specific components in area EA2.

Referring to FIGS. 1 to 14, the first display area DA1 may include a plurality of pixels PXL including a first pixel PXL1 and a second pixel PXL2, and signal lines that are electrically connected to the pixels PXL. For example, the first display area DA1 may include a first signal line SL1 that is electrically connected to the first pixel PXL1, and a second signal line SL2 that is electrically connected to the second pixel PXL2.

The first pixel PXL1 and the first signal line SL1 that is electrically connected to the first pixel PXL1 may be disposed in the first area A1 of the first display area DA1.

The first pixel PXL1 may include a pixel circuit PXC that is electrically connected with the first signal line SL1, and an emission part EMU that is electrically connected to the pixel circuit PXC.

The pixel circuit PXC and the emission part EMU may have components (or structures) equal or similar to that of the pixel circuit PXC and the emission part EMU described with reference to FIGS. 5 and 6, and therefore, further explanation thereof will be omitted.

The first signal line SL1 may be electrically connected to the first pad P1 disposed in the pad area PDA by the first line LP1 disposed in the fan-out area FTA. The first signal line SL1 may include a first vertical power line PL1a, a second vertical power line PL2b, an initialization power line IPL, a data line Dj, and a scan line S1.

The first vertical power line PL1a may be electrically connected to the corresponding first pad P1 disposed in the pad area PDA by the corresponding first line LP1, e.g., a 1a-th line LP1a. The first vertical power line PL1a may receive a voltage of the first driving power supply VDD from the first pad P1.

The first vertical power line PL1a may be electrically connected with a first horizontal power line PL1b, thus forming a mesh structure. The first vertical power line PL1a and the first horizontal power line PL1b may be disposed on different layers and may be electrically connected to each other through a corresponding contact hole CH. The first horizontal power line PL1b may extend in the first direction DR1 and may be provided in common in the first area A1, the second area A2, and the third area A3.

The first vertical power line PL1a may be electrically connected to the pixel circuit PXC through a corresponding contact hole CH. The first horizontal power line PL1b may be electrically connected to the emission part EMU.

The second vertical power line PL2a may be electrically connected to the first pad P1 disposed in the pad area PDA by the corresponding first line LP1, e.g., a 1f-th line LP1f. The second vertical power line PL2a may receive a voltage of the second driving power supply VSS from the first pad P1.

The second vertical power line PL2a may be electrically connected with a second horizontal power line PL2b, thus forming a mesh structure. The second vertical power line PL2a and the second horizontal power line PL2b may be disposed on different layers and may be electrically connected to each other through a corresponding contact hole CH. The second horizontal power line PL2b may extend in the first direction DR1 and may be provided in common in the first area A1, the second area A2, and the third area A3.

The second horizontal power line PL2b may be electrically connected to the emission part EMU through a corresponding contact hole CH.

The scan line S1 may extend in the second direction DR2, and may be electrically connected to the corresponding first pad P1 by the corresponding first line LP1, e.g., a 1g-th line LP1g. The scan line S1 may receive a scan signal from the first pad P1. The scan line S1 may be electrically connected with a first connection line CNL1 through a corresponding contact hole CH. The first connection line CNL1 may be the first connection line CNL1 described with reference to FIG. 7.

The first connection line CNL1 may extend in the first direction DR1, and may be electrically connected with a second connection line CNL2 through a corresponding contact hole CH. The first connection line CNL1 may be electrically connected to the pixel circuit PXC of the first pixel PXL by the second connection line CNL2.

The initialization power line IPL may extend in the second direction DR2, and may be electrically connected to the corresponding first pad P1 by the corresponding first line LP1, e.g., a 1b-th line LP1b. The initialization power line IPL may receive a voltage of the initialization power supply from the first pad P1. The initialization power line IPL may be electrically connected to the pixel circuit PXC through a corresponding contact hole CH.

The data line Dj may include a first data line D1, a second data line D2, and a third data line D3 that are spaced from each other in the first direction DR1, and extend in the second direction DR2.

The first data line D1 may be electrically connected to the corresponding first pad P1 by the corresponding first line LP1, e.g., a 1c-th line LP1c. The first data line D1 may receive a corresponding data signal from the first pad P1. The first data line D1 may be electrically connected to the pixel circuit PXC through a corresponding contact hole CH and transmit the data signal to the pixel circuit PXC.

The second data line D2 may be electrically connected to the corresponding first pad P1 by the corresponding first line LP1, e.g., a 1d-th line LP1d. The second data line D2 may receive a corresponding data signal from the first pad P1. The second data line D2 may be electrically connected to the pixel circuit PXC through a corresponding contact hole CH and transmit the data signal to the pixel circuit PXC.

The third data line D3 may be electrically connected to the corresponding first pad P1 by the corresponding first line LP1, e.g., a 1e-th line LP1e. The third data line D3 may receive a corresponding data signal from the first pad P1. The third data line D3 may be electrically connected to the pixel circuit PXC through a corresponding contact hole CH and transmit the data signal to the pixel circuit PXC.

The first signal line SL1 may include at least one or more additional conductive lines CL1, CL2, and CL3.

The additional conductive lines CL1, CL2, and CL3 may include a first additional conductive line CL1, a second additional conductive line CL2, and a third additional conductive line CL3 that are spaced from each other in the first direction DR1 and extend in the second direction DR2.

The first additional conductive line CL1 may be electrically connected to the corresponding first pad P1 by the corresponding first line LP1, e.g., a 1h-th line LP1h. The second additional conductive line CL2 may be electrically connected to the corresponding first pad P1 by the corresponding first line LP1, e.g., a 1i-th line LP1i. The third additional conductive line CL3 may be electrically connected to the corresponding first pad P1 by the corresponding first line LP1, e.g., a 1j-th line LP1j.

The first, second, and the third additional conductive lines CL1, CL2, and CL3 each may receive a voltage of the first driving power supply VDD or a voltage of the second driving power supply VSS from the corresponding first pad P1. The first, second, and third additional conductive lines CL1, CL2, and CL3 each may be electrically connected with the first horizontal power line PL1b and/or the second horizontal power line PL2b and may be used as a power line along with the first vertical power line PL1a and the second vertical power line PL2a. Hence, a drop in power voltage may be reduced or minimized, so that the quality of the display device DD can be improved.

The second pixel PXL2 and the second signal line SL2 that is electrically connected to the second pixel PXL2 may be disposed in the second area A2 of the first display area DA1.

The second pixel PXL2 may include a pixel circuit PXC that is electrically connected with the second signal line SL2, and an emission part EMU that is electrically connected to the pixel circuit PXC.

The pixel circuit PXC and the emission part EMU may have components (or structures) equal or similar to that of the pixel circuit PXC and the emission part EMU described with reference to FIGS. 5 and 6.

The second signal line SL2 may be electrically connected to the second pad P2 disposed in the pad area PDA by the second line LP2 disposed in the fan-out area FTA. The second signal line SL2 may include a first vertical power line PL1a, a second vertical power line PL2a, an initialization power line IPL, and a data line Dj that are spaced from each other in the first direction DR1 and extend in the second direction DR2.

The first vertical power line PL1a may be electrically connected to the corresponding second pad P2 disposed in the pad area PDA by the corresponding second line LP2, e.g., a 2a-th line LP2a. The first vertical power line PL1a may receive a voltage of the first driving power supply VDD from the second pad P2. The first vertical power line PL1a may be electrically connected to the pixel circuit PXC of the second pixel PXL2 through a corresponding contact hole CH.

The second vertical power line PL2a may be electrically connected to the corresponding second pad P2 disposed in the pad area PDA by the corresponding second line LP2, e.g., a 2f-th line LP2f. The second vertical power line PL2a may receive a voltage of the second driving power supply VSS from the second pad P2. The second vertical power line PL2a may be electrically connected to the emission part EMU of the second pixel PXL2 through a corresponding contact hole CH.

The initialization power line IPL may be electrically connected to the corresponding second pad P2 disposed in the pad area PDA by the corresponding second line LP2, e.g., a 2b-th line LP2b. The initialization power line IPL may receive a voltage of the initialization power supply from the second pad P2. The initialization power line IPL may be electrically connected to the pixel circuit PXC of the second pixel PXL2 through a corresponding contact hole CH.

The data line Dj may include a first data line D1, a second data line D2, and a third data line D3.

The first data line D1 may be electrically connected to the corresponding second pad P2 by the corresponding second line LP2, e.g., a 2c-th line LP2c. The first data line D1 may receive a corresponding data signal from the second pad P2. The first data line D1 may be electrically connected to the pixel circuit PXC through a corresponding contact hole CH and transmit the data signal to the pixel circuit PXC.

The second data line D2 may be electrically connected to the corresponding second pad P2 by the corresponding second line LP2, e.g., a 2d-th line LP2d. The second data line D2 may receive a corresponding data signal from the second pad P2. The second data line D2 may be electrically connected to the pixel circuit PXC through a corresponding contact hole CH and transmit the data signal to the pixel circuit PXC.

The third data line D3 may be electrically connected to the corresponding second pad P2 by the corresponding second line LP2, e.g., a 2e-th line LP2e. The third data line D3 may receive a corresponding data signal from the second pad P2. The third data line D3 may be electrically connected to the pixel circuit PXC through a corresponding contact hole CH and transmit the data signal to the pixel circuit PXC.

The second pixel PXL2 may include a second connection line CNL2 that is electrically connected, through a corresponding contact hole CH, with the first connection line CNL1 that is provided in common in the first and second areas A1 and A2. The second connection line CNL2 may receive a scan signal and/or a control signal from the first connection line CNL1. The second connection line CNL2 may be electrically connected to the pixel circuit PXC of the second pixel PXL2 through a corresponding contact hole CH.

In one or more embodiments, the extension line ETL that is electrically connected to the third pad P3 disposed in the pad area PDA by the third line LP3 disposed in the fan-out area FTA may be disposed in the second area A2.

The extension line ETL may be disposed adjacent to the second signal line SL2 and electrically separated from the second signal line SL2. The extension line ETL may include a first extension line ETL1, a second extension line ETL2, a third extension line ETL3, and a fourth extension line ETL4 that are spaced from each other in the first direction DR1 and extend in the second direction DR2.

The first extension line ETL1 may be electrically connected to the corresponding third pad P3 disposed in the pad area PDA by the corresponding third line LP3, e.g., a 3a-th line LP3a. The first extension line ETL1 may be electrically connected with the corresponding bridge line BRL through the corresponding first contactor CNT1.

The second extension line ETL2 may be electrically connected to the corresponding third pad P3 disposed in the pad area PDA by the corresponding third line LP3, e.g., a 3b-th line LP3b. The second extension line ETL2 may be electrically connected with the corresponding bridge line BRL through the corresponding first contactor CNT1.

The third extension line ETL3 may be electrically connected to the corresponding third pad P3 disposed in the pad area PDA by the corresponding third line LP3, e.g., a 3c-th line LP3c. The third extension line ETL3 may be electrically connected with the corresponding bridge line BRL through the corresponding first contactor CNT1.

The fourth extension line ETL4 may be electrically connected to the corresponding third pad P3 disposed in the pad area PDA by the corresponding third line LP3, e.g., a 3d-th line LP3d. The fourth extension line ETL4 may be electrically connected with the corresponding bridge line BRL through the corresponding first contactor CNT1.

The bridge line BRL may extend in the first direction DR1 in the second area A2, and comprise a plurality of bridge lines BRL. The bridge line BRL may be provided in the second area A2 and the third area A3 adjacent to the second area A2. The bridge line BRL may be provided in common in the second area A2 and the third area A3. In one or more embodiments, the bridge line BRL may also be provided in the first area A1.

The first to third lines LP1, LP2, and LP3 and the first to third pads P1, P2, and P3 may be disposed in one area of the non-display area NDA that encloses the perimeter of the first display area DA1 (or corresponds to the first display area DA1) and the second display area DA2.

The first line LP1, the second line LP2, and the third line LP3 may be disposed in the fan-out area FTA of the non-display area NDA. The first pad P1, the second pad P2, and the third pad P3 may be disposed in the pad area PDA of the non-display area NDA.

The first line LP1 may include 1a-th to 1j-th lines LP1a to LP1j that are electrically connected to the corresponding first signal lines SL1. The second line LP2 may include 2a-th to 2f-th lines LP2a to LP2f that are electrically connected to the corresponding second signal lines SL2. The third line LP3 may include 3a-th to 3d-th lines LP3a to LP3d that are electrically connected to the corresponding extension lines ETL. The first, second, and third lines LP1, LP2, and LP3 may be disposed in only one area (e.g., a central area of the fan-out area FTA) corresponding to the first display area DA1 in the fan-out area FTA, and may not be disposed in one area (e.g., a peripheral area of the fan-out area FTA) corresponding to the second display area DA2 in the fan-out area FTA.

In one or more embodiments, the number of first lines LP1 that are electrically connected to one first pixel PXL1 and are disposed in the fan-out area FTA that corresponds to the first area A1 may be ten, including the 1a-th to 1j-th lines LP1a to LP1j. The number of second lines LP2 that is electrically connected to one second pixel PXL2 and is disposed in the fan-out area FTA that corresponds to the second area A2 may be six, including the 2a-th to 2f-th lines LP2a to LP2f. The number of third lines LP3 that is electrically connected to one third pixel PXL3 and is disposed in the fan-out area FTA that corresponds to the second area A2 may be four, including the 3a-th to 3d-th lines LP3a to LP3d. The number of first pads P1 that are electrically connected with the first lines LP1 may be ten. The number of second pads P2 that are electrically connected with the second lines LP2 may be six. The number of third pads P3 that are electrically connected with the third lines LP3 may be four. The number of first pads P1 may be the same as the sum of the number of second pads P2 and the number of third pads P3.

A first antistatic part ESDP1 may be disposed in one area of the fan-out area FTA that corresponds to the first area A1. A second antistatic part ESDP2 may be disposed in one area of the fan-out area FTA that corresponds to the second area A2.

The first antistatic part ESDP1 may be electrically connected to the corresponding first line LP1 and a common line COL in the fan-out area FTA. The first antistatic part ESDP1 may be connected between the first line LP1 and the common line COL and disperse, to the common line COL, a pulse caused by static electricity drawn into the data line D1, D2, and D3 of the first area A1. The first antistatic part ESDP1 may be electrically connected to each of the 1c-th line LP1c, the 1d-th line LD1d, and the 1e-th line LP1e through a corresponding contact hole CH.

The second antistatic part ESDP2 may be electrically connected to the corresponding second line LP2 and a common line COL in the fan-out area FTA. The second antistatic part ESDP2 may be connected between the second line LP2 and the common line COL and disperse, to the common line COL, a pulse caused by static electricity drawn into the data line D1, D2, and D3 of the second area A2. The second antistatic part ESDP2 may be electrically connected to each of the 2c-th line LP2c, the 2d-th line LP2d, and the 2e-th line LP2e through a corresponding contact hole CH.

The common line COL may be provided in common in the fan-out area FTA that corresponds to the first area A1, and the fan-out area FTA that corresponds to the second area A2. The common line COL may extend in the first direction DR1. The common line COL may be electrically connected to each of the first and second antistatic parts ESDP1 and ESDP2 through a corresponding contact hole CH.

The first antistatic part ESDP1 and the second antistatic part ESDP2 may have substantially the same structure or similar structures. Hereinafter, the first antistatic part ESDP1 will be described as a representative example with reference to FIGS. 15 and 16.

Figure 15:
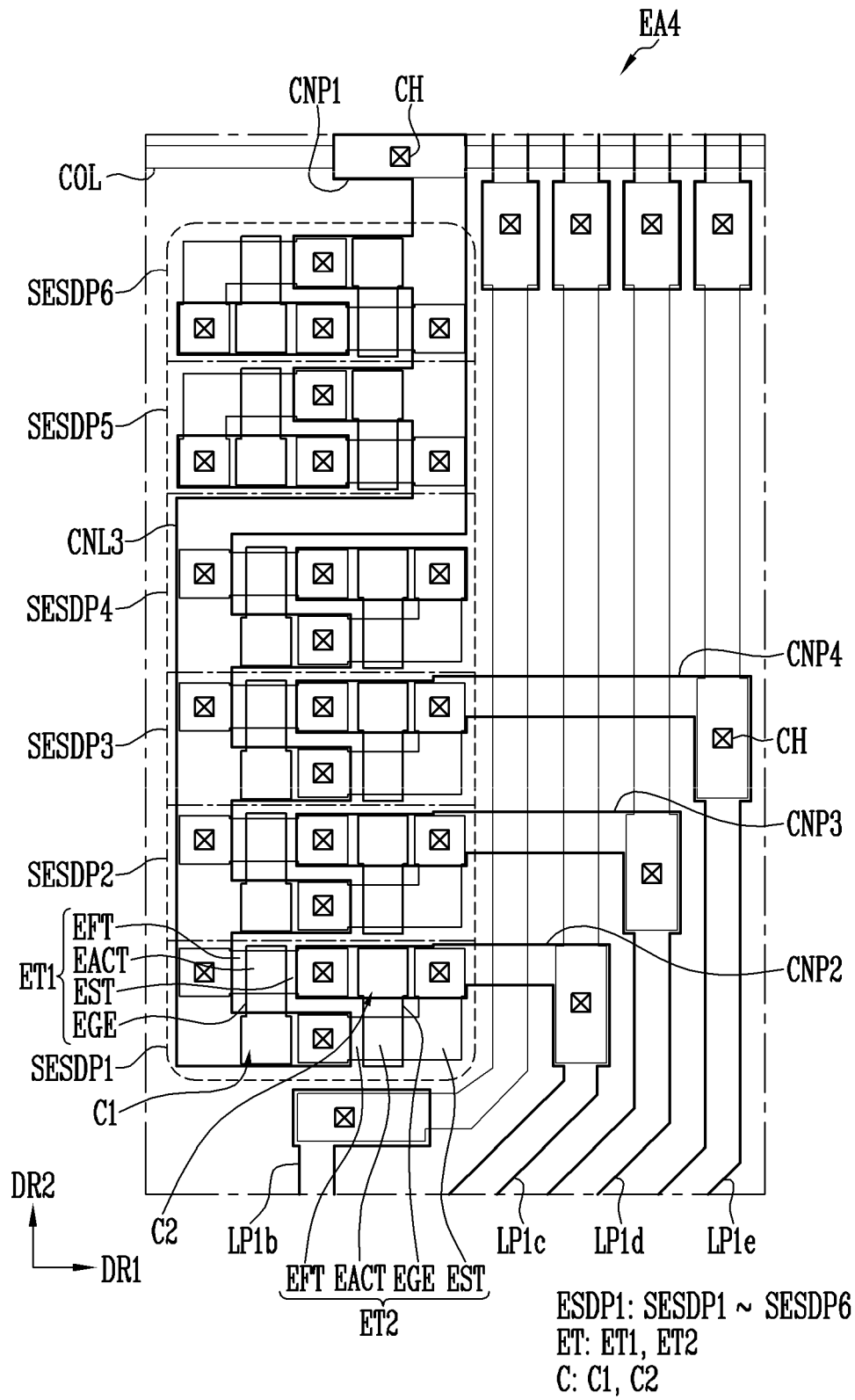
FIG. 15 is an enlarged schematic plan view of an area EA4 of FIG. 14.
Figure 16:
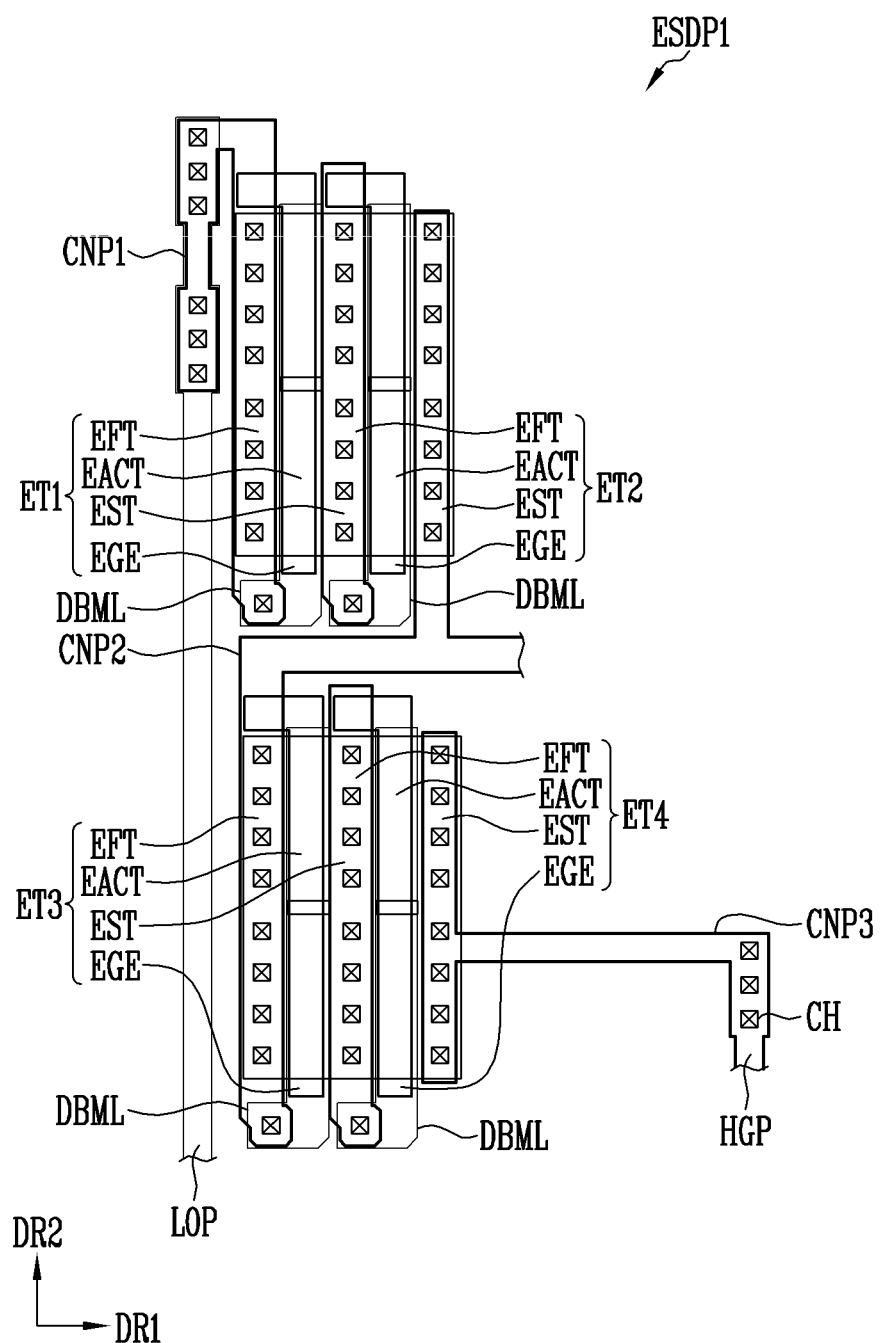
FIG. 16 is a schematic plan view illustrating an embodiment of a first antistatic part of FIG. 15.

FIG. 15 is an enlarged schematic plan view of area EA4 of FIG. 14. FIG. 16 is a schematic plan view illustrating an embodiment of the first antistatic part ESDP1 of FIG. 15.

For the convenience sake, in FIGS. 15 and 16, only one contact hole is indicated by reference character CH, as a representative example of contact holes CH for connecting specific components in area EA4.

Referring to FIGS. 1 to 16, the first antistatic part ESDP1 may include at least one sub-antistatic part. For example, the first antistatic part ESDP1 may include first to sixth sub-antistatic parts SESDP1, SESDP2, SESDP3, SESDP4, SESDP5, and SESDP6, but the present disclosure is not limited thereto. The first antistatic part ESDP1 may be designed to have a low impedance in a certain high-voltage area so that the first antistatic part ESDP1 allows overcurrent to be discharged or can be self-destructed, thus preventing inflow of static electricity, and may be designed to have a high impedance under normal driving conditions and thus prevent an influence on a signal to be supplied through the first line LP1.

The first to sixth sub-antistatic parts SESDP1, SESDP2, SESDP3, SESDP4, SESDP5, and SESDP6 may be electrically connected with the common line COL by the third connection line CNL3. The third connection line CNL3 may be electrically connected with the common line COL through a corresponding contact hole CH. Furthermore, the third connection line CNL3 may be electrically connected to each of the first to sixth sub-antistatic parts SESDP1, SESDP2, SESDP3, SESDP4, SESDP5, and SESDP6 through a corresponding contact hole CH.

The first to sixth sub-antistatic parts SESDP1, SESDP2, SESDP3, SESDP4, SESDP5, and SESDP6 may be disposed between the common line COL and the first line LP1 and electrically connected to each other.

The first sub-antistatic part SESDP1 may be electrically connected to the second sub-antistatic part SESDP2 and the 1c-th line LP1c. The first sub-antistatic part SESDP1 may be electrically connected to a second connection pattern CNP2 through a corresponding contact hole CH. The second connection pattern CNP2 may be electrically connected with the 1c-th line LP1c through a corresponding contact hole CH. Furthermore, the first sub-antistatic part SESDP1 may be electrically connected to the second sub-antistatic part SESDP2 through a corresponding contact hole CH.

The second sub-antistatic part SESDP2 may be electrically connected to the third sub-antistatic part SESDP3 and the 1d-th line LP1d. The second sub-antistatic part SESDP2 may be electrically connected to a third connection pattern CNP3 through a corresponding contact hole CH. The third connection pattern CNP3 may be electrically connected with the 1d-th line LP1d through a corresponding contact hole CH. Furthermore, the second sub-antistatic part SESDP2 may be electrically connected to the third sub-antistatic part SESDP3 through a corresponding contact hole CH.

The third sub-antistatic part SESDP3 may be electrically connected to the fourth sub-antistatic part SESDP4 and the 1e-th line LP1e. The third sub-antistatic part SESDP3 may be electrically connected to a fourth connection pattern CNP4 through a corresponding contact hole CH. The fourth connection pattern CNP4 may be electrically connected with the 1e-th line LP1e through a corresponding contact hole CH. Furthermore, the third sub-antistatic part SESDP3 may be electrically connected to the fourth sub-antistatic part SESDP4 through a corresponding contact hole CH.

The fourth sub-antistatic part SESDP4 may be electrically connected to the fifth sub-antistatic part SESDP5 and the third sub-antistatic part SESDP3.

The fifth sub-antistatic part SESDP5 may be electrically connected to the sixth sub-antistatic part SESDP6 and the fourth sub-antistatic part SESDP4.

The sixth sub-antistatic part SESDP6 may be electrically connected to the common line COL and the fifth sub-antistatic part SESDP5. The sixth sub-antistatic part SESDP6 may be electrically connected to a first connection pattern CNP1 through a corresponding contact hole CH. The first connection pattern CNP1 may be electrically connected with the common line COL through a corresponding contact hole CH. Furthermore, the sixth sub-antistatic part SESDP6 may be electrically connected to the fifth sub-antistatic part SESDP5 through a corresponding contact hole CH.

The first to sixth sub-antistatic parts SESDP1, SESDP2, SESDP3, SESDP4, SESDP5, and SESDP6 each may include a discharge transistor ET and capacitors C1 and C2 that have an interconnection relationship with the common line COL and the corresponding first line LP1. Because the first to sixth sub-antistatic parts SESDP1, SESDP2, SESDP3, SESDP4, SESDP5, and SESDP6 have substantially the same configuration, the configuration of the first sub-antistatic part SESDP1 will be described as a representative example.

The discharge transistor ET of the first sub-antistatic part SESDP1 may include a first discharge transistor ET1 and a second discharge transistor ET2 that are electrically connected to each other. Each of the first and second discharge transistors ET1 and ET2 may include a gate electrode EGE, an active pattern EACT, a first terminal EFT, and a second terminal EST.

The capacitors C of the first sub-antistatic part SESDP1 may include a first capacitor C1 and a second capacitor C2. Each of the first and second capacitors C1 and C2 may include a lower electrode and an upper electrode that overlap each other. The lower electrode of the first capacitor C1 may be integrally formed with a gate electrode EGE of the first discharge transistor ET1. The upper electrode of the first capacitor C1 may be integrally formed with the third connection line CNL3. The lower electrode of the second capacitor C2 may be integrally formed with a gate electrode EGE of the second discharge transistor ET2. The upper electrode of the second capacitor C2 may be integrally formed with the second connection pattern CNP2.

Although in the foregoing embodiment the first antistatic part ESDP1 is connected between the common line COL and the corresponding 1c-th line LP1c and configured to disperse, to the common line COL, a pulse caused by static electricity drawn into the data line D1, D2, and D3 of the first area A1, the present disclosure is not limited thereto. In one or more embodiments, as illustrated in FIG. 16, the first antistatic part ESDP1 may be configured to include a plurality of discharge transistors connected in series between a low voltage pad LOP and a high voltage pad HGP. A gate low voltage may be applied to the low voltage pad LOP. A gate high voltage may be applied to the high voltage pad HGP. The first antistatic part ESDP1 may block noise, e.g., static electricity, between the gate low voltage and the gate high voltage.

In one or more embodiments of FIG. 16, the first antistatic part ESDP1 may include first to fourth discharge transistors ET1, ET2, ET3, and ET4 that are connected in series between the low voltage pad LOP and the high voltage pad HGP. Each of the first to fourth discharge transistors ET1, ET2, ET3, and ET4 may include a gate electrode EGE, an active pattern EACT, a first terminal EFT, and a second terminal EST. Furthermore, each of the first to fourth discharge transistors ET1, ET2, ET3, and ET4 may include a dummy bottom line DBML that overlaps the gate electrode EGE.

The first discharge transistor ET1 may be electrically connected to the low voltage pad LOP and the second discharge transistor ET2. The first discharge transistor ET1 may be electrically connected to the first connection pattern CNP1 through a corresponding contact hole CH. The first connection pattern CNP1 may be electrically connected to the low voltage pad LOP through a corresponding contact hole CH. Furthermore, the first discharge transistor ET1 may be electrically connected to the second discharge transistor ET2 through a corresponding contact hole CH.

The second discharge transistor ET2 may be electrically connected to the first discharge transistor ET1 and the second connection pattern CNP2. The second discharge transistor ET2 may be electrically connected to the first discharge transistor ET1 through a corresponding contact hole CH. Furthermore, the second discharge transistor ET2 may be electrically connected to the second connection pattern CNP2 through a corresponding contact hole CH. The second connection pattern CNP2 may be electrically connected with the third discharge transistor ET3 through a corresponding contact hole CH. The second connection pattern CNP2 may be integrally formed with a line to which a clock signal is applied.

The third discharge transistor ET3 may be electrically connected to the second connection pattern CNP2 and the fourth discharge transistor ET4. The third discharge transistor ET3 may be electrically connected to the second connection pattern CNP2 through a corresponding contact hole CH. Furthermore, the third discharge transistor ET3 may be electrically connected to the fourth discharge transistor ET4 through a corresponding contact hole CH.

The fourth discharge transistor ET4 may be electrically connected to the third discharge transistor ET3 and the third connection pattern CNP3. The fourth discharge transistor ET4 may be electrically connected to the third discharge transistor ET3 through a corresponding contact hole CH. The third connection pattern CNP3 may be electrically connected to the high voltage pad HGP through a corresponding contact hole CH.

The first antistatic part ESDP1 including the first to fourth discharge transistors ET1, ET2, ET3, and ET4 may discharge static electricity drawn through the second connection pattern CNP2 in the fan-out area FTA that corresponds to the first area A1. The first antistatic part ESDP1 may be disposed adjacent to the first line LP1 in the fan-out area FTA. In other words, the first antistatic part ESDP1 and the first line LP1 may be disposed in the fan-out area FTA. Because the first antistatic part ESDP1 and the first line LP1 are disposed in the fan-out area FTA, dead space in the non-display area NDA may be reduced.

The second antistatic part ESDP2 disposed in the fan-out area FTA that corresponds to the second area A2 may be disposed adjacent to the second line LP2. In other words, the second antistatic part ESDP2 and the second line LP2 may be disposed in the fan-out area FTA. Because the second antistatic part ESDP2 and the second line LP2 are disposed in the fan-out area FTA, dead space in the non-display area NDA may be reduced.

Figure 17:
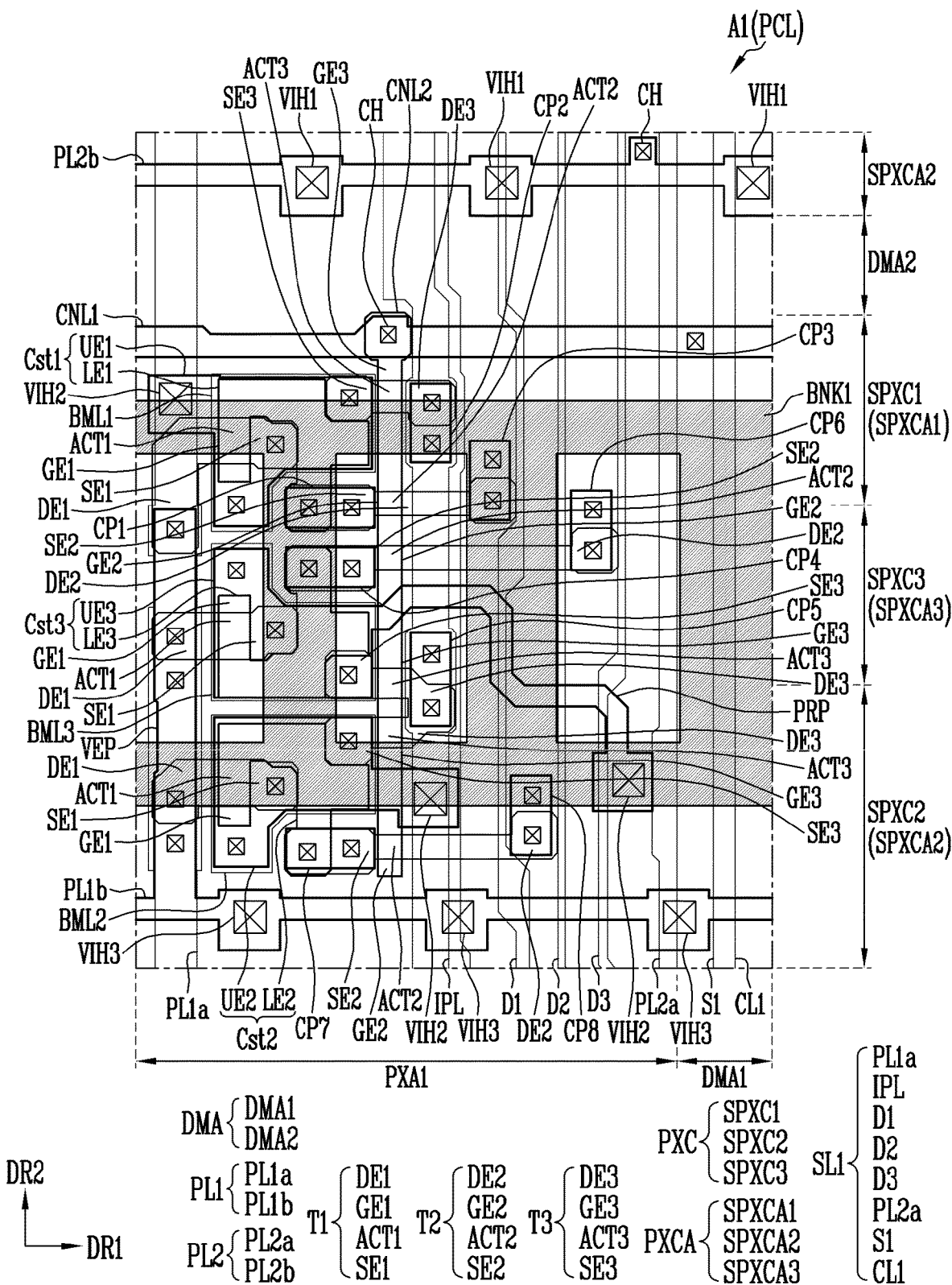
FIG. 17 is a plan view schematically illustrating a pixel circuit layer of a first area in accordance with one or more embodiments.
Figure 18:
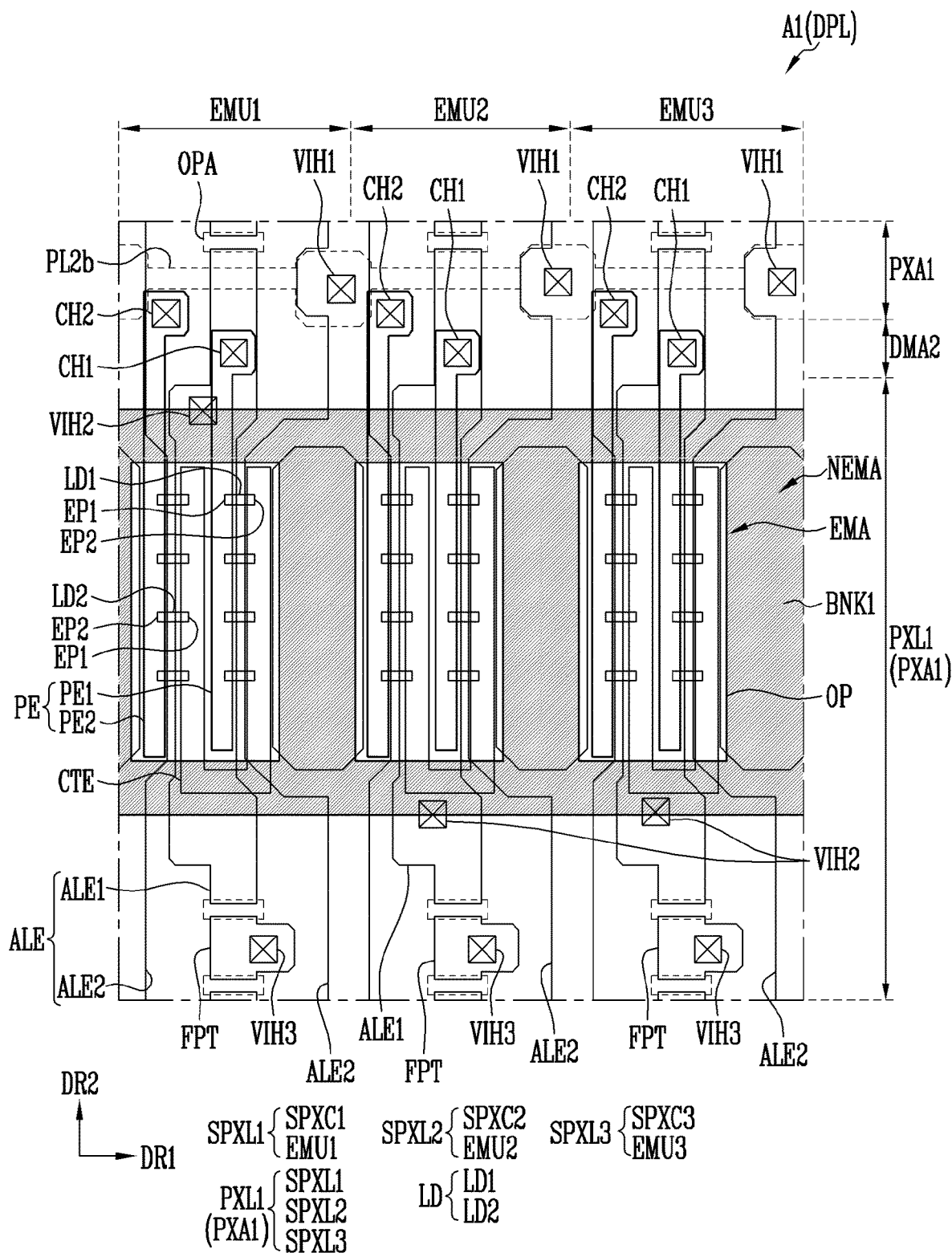
FIG. 18 is a plan view schematically illustrating a display element layer of the first area in accordance with one or more embodiments.

FIG. 17 is a plan view schematically illustrating the pixel circuit layer PCL of the first area A1 in accordance with one or more embodiments. FIG. 18 is a plan view schematically illustrating the display element layer DPL of the first area A1 in accordance with an embodiment.

For example, FIG. 17 schematically illustrates an embodiment of the structure of the pixel circuit layer PCL, centered on the first area A1 in which the first pixel PXL1 of FIG. 14 is disposed. Furthermore, FIG. 18 schematically illustrates an embodiment of the structure of the display element layer DPL, centered on the first area A1 in which the first pixel PXL1 is disposed.

In the following embodiment, not only the components included in the first pixel PXL1 illustrated in FIGS. 17 and 18 but also an area in which the components are provided (or located) may be embraced in the definition of the term "first pixel PXL1".

For the convenience sake, in FIGS. 17 and 18, only one contact hole is indicated by reference character CH, as a representative example of contact holes CH for connecting specific components in the pixel circuit layer PCL in the first area A1.

The description of the embodiment of FIGS. 17 and 18 will be focused on differences from the above-mentioned embodiments so as to avoid redundant description.

Referring to FIGS. 1 to 18, the first area A1 may include a first pixel area PXA1 in which each first pixel PXL1 is provided. The first area A1 may include a dummy area DMA provided in a perimeter of the first pixel area PXA1 and/or a portion of the first pixel area PXA1. For example, a first dummy area DMA1 may be provided on a left side and/or a right side of each of the first pixel areas PXA1. A second dummy area DMA2 may be provided on an upper side and a lower side of each of the first pixel areas PXA1.

The first dummy area DMA1 may be a line area, which is adjacent to the first pixel area PXA1, and in which some of the first signal lines SL1 extending in the second direction DR2 are disposed. For instance, the scan line S1, and the first, second, and third additional conductive lines CL1, CL2, and CL3 may be disposed in the first dummy area DMA1. Although in an embodiment four first signal lines SL1 may be disposed in the first dummy area DMA1, the number of first signal lines SL1 disposed in the first dummy area DMA1 is not limited thereto.

The second dummy area DMA2 may be a line area in which extra lines extending in the first direction DR1 are disposed. Although in an embodiment of FIG. 17 there is illustrated that the extra lines are not disposed in the second dummy area DMA2, the present disclosure is not limited thereto. In one or more embodiments, in the second dummy area DMA2, the bridge lines BRL that are provided in common in the second and third areas A2 and A3 may be disposed.

The first pixel PXL1 may include a first sub-pixel SPXL1, a second sub-pixel SPXL2, and a third sub-pixel SPXL3. The first sub-pixel SPXL1 may include a first pixel circuit SPXC1 and a first emission part EMU1. The second sub-pixel SPXL2 may include a second pixel circuit SPXC2 and a second emission part EMU2. The third sub-pixel SPXL3 may include a third pixel circuit SPXC3 and a third emission part EMU3.

In the first pixel area PXA1, the pixel circuit layer PCL may include a first pixel circuit SPXC1 disposed in the first circuit area SPXCA1, a second pixel circuit SPXC2 disposed in the second circuit area SPXCA2, and a third pixel circuit SPXC3 disposed in the third circuit area SPXCA3. Each of the first to third pixel circuits SPXC1, SPXC2, and SPXC3 may correspond to the pixel circuit PXC described with reference to FIGS. 5 and 6.

The pixel circuit layer PCL may include a first signal line SL1 that is disposed on the substrate SUB and connected to the first pixel PXL1. The first signal line SL1 may be electrically connected to the first pad P1 disposed in the pad area PDA by the first line LP1 disposed in the fan-out area FTA. For example, the first signal line SL1 may include a first vertical power line PL1$a$, an initialization power line IPL, a first data line D1, a second data line D2, a third data line D3, a second vertical power line PL2$a$, a scan line S1, a first additional conductive line CL1, and the like.

The first vertical power line PL1$a$, the initialization power line IPL, the first data line D1, the second data line D2, the third data line D3, the second vertical power line PL2$a$, the scan line S1, and the first additional conductive line CL1 each may be disposed between the substrate SUB (refer to FIGS. 8 to 11) and the buffer layer BFL (refer to FIGS. 8 to 11). For example, the first vertical power line PL1*a*, the initialization power line IPL, the first data line D1, the second data line D2, the third data line D3, the second vertical power line PL2*a*, the scan line S1, and the first additional conductive line CL1 may be formed through the same process as that of the bottom metal pattern BML described with reference to FIGS. 8 to 11 and disposed on (or at) the same layer that of the bottom metal pattern BML.

The first vertical power line PL1*a*, the initialization power line IPL, the first data line D1, the second data line D2, the third data line D3, and the second vertical power line PL2*a* may be disposed in a pixel circuit area PXCA of the first pixel PXL1. The scan line S1 and the first additional conductive line CL1 may be disposed in the first dummy area DMA1.

The first vertical power line PL1*a* may be electrically connected with the first horizontal power line PL1*b* through a corresponding contact hole CH and form the first power line PL1. The first vertical power line PL1*a* and the first horizontal power line PL1*b* that are electrically connected to each other may form a mesh structure. The first horizontal power line PL1*b* may be disposed on the interlayer insulating layer ILD (refer to FIGS. 8 to 11), and include a vertical line VEP that overlaps the first vertical power line PL1*a*. The vertical line VEP may extend in the second direction DR2 and overlap the first vertical power line PL1*a*, and be electrically connected with the first vertical power line PL1*a* through a corresponding contact hole CH. The voltage of the first driving power supply VDD may be applied to the first vertical power line PL1*a* and the first horizontal power line PL1*b*.

The second vertical power line PL2*a* may be electrically connected with the second horizontal power line PL2*b* through a corresponding contact hole CH and form the second power line PL2. The second vertical power line PL2*a* and the second horizontal power line PL2*b* that are electrically connected to each other may form a mesh structure. The second horizontal power line PL2*b* and the first horizontal power line PL1*b* may be formed through the same process and disposed on (or at) the same layer, and have the same material. The voltage of the second driving power supply VSS may be applied to the second vertical power line PL2*a* and the second horizontal power line PL2*b*.

The first vertical power line PL1*a*, the initialization power line IPL, the first data line D1, the second data line D2, the third data line D3, the scan line S1, and the first additional conductive line CL1 are the same as the first vertical power line PL1*a*, the initialization power line IPL, the first data line D1, the second data line D2, the third data line D3, the scan line S1, and the first additional conductive line CL1 that have been described with reference to FIGS. 13 and 14, and therefore, further explanation thereof will be omitted.

Each of the first to third pixel circuits SPXC1, SPXC2, and SPXC3 may include a first transistor T1, a second transistor T2, a third transistor T3, and a storage capacitor. For example, the first pixel circuit SPXC1 may include first to third transistors T1 to T3 and a first storage capacitor Cst1. The second pixel circuit SPXC2 may include first to third transistors T1 to T3 and a second storage capacitor Cst2. The third pixel circuit SPXC3 may include first to third transistors T1 to T3 and a third storage capacitor Cst3.

The first pixel circuit SPXC1, the second pixel circuit SPXC2, and the third pixel circuit SPXC3 may have a substantially similar or identical structure. Hereinafter, the first pixel circuit SPXC1 from among the first to third pixel circuits SPXC1, SPXC2, and SPXC3 will be described as a representative example, and descriptions of the second and third pixel circuits SPXC2 and SPXC3 will be simplified.

The first transistor T1 of the first pixel circuit SPXC1 may include a first gate electrode GE1, a first active pattern ACT1, a first source electrode SE1, and a first drain electrode DE1.

The first gate electrode GE1 may be connected to a second source area SE2 of the second transistor T2 through a first conductive pattern CP1. The first gate electrode GE1 may be disposed on the gate insulating layer GI (refer to FIGS. 8 to 11).

The first conductive pattern CP1 may electrically connect the first gate electrode GE1 and the second source area SE2 to each other through a corresponding contact hole CH. The first conductive pattern CP1 may be disposed on the interlayer insulating layer ILD.

The first active pattern ACT1, the first source area SE1, and the first drain area DE1 each may be a semiconductor pattern SCP (refer to FIGS. 8 to 11) formed of poly silicon, amorphous silicon, an oxide semiconductor, etc. For example, each of the first source area SE1 and the first drain area DE1 may be formed of a semiconductor layer doped with an impurity. The first active pattern ACT1 may be formed of an undoped semiconductor layer. The first active pattern ACT1, the first source area SE1, and the first drain area DE1 may be disposed on the buffer layer BFL.

The first active pattern ACT1 may be a channel area of the first transistor T1 as an area overlapping the first gate electrode GE1.

The first source area SE1 may be connected to a first end of the first active pattern ACT1, and connected to a first bottom metal pattern BML1 through a corresponding contact hole CH.

The first bottom metal pattern BML1 may be connected to the first source area SE1 through a corresponding contact hole CH. If the first bottom metal pattern BML1 is connected to the first source area SE1, a driving range of a voltage to be supplied to the first gate electrode GE1 may be increased. Furthermore, because the first bottom metal pattern BML1 is electrically connected to the first transistor T1, the first bottom metal pattern BML1 may be prevented from floating. The first bottom metal pattern BML1 may be disposed on the substrate SUB. The first bottom metal pattern BML1 and the first signal line SL1 may be formed through the same process and disposed on (or at) the same layer, and have the same material.

The first drain area DE1 may be connected to a second end of the first active pattern ACT1, and connected to the first vertical power line PL1*a* through a corresponding contact hole CH.

The second transistor T2 may include a second gate electrode GE2, a second active pattern ACT2, a second source area SE2, and a second drain area DE2.

The second gate electrode GE2 may be integrally provided with the second connection line CNL2, and receive a signal (e.g., a scan signal) through the first connection line CNL1. The second gate GE2 and the first gate electrode GE1 may be formed through the same process and disposed on (or at) the same layer, and have the same material.

The second active pattern ACT2, the second source area SE2, and the second drain area DE2 each may be a semiconductor pattern SCP. The second active pattern ACT2, the second source area SE2, and the second drain area DE2 may be disposed on the buffer layer BFL.

The second active pattern ACT2 may be a channel area of the second transistor T2 as an area overlapping with the second gate electrode GE2.

The second source area SE2 may be connected to a first end of the second active pattern ACT2 and connected to the first gate electrode GE1 by the first conductive pattern CP1.

The second drain area DE2 may be connected to a second end of the second active pattern ACT2 and connected to the first data line D1 by a third conductive pattern CP3.

The third conductive pattern CP3 may connect the first data line D1 and the second drain area DE2 to each other through a corresponding contact hole CH. The third conductive pattern CP3 and the first conductive pattern CP1 may be formed through the same process and disposed on (or at) the same layer, and have the same material.

The third transistor T3 may include a third gate electrode GE3, a third active pattern ACT3, a third source area SE3, and a third drain area DE3.

The third gate electrode GE3 may be integrally provided with the second connection line CNL2, and receive a signal (e.g., a sensing control signal) from the scan line S1 through the first connection line CNL1.

The third active pattern ACT3, the third source area SE2, and the third drain area DE3 each may be a semiconductor pattern, and be disposed on the buffer layer BFL.

The third active pattern ACT3 may correspond to a channel area of the third pixel transistor T3 as an area overlapping with the third gate electrode GE3.

The third source area SE3 may be connected to a first end of the third active pattern ACT3, and connected to the first bottom metal pattern BML1 through a corresponding contact hole CH.

The third drain area DE3 may be connected to a second end of the third active pattern ACT3 and connected to the initialization power line IPL by a second conductive pattern CP2.

The second conductive pattern CP2 may connect the initialization power line IPL and the third drain area DE3 to each other through a corresponding contact hole CH. The second conductive pattern CP2 and the first conductive pattern CP1 may be formed through the same process and disposed on (or at) the same layer, and have the same material.

The first storage capacitor Cst1 may include a first lower electrode LE1 and a first upper electrode UE1.

The first lower electrode LE1 may be integrally formed (or provided) with the first gate electrode GE1.

The first upper electrode UE1 may be disposed to overlap with the first lower electrode LE1 in a plan view, and have a size(or a surface area) greater than that of the first lower electrode LE1, but the present disclosure is not limited thereto. In a plan view, the first upper electrode UE1 may overlap with each of the first source area SE1 and the third source area SE3. The first upper electrode UE1 and the first, second, and third conductive patterns CP1, CP2, and CP3 may be formed through the same process and disposed on (or at) the same layer, and have the same material.

The first upper electrode UE1 may be electrically connected with the first bottom metal pattern BML1 through a corresponding contact hole CH. The first upper electrode UE1 may be electrically and/or physically connected to the first and third source areas SE1 and SE3 by the first bottom metal pattern BML1.

The second pixel circuit SPXC2 may include a first transistor T1, a second transistor T2, a third transistor T3, and a second storage capacitor Cst2.

The first transistor T1 may include a first gate electrode GE1, a first active pattern ACT1, a first source electrode SE1, and a first drain electrode DE1.

The first source area SE1 may be connected to the first active pattern ACT1, and connected to a second bottom metal pattern BML2 through a corresponding contact hole CH.

The second bottom metal pattern BML2 may overlap the first transistor T1. The second bottom metal pattern BML2 may be connected to the first source area SE1 through the contact hole CH, and connected to the third source area SE3 of the third transistor T3 through another corresponding contact hole CH. Furthermore, the second bottom metal pattern BML2 may be connected to a second upper electrode UE2 of the second storage capacitor Cst2 through another corresponding contact hole CH. The second bottom metal pattern BML2 and the first bottom metal pattern BML1 may be formed through the same process and disposed on (or at) the same layer, and have the same material.

The second transistor T2 may include a second gate electrode GE2, a second active pattern ACT2, a second source area SE2, and a second drain area DE2.

The second source area SE2 may be connected to the second active pattern ACT2, and connected to a seventh conductive pattern CP7 through a corresponding contact hole CH.

The seventh conductive pattern CP7 may connect the second source electrode SE2 and the first gate electrode GE1 to each other through a corresponding contact hole CH. The seventh conductive pattern CP7 and the first, second, and third conductive patterns CP1, CP2, and CP3 may be formed through the same process and disposed on (or at) the same layer, and have the same material.

The second drain area DE2 may be connected to the second active pattern ACT2 and connected to the second data line D2 by an eighth conductive pattern CP8.

The eighth conductive pattern CP8 may connect the second drain area DE2 and the second data line D2 to each other through a corresponding contact hole CH. The eighth conductive pattern CP8 and the seventh conductive pattern CP7 may be formed through the same process and disposed on (or at) the same layer, and have the same material.

The third transistor T3 may include a third gate electrode GE3, a third active pattern ACT3, a third source area SE3, and a third drain area DE3.

The third source area SE3 may be connected to the third active pattern ACT3, and connected to a third bottom metal pattern BML3 through a corresponding contact hole CH.

The third drain area DE3 may be connected to the third active pattern ACT3 and connected to the initialization power line IPL by a fifth conductive pattern CP5.

The fifth conductive pattern CP5 may connect the third drain area DE3 and the initialization power line IPL to each other through a corresponding contact hole CH. The fifth conductive pattern CP5 and the seventh and eighth conductive patterns CP7 and CP8 may be formed through the same process and disposed on (or at) the same layer, and have the same material.

The second storage capacitor Cst2 may include a second lower electrode LE2 and a second upper electrode UE2.

The second lower electrode LE2 may be integrally provided with the second gate electrode GE2. The second lower electrode LE2 and the first lower electrode LE1 may be formed through the same process and disposed on (or at) the same layer, and have the same material.

The second upper electrode UE2 may overlap the second lower electrode LE2. The second upper electrode UE2 and the first upper electrode UE1 may be formed through the same process and disposed on (or at) the same layer, and have the same material.

The third pixel circuit SPXC3 may include a first transistor T1, a second transistor T2, a third transistor T3, and a third storage capacitor Cst3.

The first transistor T1 may include a first gate electrode GE1, a first active pattern ACT1, a first source electrode SE1, and a first drain electrode DE1.

The first source area SE1 may be connected to the first active pattern ACT1, and connected to the third bottom metal pattern BML3 through a corresponding contact hole CH.

The third bottom metal pattern BML3 may overlap the first transistor T1. The third bottom metal pattern BML3 may be connected to the first source area SE1 through the corresponding contact hole CH, and connected to the third source area SE3 of the third transistor T3 through another corresponding contact hole CH. Furthermore, the third bottom metal pattern BML3 may be connected to a third upper electrode UE3 of the third storage capacitor Cst3 through another corresponding contact hole CH.

The second transistor T2 may include a second gate electrode GE2, a second active pattern ACT2, a second source area SE2, and a second drain area DE2.

The second source area SE2 may be connected to the second active pattern ACT2, and connected to a fourth conductive pattern CP4 through a corresponding contact hole CH.

The fourth conductive pattern CP4 may connect the second source electrode SE2 and the first gate electrode GE1 to each other through a corresponding contact hole CH. The fourth conductive pattern CP4 and the first to third conductive patterns CP1, CP2, and CP3 may be formed through the same process and disposed on (or at) the same layer, and have the same material.

The second drain area DE2 may be connected to the second active pattern ACT2 and connected to the third data line D3 by a sixth conductive pattern CP6.

The sixth conductive pattern CP6 may connect the second drain area DE2 and the third data line D3 to each other through a corresponding contact hole CH. The sixth conductive pattern CP6 and the fourth conductive pattern CP4 may be formed through the same process and disposed on (or at) the same layer, and have the same material.

The third transistor T3 may include a third gate electrode GE3, a third active pattern ACT3, a third source area SE3, and a third drain area DE3.

The third source area SE3 may be connected to the third active pattern ACT3, and connected to the third bottom metal pattern BML3 through a corresponding contact hole CH.

The third drain area DE3 may be connected to the third active pattern ACT3 and connected to the initialization power line IPL by the fifth conductive pattern CP5.

The third storage capacitor Cst3 may include a third lower electrode LE3 and a third upper electrode UE3.

The third lower electrode LE3 may be integrally formed with the third gate electrode GE3.

The third upper electrode UE3 may overlap the third lower electrode LE3. The third upper electrode UE3 may include a protrusion pattern PRP extending in one direction, e.g., toward the second vertical power line PL2$a$ in the first direction DR1. The protrusion pattern PRP may be integrally formed with the third upper electrode UE3 and may be one area of the third upper electrode UE3.

The first, second, and third pixel circuits SPXC1, SPXC2, and SPXC3 having the foregoing configurations may be covered with the passivation layer PSV (refer to FIGS. 8 to 11).

The above-mentioned passivation layer PSV may include a plurality of via holes located in the first area A1. For example, the passivation layer PSV may include first via holes VIH1, second via holes VIH2, and third via holes VIH3.

The first via holes VIH1 may respectively expose one area of the second horizontal power line PL2$b$, another area of the second horizontal power line PL2$b$, and another area of the second horizontal power line PL2$b$.

The second via holes VIH2 may expose one area of the first upper electrode UE1, one area of the second upper electrode UE2, and one area of the third upper electrode UE3. In an embodiment, the number of second via holes VIH2 disposed in the first pixel area PXA1 of the first area A1 may be three, but the present disclosure is not limited thereto.

The third via holes VIH3 may respectively expose one area of the first horizontal power line PL1$b$, another area of the first horizontal power line PL1$b$, and another area of the first horizontal power line PL1$b$.

The display element layer DPL including the light emitting element LD may be disposed on the above-mentioned pixel circuit layer PCL. Some components of the display element layer DPL may be electrically connected to some components of the pixel circuit layer PCL through corresponding via holes. For example, each of the first, second, and third upper electrodes UE1, UE2, and UE3 may be electrically connected to the first alignment electrode ALE1 of the display element layer DPL through the corresponding second via hole VIH2. The second horizontal power line PL2$b$ may be electrically connected to the second alignment element ALE2 of the display element layer DPL through the corresponding first via hole VIH1. The first horizontal power line PL1$b$ may be electrically connected to a floating pattern FTP of the display element layer DPL through the corresponding third via hole VIH3.

In one or more embodiments, the display element layer DPL of the first area A1 may include a first emission part EMU1 that is electrically connected to the first pixel circuit SPXC1, a second emission part EMU2 that is electrically connected to the second pixel circuit SPXC2, and a third emission part EMU3 that is electrically connected to the third pixel circuit SPXC3.

In one or more embodiments, the first emission part EMU1 may include light emitting elements LD that are electrically connected to the first pixel circuit SPXC1 and configured to emit light, and electrodes (or patterns) that are electrically connected to the light emitting elements LD. The first emission part EMU1 and the first pixel circuit SPXC1 that are electrically connected to each other may form the first sub-pixel SPXL1 of the first pixel PXL1.

In one or more embodiments, the second emission part EMU2 may include light emitting elements LD that are electrically connected to the second pixel circuit SPXC2 and configured to emit light, and electrodes (or patterns) that are electrically connected to the light emitting elements LD. The second emission part EMU2 and the second pixel circuit SPXC2 that are electrically connected to each other may form the second sub-pixel SPXL2 of the first pixel PXL1.

In one or more embodiments, the third emission part EMU3 may include light emitting elements LD that are electrically connected to the third pixel circuit SPXC3 and configured to emit light, and electrodes that are electrically connected to the light emitting elements LD. The third emission part EMU3 and the third pixel circuit SPXC3 that are electrically connected to each other may form the third sub-pixel SPXL3 of the first pixel PXL1.

Each of the first, second, and third sub-pixels SPXL1, SPXL2, and SPXL3 may include an emission area EMA and a non-emission area NEMA.

The display element layer DPL may include the first bank BNK1 disposed in the non-emission area NEMA.

The first bank BNK1 may be a structure that defines (or partition) an emission area of each of adjacent sub-pixels, and may be a pixel defining layer. For example, the first bank BNK1 may be a structure that defines the emission area EMA of each of the first, second, and third sub-pixels SPXL1, SPXL2, and SPXL3. The first bank BNK1 may be a pixel defining layer or a dam structure that defines a position to which light emitting elements LD are to be supplied, during a process of supplying (or inputting) the light emitting elements LD to each of the first, second, and third sub-pixels SPXL1, SPXL2, and SPXL3. For example, the emission area EMA of each of the first, second, and third sub-pixels SPXL1, SPXL2, and SPXL3 may be partitioned (or defined) by the first bank BNK1, so that a mixed solution including a desired amount and/or kind of light emitting elements LD may be supplied (or input) to the corresponding emission area EMA.

In one or more embodiments, the first bank BNK1 may include at least one light block material and/or reflective material (or scattering material), thus preventing a light leakage defect in which light (or rays) leaks between adjacent sub-pixels. In one or more embodiments, the first bank BNK1 may include transparent material (or substance). The transparent material may include, for example, polyamides resin, polyimides resin, and the like, but the present disclosure is not limited thereto. In one or more embodiments, in order to enhance the efficiency of light emitted from each of the first, second, and third sub-pixels SPXL1, SPXL2, and SPXL3, a separate reflective material layer may be provided and/or formed on the first bank BNK1.

The first bank BNK1 may include at least one opening OP that exposes some components of the display element layer DPL. For example, the first bank BNK1 may include an opening OP that exposes components disposed under the first bank BNK1 in the display element layer DPL. In one or more embodiments, the emission area EMA of each of the first, second, and third sub-pixels SPXL1, SPXL2, and SPXL3 and the opening OP of the first bank BNK1 may correspond to each other.

An electrode separation area OPA may be located in the non-emission area NEMA of each of the first, second, and third sub-pixels SPXL1, SPXL2, and SPXL3. The electrode separation area OPA may be an area in which the first alignment electrode ALE1 in each of the first, second, and third sub-pixels SPXL1, SPXL2, and SPXL3 is separated from the first alignment electrodes ALE1 provided in an adjacent sub-pixels.

The display element layer DPL may include the pixel electrodes PE that are provided in the emission area EMA of each of at least the first, second, and third sub-pixels SPXL1, SPXL2, and SPXL3, the light emitting elements LD that are electrically connected to the pixel electrodes PE, and the alignment electrodes ALE provided at positions corresponding to the pixel electrodes PE. For example, the first and second pixel electrodes PE1 and PE2, the light emitting elements LD1 and LD2, and the first and second alignment electrodes ALE1 and ALE2 may be disposed in the emission area EMA of each of the first, second, and third sub-pixels SPXL1, SPXL2, and SPXL3. Furthermore, the intermediate electrode CTE may be disposed in the emission area EMA of each of the first, second, and third sub-pixels SPXL1, SPXL2, and SPXL3. The number, shape, size, arrangement structure, and the like of the pixel electrodes PE and/or the alignment electrodes ALE may be changed in various ways depending on the structures of the first, second, and third sub-pixels SPXL1, SPXL2, and SPXL3 (e.g., the first, second, and third emission parts EMU1, EMU2, and EMU3).

The first emission part EMU1, the second emission part EMU2, and the third emission part EMU3 may have a substantially similar or identical structure. Hereinafter, the first emission part EMU1 will be described as a representative example.

In one or more embodiments, based on one surface of the substrate SUB on which the first pixel PXL1 is disposed, the alignment electrodes ALE, the light emitting elements LD, and the pixel electrodes PE may be provided in the order listed, but the present disclosure is not limited thereto. In one or more embodiments, the positions and formation sequence of electrode patterns that form the first emission part EMU1 may be changed in various ways.

The alignment electrodes ALE may include a first alignment electrode ALE1 and a second alignment electrode ALE2 that are spaced from each other in the first direction DR1.

At least one of the first alignment electrode ALE1 and the second alignment electrode ALE2 may be separated from other electrodes (e.g., an alignment electrode ALE provided in an adjacent sub-pixel adjacent to the first sub-pixel SPXL1 in the second direction DR2) after the light emitting elements LD have been supplied to and aligned in the emission area EMA during a process of fabricating the display device DD. For example, the first alignment element ALE1 may be separated from a first alignment electrode ALE1 provided in the adjacent sub-pixel adjacent to the first sub-pixel SPXL1 after the light emitting elements LD have been supplied to and aligned in the emission area EMA during the process of fabricating the display device DD.

In detail, the first alignment electrodes ALE1 provided in the first area A1 may be formed to be connected to each other during the process of fabricating the display device DD (or the first pixel PXL1). For example, the first alignment electrodes ALE1 may be integrally connected to the floating pattern FPT, thus forming the first alignment line. The floating pattern FPT may be electrically connected to the first horizontal power line PL1$b$ of the pixel circuit layer PCL through a third via hole VIH3. Hence, during a process of aligning the light emitting elements LD, a first alignment signal may be supplied to the first alignment line through the first horizontal power line PL1$b$. After the process of aligning the light emitting elements LD has been completed, a portion of the first alignment line around the third via hole VIH3 may be removed (or the first alignment line may be cut off), whereby the electrical connection between the first alignment electrodes ALE1 and the first horizontal power line PL1$b$ may be interrupted. For example, the first alignment line may be cut off in the electrode separation areas OPA (or disconnection areas) disposed around the floating pattern FPT (e.g., upper and lower end areas), so that the first alignment line may be divided into first alignment electrodes ALE1 and floating patterns FPT. Furthermore, the first alignment line may be cut off in the electrode separation area OPA between adjacent pixel columns, so that the first alignment electrodes ALE1 of adjacent sub-pixels can be separated from each other. Therefore, the first alignment electrodes ALE1 of sub-pixels disposed on the same pixel column may be electrically separated from each other, whereby the sub-pixels may be individually driven. In one or more embodiments, the third via hole VIH3 may be formed by removing one area of an insulating layer, e.g., the passivation layer PSV, disposed between each floating pattern FPT and the first horizontal power line PL1*b*.

In a plan view, the second alignment electrode ALE2, the first alignment electrode ALE1, and the second alignment electrode ALE2 may be arranged along the first direction DR1 in the emission area EMA. The second alignment electrode ALE2, the first alignment electrode ALE1, and the second alignment electrode ALE2 may be spaced from each other and extend in the second direction DR2.

In the emission area EMA, the first alignment electrode ALE1 may be electrically connected to the first upper electrode UE1 of the first pixel circuit SPXC1 (or the pixel circuit layer PCL) through the corresponding second via hole VIH2. The second via hole VIH2 may be formed by removing one area of an insulating layer, e.g., the passivation layer PSV, disposed between the first alignment electrode ALE1 and the first upper electrode UE1. The first alignment electrode ALE1 may be electrically connected to the first pixel electrode PE1 through the first contact hole CH1 in the non-emission area NEMA. The first contact hole CH1 may be formed by removing a portion of at least one insulating layer disposed between the first alignment electrode ALE1 and the first pixel electrode PE1. For example, the first contact hole CH1 may be formed by removing a portion of the first insulating layer INS1 (refer to FIGS. 8 to 11) disposed between the first alignment electrode ALE1 and the first pixel electrode PE1.

The first upper electrode UE1, the first alignment electrode ALE1, and the first pixel electrode PE1 may be electrically connected to each other through the second via hole VIH2 and the first contact hole CH1.

The second alignment electrode ALE2 may be electrically connected to the second horizontal power line PL2*b* through the corresponding first via hole VIH1 in the non-emission area NEMA. The first via hole VIH1 may be formed by removing one area of the passivation layer PSV that is disposed between the second alignment electrode ALE2 and the second horizontal power line PL2*b*. Furthermore, the second alignment electrode ALE2 may be electrically connected to the second pixel electrode PE2 through the second contact hole CH2 in the non-emission area NEMA. The second contact hole CH2 may be formed by removing a portion of at least one insulating layer, e.g., the first insulating layer INS1, disposed between the second alignment electrode ALE2 and the second pixel electrode PE2.

The second horizontal power line PL2*b*, the second alignment electrode ALE2, and the second pixel electrode PE2 may be electrically connected to each other through the first via hole VIH1 and the second contact hole CH2.

In the emission area EMA of the first sub-pixel SPXL1, the first alignment electrode ALE1 and the second alignment electrode ALE2 may be spaced from each other in the first direction DR1. For example, the first alignment electrode ALE1 and the second alignment electrode ALE2 disposed on one side of the first alignment electrode ALE1 may be spaced from each other in the first direction DR1. The first alignment electrode ALE1 and the second alignment electrode ALE2 disposed on the other side of the first alignment electrode ALE1 may be spaced from each other in the first direction DR1. A distance between the first alignment electrode ALE1 and the second alignment electrode ALE2 disposed on one side thereof may be the same as a distance between the first alignment electrode ALE1 and the second alignment electrode ALE2 disposed on the other side thereof.

The first alignment electrode ALE1 and the second alignment electrode ALE2 each may be used as an alignment line provided for alignment of the light emitting elements LD and configured to receive a signal (e.g., an alignment signal) before the light emitting elements LD are aligned in the emission area EMA of the first sub-pixel SPXL1.

The first alignment electrode ALE1 may receive a first alignment signal at the step of aligning the light emitting elements LD. The second alignment electrode ALE2 may receive a second alignment signal at the step of aligning the light emitting elements LD. The foregoing first and second alignment signals may be signals having a voltage difference and/or a phase difference, allowing the light emitting elements LD to be aligned between the alignment electrodes ALE. At least one of the first and second alignment signals may be an AC signal, but the present disclosure is not limited thereto. In one or more embodiments, the first alignment signal supplied to the first alignment electrode ALE1 may be an AC signal. The second alignment signal supplied to the second alignment electrode ALE2 may be a ground voltage.

The first alignment electrode ALE1 and the second alignment electrode ALE2 each may be provided in the form of a bar having a constant width in at least the emission area EMA, but the present disclosure is not limited thereto. The first alignment electrode ALE1 and the second alignment electrode ALE2 each may or may not have a curved part in the non-emission area NEMA. The shape, size, and/or the like thereof in the other areas except the emission area EMA may be changed in various ways without being particularly limited.

A bank pattern BNP (refer to FIGS. 8 to 11) may be disposed under the alignment electrode ALE so as to change a surface profile (or shape) of the alignment electrode ALE so that light emitted from the light emitting elements LD can be guided in an image display direction of the display device DD. The bank pattern BNP may be a support component for supporting the alignment electrode ALE.

Although at least two to several tens of light emitting elements LD may be aligned and/or provided in the emission area EMA, the number of light emitting elements LD is not limited thereto. In one or more embodiments, the number of light emitting elements LD aligned and/or provided in the emission area EMA may be changed in various ways.

The light emitting elements LD may be disposed between the second alignment electrode ALE2 and one side (e.g., the left side) of the first alignment electrode ALE1 and between the other side (e.g., the right side) of the first alignment electrode ALE1 and the second alignment electrode ALE2. Each of the light emitting elements LD may include a first end EP1 and a second end EP2 that are respectively disposed on opposite ends thereof with respect to the longitudinal direction. In one or more embodiments, the second semiconductor layer (refer to "13" of FIG. 1) including a p-type semiconductor layer may be disposed on the first end EP1, and the first semiconductor layer (refer to "11" of FIG. 1) including an n-type semiconductor layer may be disposed on the second end EP2. The light emitting elements LD may be connected in parallel to each other between the second alignment electrode ALE2 and the left side of the first alignment electrode ALE1 and between the right side of the first alignment electrode ALE1 and the second alignment electrode ALE2.

The light emitting elements LD may be disposed at positions spaced from each other and aligned in parallel to each other. A distance by which the light emitting elements LD are spaced from each other is not particularly limited. In one or more embodiments, a plurality of light emitting elements LD may be disposed adjacent to each other to form a group, and another plurality of light emitting elements LD may be spaced from each other at regular intervals to form a group. The light emitting elements LD may be aligned in one direction with an uneven density.

Each of the light emitting elements LD may emit any one light of color light and/or white light. The light emitting elements LD each may be aligned between the second alignment electrode ALE2 and the left side of the first alignment electrode ALE1 or between the right side of the first alignment electrode ALE1 and the second alignment electrode ALE2 such that the longitudinal direction of the light emitting element LD is parallel to the first direction DR1. In one or more embodiments, at least some of the light emitting elements LD may be aligned between the second alignment electrode ALE2 and the left side of the first alignment electrode ALE1 and between the right side of the first alignment electrode ALE1 and the second alignment electrode ALE2 such that the at least some of the light emitting elements LD are not completely parallel to the first direction DR1. The light emitting elements LD may be provided in a sprayed (or diffused) form in a solution (e.g., ink) and then input (or supplied) to the emission area EMA.

The light emitting elements LD may be input (or supplied) to the first emission area EMA1 by an inkjet printing scheme, a slit coating scheme, or other various schemes. For example, the light emitting elements LD may be mixed with a volatile solvent and then input (or supplied) to the first emission area EMA1 by an inkjet printing scheme or a slit coating scheme. Here, if the first alignment electrode ALE1 and the second alignment electrode ALE2 are respectively supplied with corresponding alignment signals, electrical fields may be respectively formed between the second alignment electrode ALE2 and the left side of the first alignment electrode AEL1 and between the right side of the first alignment electrode AEL1 and the second alignment electrode AEL2. Hence, the light emitting elements LD may be aligned between the second alignment electrode ALE2 and the left side of the first alignment electrode ALE1 and between the right side of the first alignment electrode ALE1 and the second alignment electrode ALE2. After the light emitting elements LD have been aligned, the solvent may be removed by a volatilization scheme or other schemes, so that the light emitting elements LD may be reliably aligned between the second alignment electrode ALE2 and the left side of the first alignment electrode ALE1 and between the right side of the first alignment electrode ALE1 and the second alignment electrode ALE2.

In one or more embodiments, the light emitting elements LD may include a first light emitting element LD1 and a second light emitting element LD2.

The first light emitting element LD1 may be aligned between the right side of the first alignment electrode ALE1 and the second alignment electrode ALE2 and electrically connected to the first pixel electrode PE1 and the intermediate electrode CTE. The second light emitting element LD2 may be aligned between the left side of the first alignment electrode ALE1 and the second alignment electrode ALE2 and electrically connected to the intermediate electrode CTE and the second pixel electrode PE2.

A plurality of first light emitting elements LD1 and a plurality of second light emitting elements LD2 may be provided. The first end EP1 of each of the first light emitting elements LD1 may be electrically connected to the first pixel electrode PE1. The second end EP2 of each of the first light emitting elements LD1 may be electrically connected to the intermediate electrode CTE. The first end EP1 of each of the second light emitting elements LD2 may be electrically connected to the intermediate electrode CTE. The second end EP2 of each of the second light emitting elements LD2 may be electrically connected to the second pixel electrode PE2.

The first light emitting elements LD1 may be connected in parallel to each other between the first pixel electrode PE1 and the intermediate electrode CTE. The second light emitting elements LD2 may be connected in parallel to each other between the intermediate electrode CTE and the second pixel electrode PE2.

In one or more embodiments, the first light emitting elements LD1 and the second light emitting elements LD2 each may be formed of a light emitting diode that is made of material having an inorganic crystal structure and has a subminiature size, e.g., ranging from the nano scale (or the nanometer scale) to the micro scale (or the micrometer scale). For example, the first light emitting elements LD1 and the second light emitting elements LD2 each may be the light emitting element LD described with reference to FIGS. 1 and 2.

The pixel electrodes PE and the intermediate electrode CTE may be provided in at least the emission area EMA of the first sub-pixel SPXL1, and each may be provided at a position corresponding to at least one alignment electrode ALE and at least one light emitting element LD. For example, each pixel electrode PE and each intermediate electrode CTE may be formed on the corresponding alignment electrodes ALE and the corresponding light emitting elements LD to overlap the alignment electrodes ALE and the light emitting elements LD, and thus electrically connected to at least the light emitting elements LD.

The first pixel electrode PE1 (or the first electrode) may be formed on a left side the first alignment electrode ALE1 and the respective first ends EP1 of the first light emitting elements LD1, and thus electrically connected to the respective first ends EP1 of the first light emitting elements LD1. The first pixel electrode PE1 may have a bar shape having a constant width with respect to an extension direction thereof, e.g., the second direction DR2.

The second pixel electrode PE2 (or the second electrode) may be formed on the second alignment electrode ALE2 and the respective second ends EP2 of the second light emitting elements LD2, and thus electrically connected to the respective second ends EP2 of the second light emitting elements LD2. The second pixel electrode PE2 may have a bar shape having a constant width with respect to an extension direction thereof, e.g., the second direction DR2.

The intermediate electrode CTE may be formed on the left side of the first alignment electrode ALE1 and the respective second ends EP2 of the first light emitting elements LD1, and thus electrically connected to the respective second end EP2 of the first light emitting elements LD1. Furthermore, the intermediate electrode CTE may be formed on the second alignment electrode ALE2 and the respective first ends EP1 of the second light emitting elements LD2, and thus electrically connected to the respective first ends EP1 of the second light emitting elements LD2. The intermediate electrode CTE may be bent at least one time to enclose at least a right side of the first pixel electrode PE1.

The first light emitting elements LD1 may be connected in series to the second light emitting elements LD2 by the intermediate electrode CTE. The first pixel electrode PE1 and the intermediate electrode CTE, along with the first light emitting elements LD1 connected in parallel therebetween, may form a first serial set SET1 of the first emission part EMU1. The intermediate electrode CTE and the second pixel electrode PE2, along with the second light emitting elements LD2 connected in parallel therebetween, may form a second serial set SET2 of the first emission part EMU1. The first pixel electrode PE1 may be an anode of the first emission part EMU1. The second pixel electrode PE2 may be a cathode of the first emission part EMU1.

During each frame period, in the first sub-pixel SPXL1, driving current may flow from the first pixel electrode PE1 to the second pixel electrode PE2 via the first light emitting elements LD1, the intermediate electrode CTE, and the second light emitting elements LD2.

In case that driving current flows from the first vertical power line PL1a to the second horizontal power line PL2b by the first transistor T1 included in the first pixel circuit SPXC1, the driving current may be drawn into the first emission part EMU1 through the second via hole VH12. For example, driving current may be supplied to the first alignment electrode ALE1 through the second via hole VIH2, and the driving current may flow to the first pixel electrode PE1 through the first contact hole CH1 and flow to the intermediate electrode CTE via the first light emitting elements LD1 through the first pixel electrode PE1. Hence, in the first serial set SET1, the first light emitting elements LD1 each may emit light at a luminance corresponding to current distributed to each first light emitting element LD1. Driving current that flows to the intermediate electrode CTE may flow to the second pixel electrode PE2 via the second light emitting elements LD2. Hence, in the second serial set SET2, the second light emitting elements LD2 each may emit light at a luminance corresponding to current distributed to each second light emitting element LD2.

As described above, driving current of the pixel PXL may flow successively via the first light emitting elements LD1 of the first serial set SET1 and the second light emitting elements LD2 of the second serial set SET2. Therefore, the first sub-pixel SPXL1 may emit light having a luminance corresponding to a data signal supplied during each frame period.

Hereinafter, components disposed in the second area A2 and the third area A3 will be described with reference to FIGS. 19 to 24.

Figure 19:
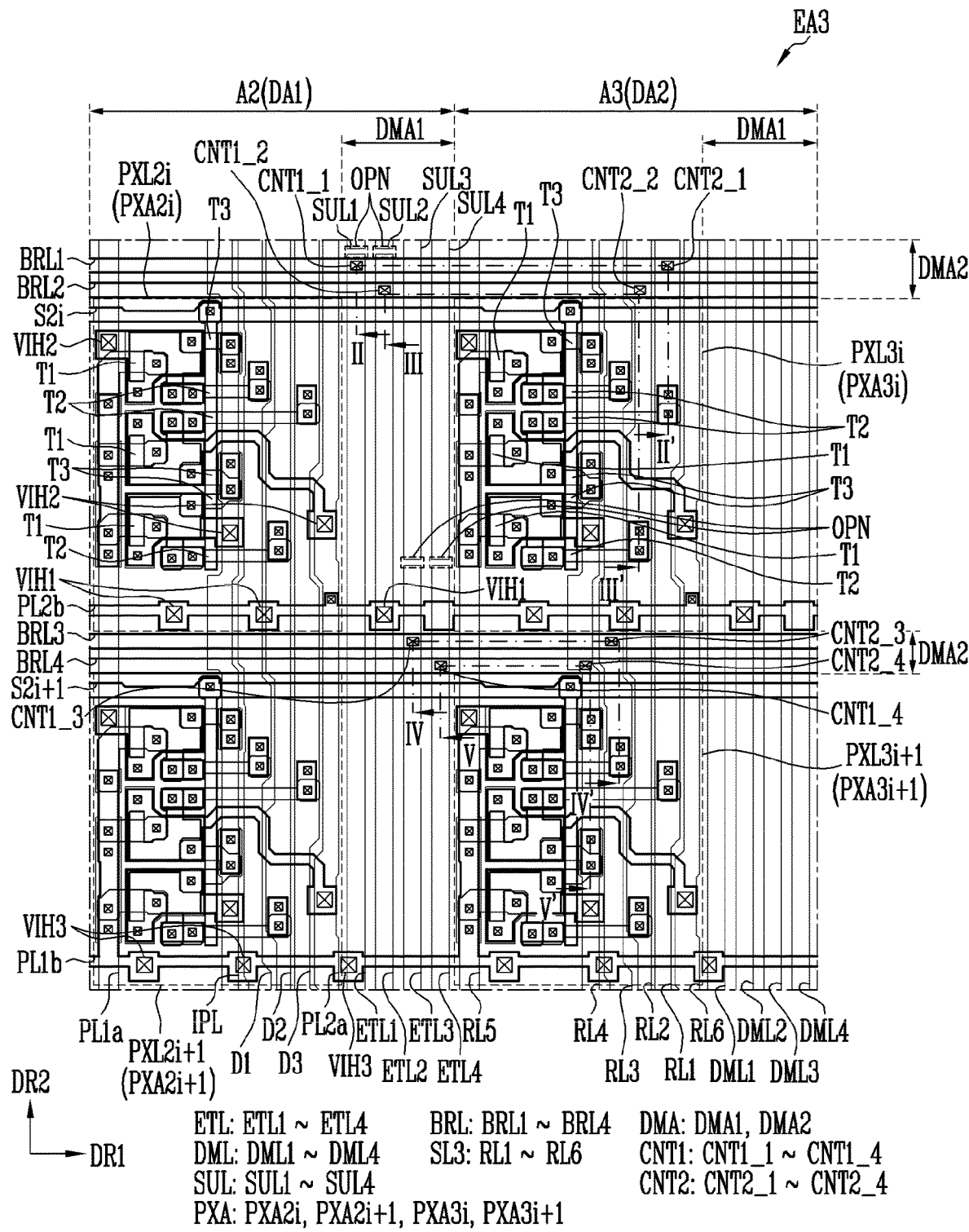
FIGS. 19 and 20 are enlarged schematic plan views of an area EA3 of FIG. 13.
Figure 20:
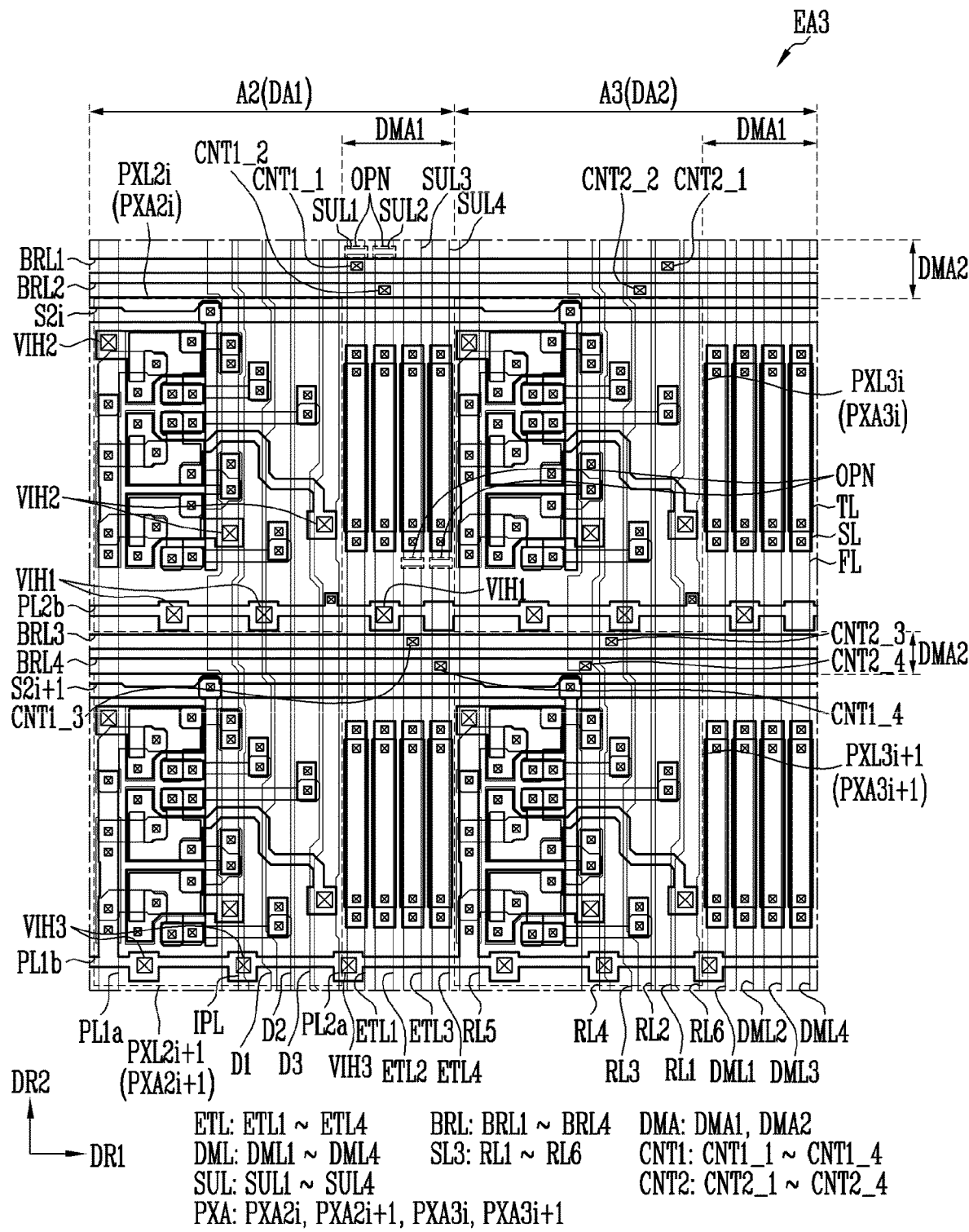
Figure 21:
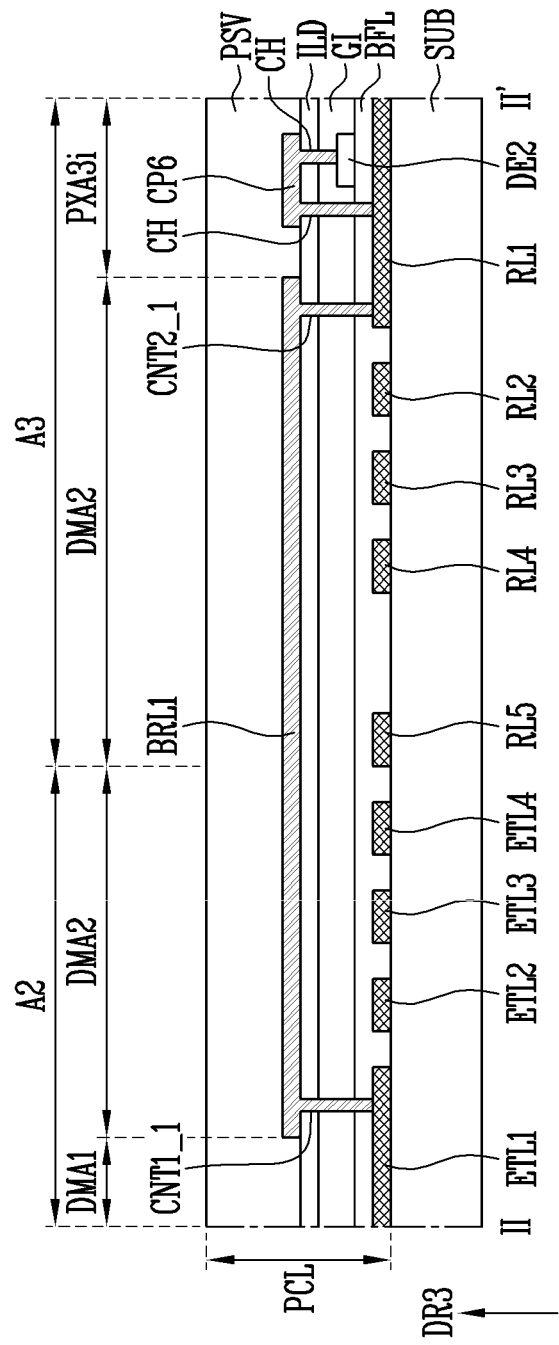
FIG. 21 is a schematic sectional view taken along the line II-II' of FIG. 19.
Figure 22:
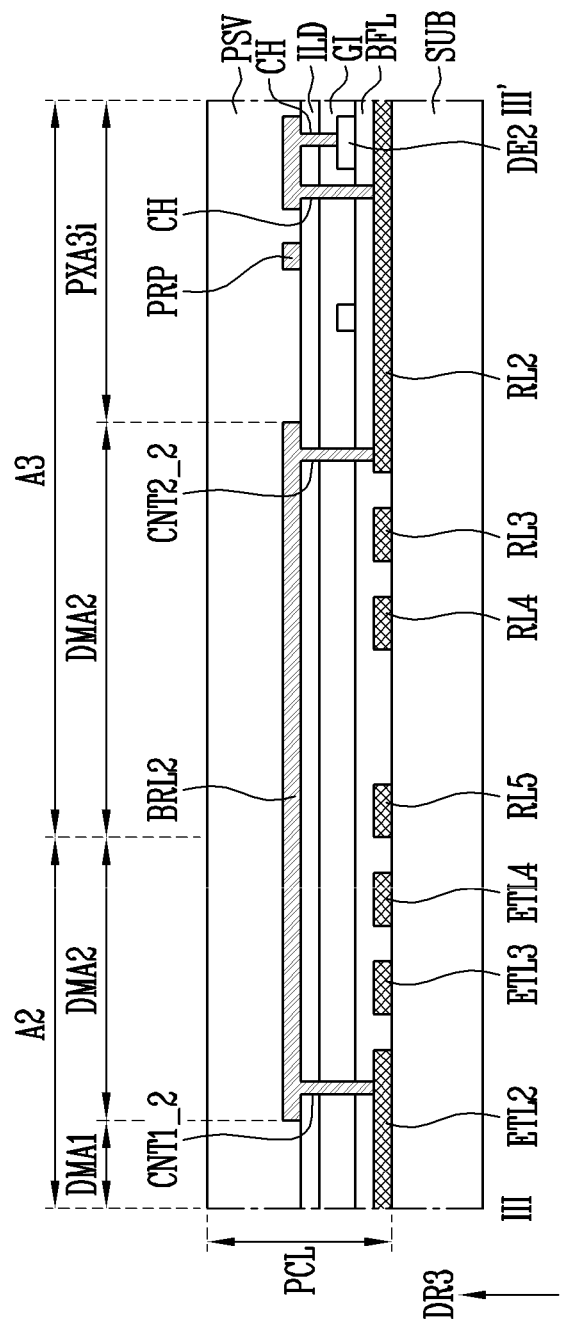
FIG. 22 is a schematic sectional view taken along the line III-III' of FIG. 19.
Figure 23:
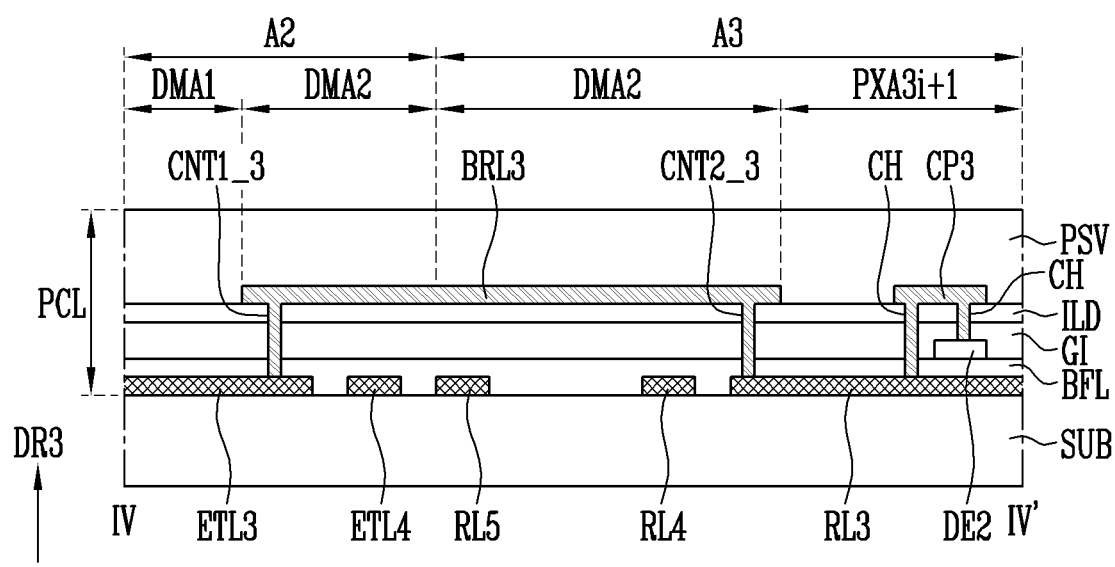
FIG. 23 is a schematic sectional view taken along the line IV-IV' of FIG. 19.
Figure 24:
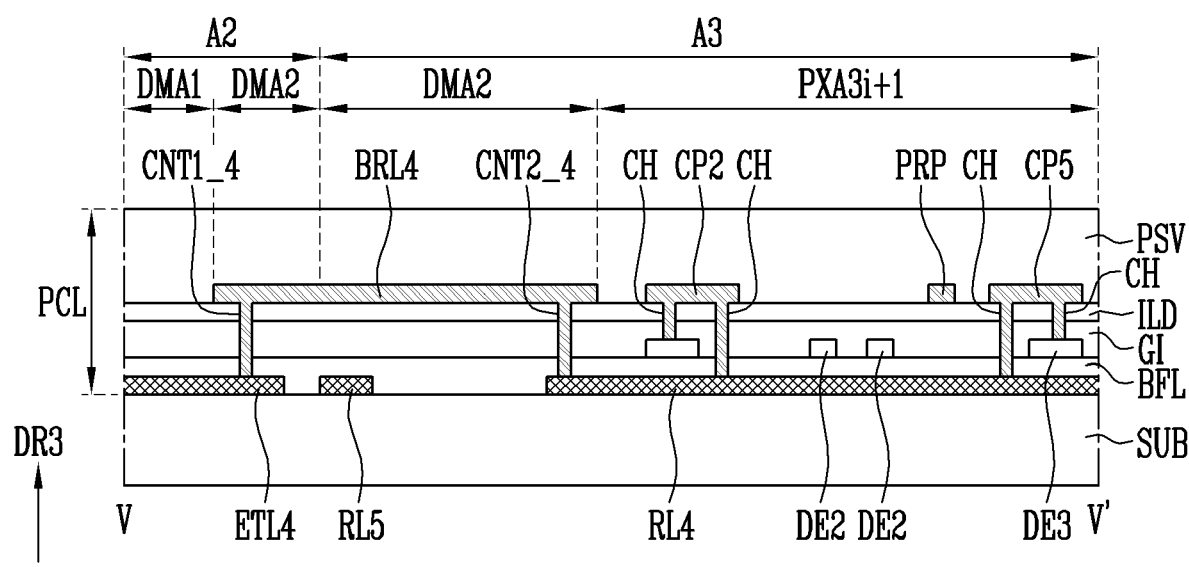
FIG. 24 is a schematic sectional view taken along the line V-V' of FIG. 19.

FIGS. 19 and 20 are enlarged schematic plan views of area EA3 of FIG. 13. FIG. 21 is a schematic sectional view taken along the line II-II' of FIG. 19. FIG. 22 is a schematic sectional view taken along the line III-III' of FIG. 19. FIG. 23 is a schematic sectional view taken along the line IV-IV' of FIG. 19. FIG. 24 is a schematic sectional view taken along the line V-V' of FIG. 19.

An embodiment of FIG. 20 represents a modification example of FIG. 19 with regard to the extension line ETL and the like.

For the convenience sake, in FIGS. 19 and 20, only one contact hole is indicated by reference character CH, as a representative example of contact holes CH for connecting specific components in area EA3.

FIGS. 19 and 20 schematically illustrate components disposed in area EA3, centered on a 2i-th pixel PXL2i and a 2i+1-th pixel PXL2i+1 that are disposed on the same pixel column in the second area A2, and a 3i-th pixel PXL3i and a 3i+1-th pixel PXL3i+1 that are disposed on the same pixel column in the second area A3. Because the 2i-th pixel PXL2i, the 2i+1-th pixel PXL2i+1, the 3i-th pixel PXL3i, and the 3i+1-th pixel PXL3i+1 each have a structure substantially identical or similar to that of the first pixel PXL described with reference to FIG. 17, the configuration of each of the 2i-th pixel PXL2i, the 2i+1-th pixel PXL2i+1, the 3i-th pixel PXL3i, and the 3i+1-th pixel PXL3i+1 will be described with reference to FIG. 17.

Furthermore, FIGS. 19 and 20 illustrate signal lines and additional lines that are electrically connected to each of the 2i-th pixel PXL2i, the 2i+1-th pixel PXL2i+1, the 3i-th pixel PXL3i, and the 3 i+1-th pixel PXL3i+1.

In FIGS. 19 to 24, for the convenience sake, illustration of the display element layer including the light emitting elements LD that are electrically connected to the first to third transistors T1, T2, and T3 is omitted.

The description of the embodiments of FIGS. 19 to 24 will be focused on differences from the above-mentioned embodiments so as to avoid redundant description.

Referring to FIGS. 1 to 24, the display element layer DPL (refer to FIGS. 8 to 11) including the pixel circuit layer PCL and the light emitting elements LD that are electrically connected to the pixel circuit layer PCL may be disposed in the second and third areas A2 and A3.

The pixel circuit layer PCL may include a plurality of insulating layers disposed on the substrate SUB, and a conductive layer disposed between the insulating layers. The insulating layers may include a buffer layer BFL, a gate insulating layer GI, an interlayer insulating layer ILD, and a passivation layer PSV that are successively stacked on the substrate SUB in the third direction DR3. The buffer layer BFL, the gate insulating layer GI, the interlayer insulating layer ILD, and the passivation layer PSV may be respectively the same as the buffer layer BFL, the gate insulating layer GI, the interlayer insulating layer ILD, and the passivation layer PSV that have been described with reference to FIGS. 8 to 11; therefore, further explanation thereof will be omitted. The conductive layer may include a first conductive layer disposed between the substrate SUB and the buffer layer BFL, a second conductive layer disposed between the gate insulating layer GI and the interlayer insulating layer ILD, and a third conductive layer disposed between the interlayer insulating layer ILD and the passivation layer PSV.

In the second area A2, second pixel areas PXA2i and PXA2i+1 in which second pixels PXL2i and PXL2i+1 are disposed may be provided. In the third area A3, third pixel areas PXA3i and PXA3i+1 in which third pixels PXL3i and PXL3i+1 are disposed may be provided.

In the following embodiment, the term "pixel area PXA" or "pixel areas PXA" will be used to collectively designate the second pixel areas PXA2i and PXA2i+1 and the third pixel areas PXA3i and PXA3i+1.

The second pixels PXL2i and PXL2i+1 may include a 2i-th pixel PXL2i and a 2i+1-th pixel PXL2i+1 that are disposed adjacent to each other on the same pixel column in the second area A2. For example, the 2i-th pixel PXL2i may be disposed on an i-th pixel row on a j-th pixel column, and the 2i+1-th pixel PXL2i+1 may be disposed on an i+1-th pixel row on the j-th pixel column. The 2i-th pixel PXL2i may be disposed in the 2i-th pixel area PXA2i of the second area A2. The 2i+1-th pixel PXL2i+1 may be disposed in the 2i+1-th pixel area PXA2i+1 of the second area A2.

The third pixels PXL3i and PXL3i+1 may include a 3i-th pixel PXL3i and a 3 i+1-th pixel PXL3i+1 that are disposed adjacent to each other on the same pixel column in the third area A3. For example, the 3i-th pixel PXL3i may be disposed on the i-th pixel row on a j+1-th pixel column, and the 3i+1-th pixel PXL3i+1 may be disposed on the i+1-th pixel row on the j+1-th pixel column. The 3i-th pixel PXL3i may be disposed in the 3i-th pixel area PXA3i of the third area A3. The 3i+1-th pixel PXL3i+1 may be disposed in the 3i+1-th pixel area PXA3i+1 of the third area A3.

The 2i-th pixel PXL2$i$ and the 3i-th pixel PXL3$i$ may be disposed on the same pixel row, i.e., the i-th pixel row, and electrically connected to an i-th scan line S2$i$. The 2i+1-th pixel PXL2$i$+1 and the 3i+1-th pixel PXL3$i$+1 may be disposed on the same pixel row, i.e., the i+1-th pixel row, and electrically connected to an i+1-th scan line S2$i$+1. Here, each of the i-th scan line S2$i$ and the i+1-th scan line S2$i$+1 may have the same configuration as that of the first connection line CNL1 described with reference to FIGS. 7 and 17.

The 2i-th pixel PXL2$i$, the 2i+1-th pixel PXL2$i$+1, the 3i-th pixel PXL3$i$, and the 3i+1-th pixel PXL3$i$+1 each may include a first sub-pixel (refer to "SPXL1" of FIG. 17), a second sub-pixel (refer to "SPXL2" of FIG. 17), and a third sub-pixel (refer to "SPXL3" of FIG. 17). Each of the first, second, and third sub-pixels SPXL1, SPXL2, and SPXL3 may include a pixel circuit (refer to "PXC" of FIG. 17) including a first transistor T1, a second transistor T2, a third transistor T3, and the like. For example, the first sub-pixel SPXL1 may include a first pixel circuit (refer to "PXC1" of FIG. 17). The second sub-pixel SPXL2 may include a second pixel circuit (refer to PXC2" of FIG. 17). The third sub-pixel SPXL3 may include a third pixel circuit (refer to "PXC3" of FIG. 17). Because the first, second, and third pixel circuits PXC1, PXC2, and PXC3 are respectively the same as the first, second, and third pixel circuits PXC1, PXC2, and PXC3 described with reference o FIG. 17, further detailed description thereof will be omitted.

The 2i-th pixel PXL2$i$ and the 2i+1 pixel PXL2$i$+1 may share a second signal line SL2. For example, the 2i-th pixel PXL2$i$ and the 2i+1 pixel PXL2$i$+1 may share six second signal lines SL2, including a vertical power line PL1$a$, a initialization power line IPL, a first data line D1, a second data line D2, a third data line D3, and a second vertical power line PL2$a$. For instance, the first vertical power line PL1$a$, the initialization power line IPL, the first data line D1, the second data line D2, the third data line D3, and the second vertical power line PL2$a$ may be provided in common in the 2i-th pixel PXL2$i$ and the 2i+1 pixel PXL2$i$+1.

The first vertical power line PL1$a$, the initialization power line IPL, the first data line D1, the second data line D2, the third data line D3, and the second vertical power line PL2$a$ each may be electrically connected to the second pad P2 disposed in the pad area PDA through the corresponding second line LP2 disposed in the fan-out area FTA. Each of the 2i-th pixel PXL2$i$ and the 2i+1-th pixel PXL2$i$+1 that are electrically connected with the second signal line SL2 may be electrically connected to six second lines LP2 and six second pads P2. For instance, the first vertical power line PL1$a$, the initialization power line IPL, the first data line D1, the second data line D2, the third data line D3, and the second vertical power line PL2$a$ may be spaced from each other in the first direction DR1 and extend in the second direction DR2. The first vertical power line PL1$a$, the initialization power line IPL, the first data line D1, the second data line D2, the third data line D3, and the second vertical power line PL2$a$ may correspond to the first conductive layer disposed between the substrate SUB and the buffer layer BFL.

The 3i-th pixel PXL3$i$ and the 3i+1 pixel PXL3$i$+1 may share a third signal line SL3. For example, the 3i-th pixel PXL3$i$ and the 3i+1 pixel PXL3$i$+1 may share six third signal lines SL3 including a first receiving line RL1, a second receiving line RL2, a third receiving line RL3, a fourth receiving line RL4, a fifth receiving line RL5, and a sixth receiving line RL6. For instance, the first receiving line RL1, the second receiving line RL2, the third receiving line RL3, the fourth receiving line RL4, the fifth receiving line RL5, and the sixth receiving line RL6 may be provided in common in the 3i-th pixel area PXA3$i$ and the 3i+1-th pixel area PXA3$i$+1.

The first receiving line RL1, the second receiving line RL2, the third receiving line RL3, the fourth receiving line RL4, the fifth receiving line RL5, and the sixth receiving line RL6 may correspond to the first conductive layer. The first receiving line RL1, the second receiving line RL2, the third receiving line RL3, the fourth receiving line RL4, the fifth receiving line RL5, and the sixth receiving line RL6 may be formed through the same process as that of the second signal line SL2 and provided on (or at) the same layer as that of the second signal line SL2, and have the same material as that of the second signal line SL2.

The first to sixth receiving lines RL1, RL2, RL3, RL4, RL5, and RL6 may be spaced from each other in the first direction DR1 and extend in the second direction DR2. At least some of the first to sixth receiving lines RL1, RL2, RL3, RL4, RL5, and RL6 each may be electrically connected with the corresponding bridge line BRL through the corresponding second contactor CNT2. For example, the first to fourth receiving lines RL1, RL2, RL3, and RL4 among the first to sixth receiving lines RL1, RL2, RL3, RL4, RL5, and RL6 each may be electrically connected with the corresponding bridge line BRL through the second contactor CNT2.

In one or more embodiments, the fifth receiving line RL5 may be electrically connected with the first horizontal power line PL1$b$ through a corresponding contact hole CH, and thus receive a voltage of the first driving power supply VDD from the first horizontal power line PL1$b$. The fifth receiving line RL5 may be a component corresponding to the first vertical power line PL1$a$ of the second signal line SL2. The first horizontal power line PL1$b$ may be provided in common in the first area A1, the second area A2, and the third area A3. The fifth receiving line RL5 may be electrically connected with the first horizontal power line PL1$b$ provided in common in the first and second areas A1 and A2, rather than being directly connected to the pads P disposed in the pad area PDA and the lines LP disposed in the fan-out area FTA, and thus receive the voltage of the first driving power supply VDD.

In one or more embodiments, the sixth receiving line RL6 may be electrically connected with the second horizontal power line PL2$b$ through a corresponding contact hole CH, and thus receive a voltage of the second driving power supply VSS from the second horizontal power line PL2$b$. The sixth receiving line RL6 may be a component corresponding to the second vertical power line PL2$a$ of the second signal line SL2. The second horizontal power line PL2$b$ may be provided in common in the first area A1, the second area A2, and the third area A3. The sixth receiving line RL6 may be electrically connected with the second horizontal power line PL2$b$ provided in common in the first and second areas A1 and A2, rather than being directly connected to the pads P disposed in the pad area PDA and the lines LP disposed in the fan-out area FTA, and thus receive the voltage of the second driving power supply VSS.

The first to fourth receiving lines RL1, RL2, RL3, and RL4 each may be electrically connected with the corresponding bridge line BRL through the corresponding second contactor CNT2. For example, the first receiving line RL1 may be electrically connected with a first bridge line BRL1 through a 2-1-th contactor CNT2_1. The second receiving line RL2 may be electrically connected with a second bridge line BRL2 through a 2-2-th contactor CNT2_2. The third receiving line RL3 may be electrically connected with a third bridge line BRL3 through a 2-3-th contactor CNT2_3. The fourth receiving line RL4 may be electrically connected with a fourth bridge line BRL4 through a 2-4-th contactor CNT2_4.

The 2-1-th contactor CNT2_1 may be formed by removing a portion of at least one insulating layer disposed between the first bridge line BRL1 and the first receiving line RL1. The 2-2-th contactor CNT2_2 may be formed by removing a portion of at least one insulating layer disposed between the second bridge line BRL2 and the second receiving line RL2. The 2-3-th contactor CNT2_3 may be formed by removing a portion of at least one insulating layer disposed between the third bridge line BRL3 and the third receiving line RL3. The 2-4-th contactor CNT2_4 may be formed by removing a portion of at least one insulating layer disposed between the fourth bridge line BRL4 and the fourth receiving line RL4.

In one or more embodiments, a dummy area DMA may be provided around a periphery of each of the pixel areas PXA and/or in a portion thereof. For example, a first dummy area DMA1 may be provided on a left side and a right side of each of the pixel areas PXA. A second dummy area DMA2 may be provided on an upper side and a lower side of each of the pixel areas PXA.

Each first dummy area DMA1 may be a line area where disposed is a vertical line that is adjacent to the second pixel areas PXA2$i$ and PXA2$i$+1 and the third pixel areas PXA3$i$ and PXA3$i$+1 and extend in the second direction DR2 in each of the second and third areas A2 and A3. For example, in the second area A2, the first dummy area DMA1 may be a line area where the extension line ETL that extends in the second direction DR2 is disposed. In the third area A3, the first dummy area DMA1 may be a line area where a dummy line DML that extends in the second direction DR2 is disposed. Each first dummy area DMA1 may be disposed between the pixel circuits PXC of two pixel columns adjacent to each other in each of the second and third areas A2 and A3, and extend in the second direction DR2.

Each second dummy area DMA2 may be a line area where a horizontal line that extends in the first direction DR1 in the second area A2 and the third area A3 is disposed. For example, each second dummy area DMA2 may be a line area where the bridge line BRL that extends in the first direction DR1 over the second area A2 and the third area A3 is disposed. Each second dummy area DMA2 may be disposed between the pixel circuits PXC of two pixel columns adjacent to each other in the second and third areas A2 and A3, and extend in the first direction DR1.

In the second area A2, the first, second, third, and fourth extension lines ETL1, ETL2, ETL3, and ETL4 may be disposed in the first dummy area DMA1. The first, second, third, and fourth extension lines ETL1, ETL2, ETL3, and ETL4 may be spaced from each other in the first direction, and extend in the second direction DR2. The first, second, third, and fourth extension lines ETL1, ETL2, ETL3, and ETL4 may correspond to the first conductive layer disposed between the substrate SUB and the buffer layer BFL. The first, second, third, and fourth extension lines ETL1, ETL2, ETL3, and ETL4 may be formed through the same process as that of the second and third signal lines SL2 and SL3.

In one or more embodiments, each of the first, second, third, and fourth extension lines ETL1, ETL2, ETL3, and ETL4 may be electrically connected with the corresponding third line LP3 disposed in the fan-out area FTA, and thus connected to the third pad P of the pad area PDA by the corresponding third line LP3. Each of the first, second, third, and fourth extension lines ETL1, ETL2, ETL3, and ETL4 may be electrically connected with the corresponding bridge line BRL through the corresponding first contactor CNT1. For example, the first extension line ETL1 may be electrically connected with the first bridge line BRL1 through a 1-1-th contactor CNT1_1. The second extension line ETL2 may be electrically connected with the second bridge line BRL2 through a 1-2-th contactor CNT1_2. The third extension line ETL3 may be electrically connected with the third bridge line BRL3 through a 1-3-th contactor CNT1_3. The fourth extension line ETL4 may be electrically connected with a fourth bridge line BRL4 through a 1-4-th contactor CNT1_4.

Each of the first, second, third, and fourth extension lines ETL1, ETL2, ETL3, and ETL4 may be provided and/or formed in the form of a single layer, but the present disclosure is not limited thereto. In an embodiment, each of the first, second, third, and fourth extension lines ETL1, ETL2, ETL3, and ETL4 may be provided and/or formed in the form of a multilayer structure obtained by stacking at least two materials from among metals, alloys, conductive oxides, and conductive polymers. For example, as illustrated in FIG. 20, each of the first, second, third, and fourth extension lines ETL1, ETL2, ETL3, and ETL4 may be provided and/or formed in the form of a multilayer structure obtained by stacking a first layer FL, a second layer SL, and a third layer TL. The first layer FL, the second layer SL, and the third layer TL may be electrically connected to each other through a corresponding contact hole CH. In a plan view, the first layer FL, the second layer SL, and the third layer TL may overlap each other. The first layer FL may be formed of, for example, the first conductive layer disposed between the substrate SUB and the buffer layer BFL. The second layer SL may be formed of, for example, the second conductive layer disposed between the gate insulating layer GI and the interlayer insulating layer ILD. The third layer TL may be formed of, for example, the third conductive layer disposed between the interlayer insulating layer ILD and the passivation layer PSV. In this case, the third layer TL and the bridge line BRL may be formed through the same process and provided on (or at) the same layer, and have the same material.

Furthermore, an auxiliary line SUL may be disposed in the first dummy area DMA1 of the second area A2. For example, the auxiliary line SUL that is collinear with the extension line ETL in the second direction DR2 may be disposed in the first dummy area DMA1. The auxiliary line SUL may be spaced from the extension line ETL with an opening OPN formed therebetween, and may be electrically disconnected from the extension line ETL.

The auxiliary line SUL may include a first auxiliary line SUL1, a second auxiliary line SUL2, a third auxiliary line SUL3, and a fourth auxiliary line SUL4. The first auxiliary line SUL1 may be collinear with the first extension line ETL1 in the second direction DR2 and spaced from the first extension line ETL1 with an opening OPN formed therebetween. The second auxiliary line SUL2 may be collinear with the second extension line ETL2 in the second direction DR2 and spaced from the second extension line ETL2 with an opening OPN formed therebetween. The third auxiliary line SUL3 may be collinear with the third extension line ETL3 in the second direction DR2 and spaced from the third extension line ETL3 with an opening OPN formed therebetween. The fourth auxiliary line SUL4 may be collinear with the fourth extension line ETL4 in the second direction DR2 and spaced from the fourth extension line ETL4 with an opening OPN formed therebetween.

Each of the first, second, third, and fourth auxiliary lines SUL1, SUL2, SUL3, and SUL4 and the corresponding extension line ETL may be formed through the same process and provided on (or at) the same layer, and have the same material. For example, the first, second, third, and fourth auxiliary lines SUL1, SUL2, SUL3, and SUL4 may correspond to the first conductive layer disposed between the substrate SUB and the buffer layer BFL.

In a plan view, in the first dummy area DMA1 of the second area A2, the extension line ETL may be disposed on a lower side based on the opening OPN, and the auxiliary line SUL may be disposed on an upper side based on the opening OPN. For example, in a plan view, in the first dummy area DMA1 of the second area A2, each of the first, second, third, and fourth extension lines ETL1, ETL2, ETL3, and ETL4 may be disposed on a lower side based on the corresponding opening OPN, and the first, second, third, and fourth auxiliary lines SUL1, SUL2, SUL3, and SUL4 may be disposed on an upper side based on the corresponding opening OPN.

The first, second, third, and fourth auxiliary lines SUL1, SUL2, SUL3, and SUL4 each may not be electrically connected to the 2i-th and 2i+1-th pixels PXL2$i$ and PXL2$i$+1, and each may be electrically connected to the second pixel PXL2 disposed on pixel rows preceding to the i-th pixel row on which the 2i-th pixel PXL2$i$ is disposed, and thus may be used as a signal line for transmitting a signal to the second pixel PXL2. In this case, a voltage drop of a signal to be applied to the signal line may be mitigated or minimized, so that a defect resulting from the voltage drop can be prevented from occurring.

In one or more embodiments, the opening OPN located between the extension line ETL and the auxiliary line SUL may be located on an upper side based on the first contactor CNT1, in a plan view. For example, the opening OPN located between the first extension line ETL1 and the first auxiliary line SUL1 may be located on an upper side based on the 1-1-th contactor CNT1_1. The opening OPN located between the second extension line ETL2 and the second auxiliary line SUL2 may be located on an upper side based on the 1-2-th contactor CNT1_2. The opening OPN located between the third extension line ETL3 and the third auxiliary line SUL3 may be located on an upper side based on the 1-3-th contactor CNT1_3. The opening OPN located between the fourth extension line ETL4 and the fourth auxiliary line SUL4 may be located on an upper side based on the 1-4-th contactor CNT1_4.

In the third area A3, the first, second, third, and fourth dummy lines DML1, DML2, DML3, and DML4 may be disposed in the first dummy area DMA1. The first, second, third, and fourth dummy lines DML1, DML2, DML3, and DML4 may be spaced from each other in the first direction, and extend in the second direction DR2.

The first, second, third, and fourth dummy lines DML1, DML2, DML3, and DML4 may correspond to the first conductive layer disposed between the substrate SUB and the buffer layer BFL. The first, second, third, and fourth dummy lines DML1, DML2, DML3, and DML4 and the first, second, third, and fourth extension lines ETL1, ETL2, ETL3, and ETL4 may be formed through the same process and provided on (or at) the same layer, and have the same material.

The first, second, third, and fourth dummy lines DML1, DML2, DML3, and DML4 may not be connected to the 3i-th and 3i+1-th pixels PXL3$i$ and PXL3$i$+1, but the present disclosure is not limited thereto. In one or more embodiments, each of the first, second, third, and fourth dummy lines DML1, DML2, DML3, and DML4 may be electrically connected to the 3i-th pixel PXL3$i$, the 3i+1-th pixel PXL3$i$+1, or other third pixels PXL3 disposed on the same pixel column as that of the 3i-th and 3i+1-th pixels PXL3$i$ and PXL3$i$+1, and may be used as a signal line for transmitting a signal to the corresponding third pixel PXL3. In this case, a voltage drop of a signal to be applied to the signal line may be mitigated or minimized, so that a defect resulting from the voltage drop can be prevented from occurring.

In one or more embodiments, the first dummy area DMA1 of the second area A2 and the first dummy area DMA1 of the third area A3 may have the same surface area (size and/or width) and may be the same in the number of lines disposed therein. For example, the numbers of vertical lines that are respectively disposed in the first dummy area DMA1 of the second area A2 and the first dummy area DMA1 of the third area A3 may be the same as each other. Four extension lines ETL4 including the first to fourth extension lines ETL1, ETL2, ETL3, and ETL4 may be disposed in the first dummy area DMA1 of the second area A2. Four dummy lines DML including the first to fourth dummy lines DML1, DML2, DML3, and DML4 may be disposed in the first dummy area DMA1 of the third area A3. Furthermore, the first dummy area DMA1 of the first area A1 and the first dummy area DMA1 of each of the second and third areas A2 and A3 may have the same size and may be the same in the numbers of lines disposed therein. For example, in one or more embodiments, four first signal lines SL1 including the scan line S1, the first additional conductive line CL1, the second additional conductive line CL2, and the third additional conductive line CL3 may be disposed in the first dummy area DMA1 of the first area A1.

In one or more embodiments, the third bridge line BRL3 and the fourth bridge line BRL4 may be disposed in the second dummy area DMA2 located between the i-th pixel row and the i+1-th pixel row. The first bridge line BRL1 and the second bridge line BRL2 may be disposed in the second dummy area DMA2 located between the i-th pixel row and the i−1-th pixel row.

The first, second, third, and fourth bridge lines BRL1, BRL2, BRL3, and BRL4 may be spaced from each other, and extend in the first direction DR1. The first, second, third, and fourth bridge lines BRL1, BRL2, BRL3, and BRL4 may be disposed in the second dummy areas DMA2 of the second and third areas A2 and A3 in the first direction DR1. Each of the first, second, third, and fourth bridge lines BRL1, BRL2, BRL3, and BRL4 may correspond to the third conductive layer disposed between the interlayer insulating layer ILD and the passivation layer PSV. The first, second, third, and fourth bridge lines BRL1, BRL2, BRL3, and BRL4 and the first, second, and the third upper electrodes UE1, UE2, and UE3 described with reference to FIG. 17 may be formed through the same process and provided on (or at) the same layer, and have the same material.

The first bridge line BRL1 may be disposed in the second dummy area DMA2 located between the i−1-th pixel row and the i-th pixel row, may be electrically connected with the first extension line ETL1 through the 1-1-th contactor CNT1_1, and may be electrically connected with the first receiving line RL1 through the 2-1-th contactor CNT2_1. The 1-1-th contactor CNT1_1 may be a through hole that successively passes through respective areas of the interlayer insulating layer ILD, the gate insulating layer GI, and the buffer layer BFL, and expose a portion of the first extension line ETL1 disposed on the substrate SUB. The 2-1-th contactor CNT2_1 may be a through hole that successively passes through respective other areas of the interlayer insulating layer ILD, the gate insulating layer GI, and the buffer layer BFL, and expose a portion of the first receiving line RL1 disposed on the substrate SUB.

In one or more embodiments, the first bridge line BRL1 may be a connector for electrically connecting the first extension line ETL1 disposed in the first dummy area DMA1 of the second area A2 with the first receiving line RL1 disposed in common in the 3i-th and 3i+1-th pixel areas PXA3$i$ and PXA3$i$+1 of the third area A3. Hence, the first extension line ETL1 that is electrically connected with the corresponding third line LP3 disposed in the fan-out area FTA and directly receives a certain signal from the corresponding third pad P3 disposed in the pad area PDA may transmit the certain signal to the first receiving line RL1 disposed in the third area A3 through the 1-1-th contactor CNT1_1, the first bridge line BRL1, and the 2-1-th contactor CNT2_1. The certain signal may be, for example, a third data signal. In this case, the first receiving line RL1 may be a component corresponding to the third data line D3 of the second signal line SL2.

In one or more embodiments, the second bridge line BRL2 may be a connector for electrically connecting the second extension line ETL2 disposed in the first dummy area DMA1 of the second area A2 with the second receiving line RL2 disposed in common in the 3i-th and 3i+1-th pixel areas PXA3$i$ and PXA3$i$+1 of the third area A3. Hence, the second extension line ETL2 that is electrically connected with the third line LP3 disposed in the fan-out area FTA and directly receives a certain signal from the corresponding third pad P3 disposed in the pad area PDA may transmit the certain signal to the second receiving line RL2 disposed in the third area A3 through the 1-2-th contactor CNT1_2, the second bridge line BRL2, and the 2-2-th contactor CNT2_2. The certain signal may be, for example, a second data signal. In this case, the second receiving line RL2 may be a component corresponding to the second data line D2 of the second signal line SL2.

In one or more embodiments, the third bridge line BRL3 may be a connector for electrically connecting the third extension line ETL3 disposed in the first dummy area DMA1 of the second area A2 with the third receiving line RL3 disposed in common in the 3i-th and 3i+1-th pixel areas PXA3$i$ and PXA3$i$+1 of the third area A3. Hence, the third extension line ETL3 that is electrically connected with the corresponding third line LP3 disposed in the fan-out area FTA and directly receives a certain signal from the corresponding third pad P3 disposed in the pad area PDA may transmit the certain signal to the third receiving line RL3 disposed in the third area A3 through the 1-3-th contactor CNT1_3, the third bridge line BRL3, and the 2-3-th contactor CNT2_3. The certain signal may be, for example, a first data signal. In this case, the third receiving line RL3 may be a component corresponding to the first data line D1 of the second signal line SL2.

In one or more embodiments, the fourth bridge line BRL4 may be a connector for electrically connecting the fourth extension line ETL4 disposed in the first dummy area DMA1 of the second area A2 with the fourth receiving line RL4 disposed in common in the 3i-th and 3i+1-th pixel areas PXA3$i$ and PXA3$i$+1 of the third area A3. Hence, the fourth extension line ETL4 that is electrically connected with the corresponding third line LP3 disposed in the fan-out area FTA and directly receives a certain signal from the corresponding third pad P3 disposed in the pad area PDA may transmit the certain signal to the fourth receiving line RL4 disposed in the third area A3 through the 1-4-th contactor CNT1_4, the fourth bridge line BRL4, and the 2-4-th contactor CNT2_4. The certain signal may be a voltage of the initialization power. In this case, the fourth receiving line RL4 may be a component corresponding to the initialization power line IPL of the second signal line SL2.

In a plan view, the 1-1-th contactor CNT1_1 and the 2-1-th contactor CNT2_1 may overlap different areas of the first bridge line BRL1, and may be collinear in an extension direction (e.g., the first direction DR1) of the first bridge line BRL1. In a plan view, the 1-2-th contactor CNT1_2 and the 2-2-th contactor CNT2_2 may overlap different areas of the second bridge line BRL2, and may be collinear in an extension direction (e.g., the first direction DR1) of the second bridge line BRL2. The 1-3-th contactor CNT1_3 and the 2-3-th contactor CNT2_3 may overlap different areas of the third bridge line BRL3, and be collinear in an extension direction (e.g., the first direction DR1) of the third bridge line BRL3. The 1-4-th contactor CNT1_4 and the 2-4-th contactor CNT2_4 may overlap different areas of the fourth bridge line BRL4, and may be collinear in an extension direction (e.g., the first direction DR1) of the fourth bridge line BRL4.

The display device DD in accordance with the foregoing embodiment may include, in each of the first, second, and third areas A1, A2, and A3, the first dummy area DMA1 in which the vertical lines are disposed, and the second dummy area DMA2 in which the horizontal lines are disposed, and may be designed such that the surface areas of the first and second dummy areas DMA1 and DMA2 of the first area A1, the surface areas of the first and second dummy areas DMA1 and DMA2 of the second area A2, and the surface areas of the first and second dummy areas DMA1 and DMA2 of the third area A3 are substantially equal or similar to each other. Hence, each first dummy area DMA1 of the first area A1, each first dummy area DMA1 of the second area A2, and each first dummy area DMA1 of the third area A3 may have regularity.

Furthermore, the display device DD may be designed such that the surface area of each of the first pixel areas PXA1 disposed in the first area A1, the surface area of each of the second pixel areas PXA2 disposed in the second area A2, and the surface area of each of the third pixel areas PXA3 are substantially equal or similar to each other. Hence, each first pixel area PXA1 of the first area A1, each second pixel area PXA2 of the second area A2, and each third pixel area PXA3 of the third area A3 may have regularity.

The display device DD in accordance with the foregoing embodiment may be designed such that the number of first pads P1 of the pad area PDA that are connected with the vertical lines disposed in the first dummy area DMA1 of the first area A1, the number of second pads P2 of the pad area PDA that are connected with the vertical lines disposed in the first dummy area DMA1 of the second area A2, and the number of third pads P3 of the pad area PDA that are connected with the third signal lines SL3 disposed in the third pixel area PXA3 of the third area A3 are equal to each other. In this case, in the display device DD, the first, second, and third lines LP1, LP2, and LP3 (or fan-out lines) each formed of a linear part having a reduced or minimized length in an extension direction thereof may be disposed in one area of the fan-out area FTA (e.g., the central area of the fan-out area FTA) that corresponds to the first display area DA1, so that the lengths of the first, second, and third lines LP1, LP2, and LP3 can be reduced, whereby the surface area (or the size) of the fan-out area FTA can be reduced. Therefore, the non-display area NDA of the display device DD may be reduced or minimized.

Furthermore, in the display device DD in accordance with the foregoing embodiment, the first, second, and third lines LP1, LP2, and LP3 having a uniform line length may be disposed in only one area of the fan-out area FTA that corresponds to the first display area DA1 so that a difference in line resistance between the first, second, and third lines LP1, LP2, and LP3 can be reduced, whereby distortion of a signal to be transmitted to each of the first, second, and third pixels PXL1, PXL2, and PXL3 can be reduced or minimized, and the reliability of the display device DD can be enhanced.

In a display device in accordance with one or more embodiments of the present disclosure, a display area may be divided into a first area, a second area, and a third area, and signals may be supplied from a pad part to pixels disposed in the third area through an extension line disposed in the second area and a bridge line disposed in common in the second area and the third area. Because signals are applied to the pixels through the extension line and the bridge line, a portion of a line part (or a fan-out line) disposed in the non-display area may be omitted. Therefore, the surface area of the non-display area in the display device may be reduced.

The effects of the present disclosure are not limited by the foregoing, and other various effects are anticipated herein.

While various embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure must be defined by the accompanying claims.

What is claimed is:

1. A display device comprising:
   a substrate comprising a display area including a first area, a second area, and a third area, and a non-display area adjacent at least one side of the display area;
   first pixels in the first area, second pixels in the second area, and third pixels in the third area;
   a pad part located in the non-display area, and electrically connected to each of the first to the third pixels;
   a line part comprising a first line in the non-display area between the pad part and the first area, a second line in the non-display area between the pad part and the second area, and a third line in the non-display area between the pad part and the second area and spaced from the second line;
   a bridge line extending in a first direction, and located in common in the second and the third areas; and
   an extension line extending in a second direction different from the first direction, and located in the second area and electrically connected with the bridge line,
   a signal line connected to at least one of the third pixels in the third area and configured to receive a signal from the pad part through the extension line and the bridge line,
   wherein the extension line is electrically connected with the third line, and
   wherein the signal line and the extension line are in a same layer and comprise a same material.

2. The display device according to claim 1,
   wherein the pad part is located in the non-display area, and comprises a first pad electrically connected to the first pixels, a second pad electrically connected to the second pixels, and a third pad electrically connected to the third pixels, and
   wherein the first line electrically connects the corresponding first pixel from among the first pixels to the first pad, the second line electrically connects the corresponding second pixel from among the second pixels to the second pad, and the third line electrically connects the corresponding third pixel from among the third pixels to the third pad.

3. The display device according to claim 2,
   wherein the first pad comprises a plurality of first pads electrically connected to the respective first pixels,
   wherein the second pad comprises a plurality of second pads electrically connected to the respective second pixels,
   wherein the third pad comprises a plurality of third pads electrically connected to the respective third pixels, and
   wherein a number of the plurality of first pads is equal to a sum of a number of the plurality of second pads and a number of the plurality of third pads.

4. An electronic device comprising the display device of claim 1.

5. A display device comprising:
   a substrate comprising a display area including a first area, a second area, and a third area, and a non-display area adjacent at least one side of the display area;
   first pixels in the first area, second pixels in the second area, and third pixels in the third area;
   a pad part located in the non-display area, and electrically connected to each of the first to the third pixels;
   a line part comprising a first line in the non-display area between the pad part and the first area, a second line in the non-display area between the pad part and the second area, and a third line in the non-display area between the pad part and the second area and spaced from the second line;
   a bridge line extending in a first direction, and located in common in the second and the third areas; and
   an extension line extending in a second direction different from the first direction, and located in the second area and electrically connected with the bridge line,
   wherein the extension line is electrically connected with the third line,
   wherein the pad part is located in the non-display area, and comprises a first pad electrically connected to the first pixels, a second pad electrically connected to the second pixels, and a third pad electrically connected to the third pixels,
   wherein the first line electrically connects the corresponding first pixel from among the first pixels to the first pad, the second line electrically connects the corresponding second pixel from among the second pixels to the second pad, and the third line electrically connects the corresponding third pixel from among the third pixels to the third pad,
   wherein the first pad comprises a plurality of first pads electrically connected to the respective first pixels,
   wherein the second pad comprises a plurality of second pads electrically connected to the respective second pixels,
   wherein the third pad comprises a plurality of third pads electrically connected to the respective third pixels,
   wherein a number of first pads is equal to a sum of a number of the plurality of second pads and a number of the plurality of third pads, wherein the first area includes one or more first pixel areas in which the first pixels are located, and a first dummy area between the first pixel areas adjacent to each other in the first direction, wherein the second area includes one or more second pixel areas in which the second pixels are located, and a second dummy area between the second pixel areas adjacent to each other in the first direction, and wherein the third area includes one or more third pixel areas in which the third pixels are located, and a third dummy area between the third pixel areas adjacent to each other in the first direction.

6. The display device according to claim 5, wherein the first pixel area, the second pixel area, and the third pixel area have a same size, and wherein the first dummy area, the second dummy area, and the third dummy area have a same size.

7. The display device according to claim 5, wherein a first signal line is located in each of the first pixel area and the first dummy area and electrically connected with the first line, wherein a second signal line is located in the second pixel area and electrically connected with the second line, wherein the extension line is located in the second dummy area and electrically connected with the third line, wherein a third signal line is located in the third pixel area and electrically connected with the extension line by the bridge line, and wherein a dummy line is located in the third dummy area and spaced from the third signal line.

8. The display device according to claim 7, wherein the first signal line, the second signal line, the third signal line, the extension line, and the dummy line are at a same layer and comprise a same material.

9. The display device according to claim 8, wherein each of the first to third pixels comprises:

a pixel circuit layer on the substrate and comprises at least one transistor, and a display element layer on the pixel circuit layer and comprises a light emitting element electrically connected to the transistor, and wherein the pixel circuit layer comprises at least one insulating layer and at least one conductive layer.

10. The display device according to claim 9, wherein the at least one insulating layer comprises:
 a buffer layer on the substrate;
 a gate insulating layer on the buffer layer;
 an interlayer insulating layer on the gate insulating layer; and
 a passivation layer on the interlayer insulating layer,
wherein the at least one conductive layer comprises:
 a first conductive layer between the substrate and the buffer layer;
 a second conductive layer on the gate insulating layer; and
 a third conductive layer on the interlayer insulating layer.

11. The display device according to claim 10, wherein the first conductive layer comprises the first signal line, the second signal line, the third signal line, the extension line, and the dummy line, and wherein the third conductive layer comprises the bridge line.

12. The display device according to claim 11, wherein the extension line and the third signal line are electrically connected to each other by the bridge line.

13. The display device according to claim 12, wherein, in the second area, the extension line is electrically connected with one area of the bridge line through a first contactor that successively passes through the buffer layer, the gate insulating layer, and the interlayer insulating layer, and wherein, in the third area, the third signal line is electrically connected with another area of the bridge line through a second contactor that successively passes through the buffer layer, the gate insulating layer, and the interlayer insulating layer.

14. The display device according to claim 13, wherein, in a plan view, the first contactor and the second contactor are collinear in the first direction.

15. The display device according to claim 14, further comprising an auxiliary line on a column identical with the extension line in the second area and electrically separated from the extension line.

16. The display device according to claim 15, wherein the auxiliary line and the extension line are provided at a same layer and comprise a same material.

17. The display device according to claim 10, further comprising:

a first antistatic part in the non-display area between the pad part and the first area;

a second antistatic part in the non-display area between the pad part and the second area; and a common line extending in the first direction and located in common in the non-display area, wherein the first antistatic part is electrically connected with the common line and the first line, and wherein the second antistatic part is electrically connected with the common line and the second line.

18. The display device according to claim 17, wherein the first and the second antistatic parts each comprises at least one discharge transistor.

19. The display device according to claim 10, wherein the display element layer of each of the first to third pixels comprises:

a first alignment electrode and a second alignment electrode on the pixel circuit layer and spaced from each other;

the light emitting element between the first alignment electrode and the second alignment electrode;

a first pixel electrode electrically connected to a first end of the light emitting element and the first alignment electrode; and a second pixel electrode electrically connected to a second end of the light emitting element and the second alignment electrode.

20. The display device according to claim 19, wherein each of the first to the third pads comprises:

a first pad electrode on the interlayer insulating layer;

a second pad electrode on the first pad electrode and electrically connected the first pad electrode;

a third pad electrode on the second pad electrode with a first insulating layer interposed therebetween, and electrically connected to the second pad electrode; and a fourth pad electrode on the third pad electrode with a second insulating layer interposed therebetween, and electrically connected to the third pad electrode.

* * * * *